(12) United States Patent
Hanzawa et al.

(10) Patent No.: US 7,286,430 B2
(45) Date of Patent: Oct. 23, 2007

(54) SEMICONDUCTOR DEVICE

(75) Inventors: Satoru Hanzawa, Hachioji (JP);
Takeshi Sakata, Hino (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/409,238

(22) Filed: Apr. 24, 2006

(65) Prior Publication Data

US 2006/0187720 A1    Aug. 24, 2006

Related U.S. Application Data

(63) Continuation of application No. 11/009,449, filed on Dec. 13, 2004, now Pat. No. 7,054,214, which is a continuation of application No. 10/726,658, filed on Dec. 4, 2003, now Pat. No. 6,862,232, which is a continuation of application No. 10/357,222, filed on Feb. 4, 2003, now Pat. No. 6,680,867, which is a continuation of application No. 09/933,044, filed on Aug. 21, 2001, now Pat. No. 6,563,743.

(30) Foreign Application Priority Data

Nov. 27, 2000   (JP)   ............................. 2000-364543

(51) Int. Cl.
*G11C 7/02* (2006.01)

(52) U.S. Cl. ...................... 365/210; 365/200

(58) Field of Classification Search ................ 365/210, 365/200, 189.01, 189.02, 189.04, 230.02
See application file for complete search history.

(56) References Cited

U.S. PATENT DOCUMENTS

| 4,316,265 A | * | 2/1982 | Tanaka et al. ............... 365/203 |
| 4,739,497 A | | 4/1988 | Itoh et al. |
| 4,758,995 A | | 7/1988 | Sato |
| 4,888,737 A | | 12/1989 | Sato |
| 5,226,014 A | | 7/1993 | McManus |
| 5,258,958 A | | 11/1993 | Iwahashi et al. |
| 5,299,165 A | | 3/1994 | Kimura et al. |

(Continued)

FOREIGN PATENT DOCUMENTS

JP    3-263693    11/1991

(Continued)

OTHER PUBLICATIONS

Scheuerlein, R., et al, "A 10ns Read and Write Non-Volatile Memory Array Using a Magnetic Tunnel Junction and FET Switch in each Cell", IEEE International Solid-State Circuits Conference, Digest of Technical Papers, Feb. 8, 2000, pp. 128-131.

*Primary Examiner*—Gene N. Auduong
(74) *Attorney, Agent, or Firm*—Mattingly, Stanger, Malur & Brundidge, P.C.

(57)   ABSTRACT

A dummy cell includes a plurality of first memory cells MC for storing "1" or "0", arranged at points of intersection between a plurality of word lines WR0 to WR7 and a plurality of first data lines D0 to D7, a plurality of first dummy cells MCH for storing "1" or "0", arranged at points of intersection between the word lines WR0 to WR7 and a first dummy data line, and a plurality of second dummy cells MCL for storing "0", arranged at points of intersection between the word lines WR0 to WR7 and a second dummy data line DD1.

8 Claims, 29 Drawing Sheets

U.S. PATENT DOCUMENTS

| | | |
|---|---|---|
| 5,321,655 A | 6/1994 | Iwahashi et al. |
| 5,359,556 A | 10/1994 | Kimura et al. |
| 5,410,509 A | 4/1995 | Morita |
| 5,448,515 A | 9/1995 | Fukami et al. |
| 5,508,960 A | 4/1996 | Pinkham |
| 5,523,981 A | 6/1996 | Yamaguchi et al. |
| 5,793,697 A | 8/1998 | Scheuerlein |
| 6,269,040 B1 | 7/2001 | Reohr et al. |
| 6,314,014 B1 | 11/2001 | Lowrey et al. |
| 6,317,376 B1 | 11/2001 | Tran et al. |
| 6,563,743 B2 * | 5/2003 | Hanzawa et al. ...... 365/189.02 |
| 6,862,232 B2 * | 3/2005 | Hanzawa et al. ........... 365/200 |
| 7,054,214 B2 * | 5/2006 | Hanzawa et al. ........... 365/210 |
| 2001/0053104 A1 | 12/2001 | Tran et al. |

FOREIGN PATENT DOCUMENTS

| | | |
|---|---|---|
| JP | 6-84347 | 3/1994 |
| JP | 10-269789 | 10/1998 |

* cited by examiner

FIG. 39

| MUX | NMOS | YMX | MUX | NMOS | RYMX |
|---|---|---|---|---|---|
| MUXU20 | N110 | YMT0 | MUXU30 | N340 | RYMT00 |
|  | : | : |  | N341 | RYMT01 |
|  | N113 | YMT3 | MUXL30 | N350 | RYMB00 |
| MUXL20 | N130 | YMB0 |  | N351 | RYMB01 |
|  | : | : |  | N360 | RYMW00 |
|  | N133 | YMB3 |  | N361 | RYMW01 |
|  | N140 | YMW0 | MUXU40 | N420 | RYMDT00 |
|  | : | : |  | N421 | RYMDT01 |
|  | N143 | YMW3 | MUXL40 | N430 | RYMDB00 |
| MUXU00 | N120 | YMDT00 |  | N431 | RYMDB01 |
|  | N121 | YMDT01 |  | N440 | RYMDW00 |
| MUXL00 | N150 | YMDB00 |  | N441 | RYMDW01 |
|  | N151 | YMDB01 |  |  |  |
|  | N190 | YMDW00 |  |  |  |
|  | N191 | YMDW01 |  |  |  |

SEMICONDUCTOR DEVICE

This is a continuation application of U.S. Ser. No. 11/009,449, filed Dec. 13, 2004 now U.S. Pat. No. 7,054,214; which is a continuation of Ser. No. 10/726,658, filed Dec. 4, 2003 now U.S. Pat. No. 6,862,232, which is a continuation application of U.S. Ser. No. 10/357,222, filed Feb. 4, 2003, now U.S. Pat. No. 6,680,867; which is a continuation application of U.S. Ser. No. 09/933,044, filed Aug. 21, 2001, now U.S. Pat. No. 6,563,743.

BACKGROUND OF THE INVENTION

This invention relates to a semiconductor device. More particularly, this invention relates to a semiconductor device containing a high integration density memory using memory cells for storing information by utilizing a change of a magnetic resistance.

A magneto-resistive random access memory (MRAM) has been developed as a memory that has no limitation to the number of times of read/write operations though it is one of the nonvolatile memories typified by a ferro-dielectric memory (FeRAM) and a flash memory. This MRAM stores information by utilizing a magneto-resistive effect in which a resistance of a device varies depending on a direction of magnetization. Development of a magnetic tunnel junction (MTJ) device of which magneto-resistance change ratio referred to as "MR" is greater than those of conventional devices and its application to the MRAM have been carried out in recent years, and such studies have revealed the possibility that a high-speed write operation comparable to that of a static random access memory (SRAM) and a high integration density comparable to that of a DRAM can be achieved. Therefore, the MRAM has now drawn an increasing attention as a promising applicant of the next generation memories.

The MTJ device has a three-layered structure in which an insulating film is sandwiched between two ferromagnetic layers FRL and FXL as shown in FIG. 3 of the accompanying drawings. The insulating film TB is formed to a small thickness such that electrons can be transferred by a tunnel effect. The direction of magnetization of the ferromagnetic layer FXL is fixed as represented by an arrow MAF2 whereas the direction of magnetization of the ferromagnetic layer FRL is controlled by an external magnetic field as represented by an arrow AMF1. The resistance between terminals A and B varies depending on the directions of magnetization in these two ferromagnetic layers. The resistance is low when the directions of magnetization are the same and is high when they are opposite. An MRAM to which such an MTJ device is applied is described, for example, in IEEE International Solid-State Circuits Conference, DIGEST OF TECHNICAL PAPERS, pp. 128-129, 2000 (hereinafter called the "cited reference 1"), and in the same DIGEST OF TECHNICAL PAPERS, pp. 130-131 (hereinafter called the "reference No. 2"). In either case, a construction in which one MTJ device and one transistor are connected in series constitutes a basic construction of a memory cell. When the transistor in a selected memory cell is conductive, a voltage is applied across both terminals of the MTJ device, and memory information is read out by detecting a current that flows through a data line in accordance with the magneto-resistance.

FIG. 4 shows a current that develops when a voltage is applied across both terminals of the MTJ device at a time T1. It will be assumed hereby that the resistance state is high when the MTJ device holds the memory information '0' and is low when it holds the memory information '1'. At this time, a current ID(1) obtained by reading the memory cell holding the memory information '1' is greater than a current ID(0) obtained by reading the memory cell holding the memory information '0', and both currents assume positive values. Owing to such characteristics of the MTJ device, the following two problems develop in the read operation of the MRAM. First, a reference signal is necessary for discriminating the memory information from the read signal having one of the polarities. Second, because the MR of the MTJ is only dozens of percents, a read signal quantity is small and a stable read operation is difficult.

To solve these problems, the cited reference 1 employs a twin cell system using two MTJ devices and two transistors to constitute the memory cell. This system can acquire complementary read signals in accordance with the memory information of the memory cell. Therefore, discrimination of the information is easy and the signal quantity is great, too. However, because the memory cell area becomes twice, this system may be relatively disadvantageous for attaining a large capacity. In contrast, the cited reference No. 2 generates the reference signal by arranging a reference cell composed of one MTJ device and one transistor, each being the same as that of the memory cell, for each word line. This system can restrict the memory array area. However, it may presumably be difficult to form the reference cell that precisely generates the reference signal while variance of characteristics of each memory cell is taken into account. When any defect such as disconnection or short-circuit occurs in the reference cell or in data lines to which the reference cell is connected, the reference signal is not generated with the result that the memory information of a plurality of memory cells cannot be read out and a drop of yield is likely to occur. The present invention is completed on the basis of the examination result described above.

SUMMARY OF THE INVENTION

It is a first object of the present invention to provide a dummy cell for precisely generating a reference signal and to correctly read memory information stored in a memory cell composed of one MTJ device and one transistor.

It is a second object of the present invention to provide a redundancy system that can replace both memory cell and dummy cell.

It is a third object of the present invention to provide a large capacity MRAM having a high operation speed, a high integration density and high reliability.

Features of typical means of the present invention for accomplishing the objects described above are as follows. A memory cell is composed of one MTJ device and one transistor, and two memory cells holding complementary information are juxtaposed to constitute a dummy cell. This dummy cell is arranged for each word line pair. A current mirror circuit having a mirror ratio of 1:1 receives a current flowing through the memory cells to generate a read signal. In contrast, a current mirror circuit having a mirror ratio of 2:1 receives a current flowing through the dummy cell and generates a mean current so as to generate the reference signal.

BRIEF DESCRIPTION OF THE DRAWINGS

FIG. 39 shows a table of a column address inputted to the multiplexer of Embodiment 5.

DESCRIPTION OF THE EMBODIMENTS

Embodiment 1

The present invention will be explained about the following embodiments using an MRAM that includes memory cells each composed of one MTJ device and one transistor. FIG. 13 represents an example of a synchronous memory using the present invention and FIG. 12 represents an example of the memory array MAR shown in FIG. 13, as will be explained later in further detail.

Figure 1:
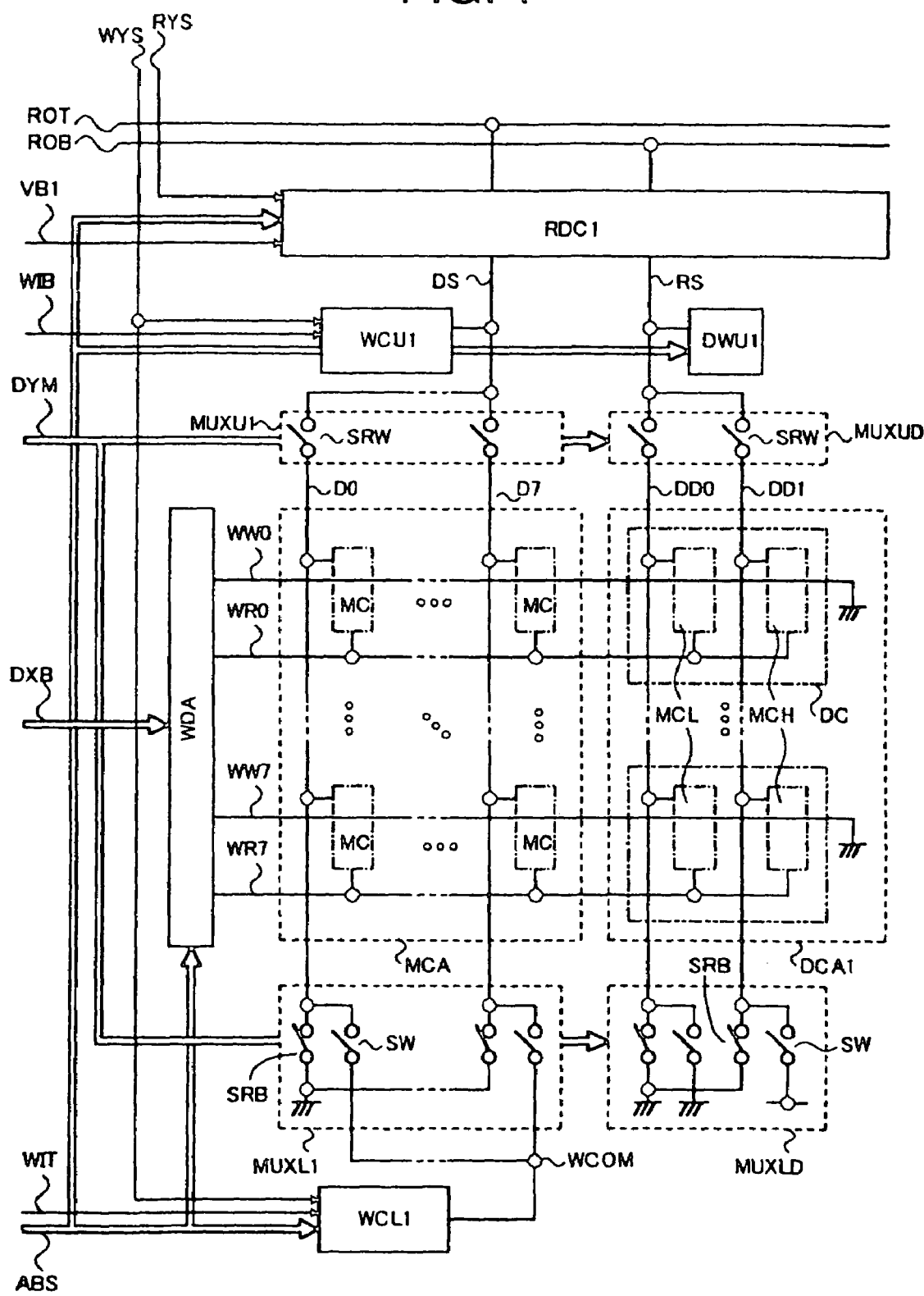
FIG. 1 shows a structural example of a memory block using memory cells each composed of one MTJ device and one transistor according to Embodiment 1 of the present invention.
Figure 12:
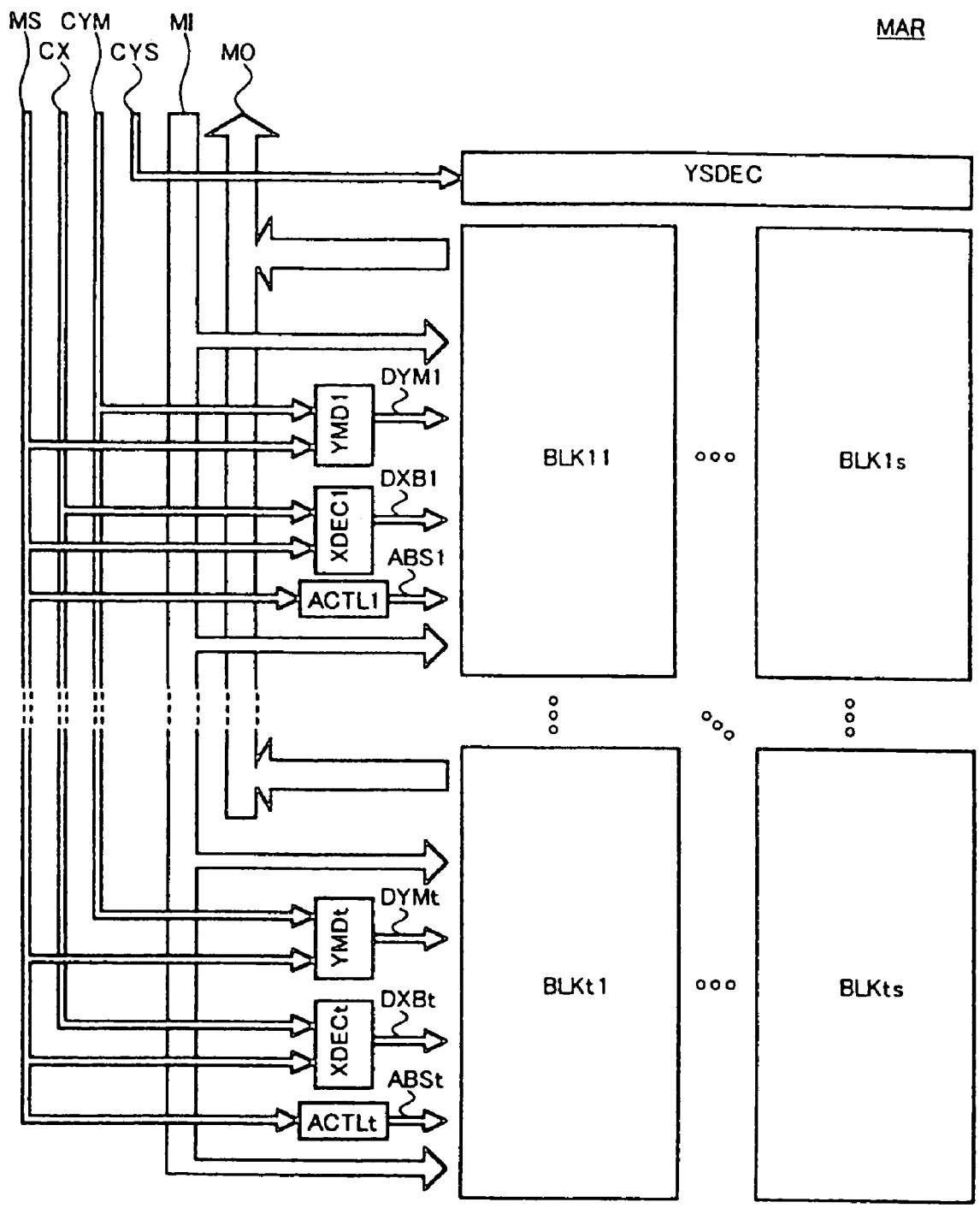
FIG. 12 shows a structural example of a memory array using the memory block of Embodiment 1.
Figure 13:
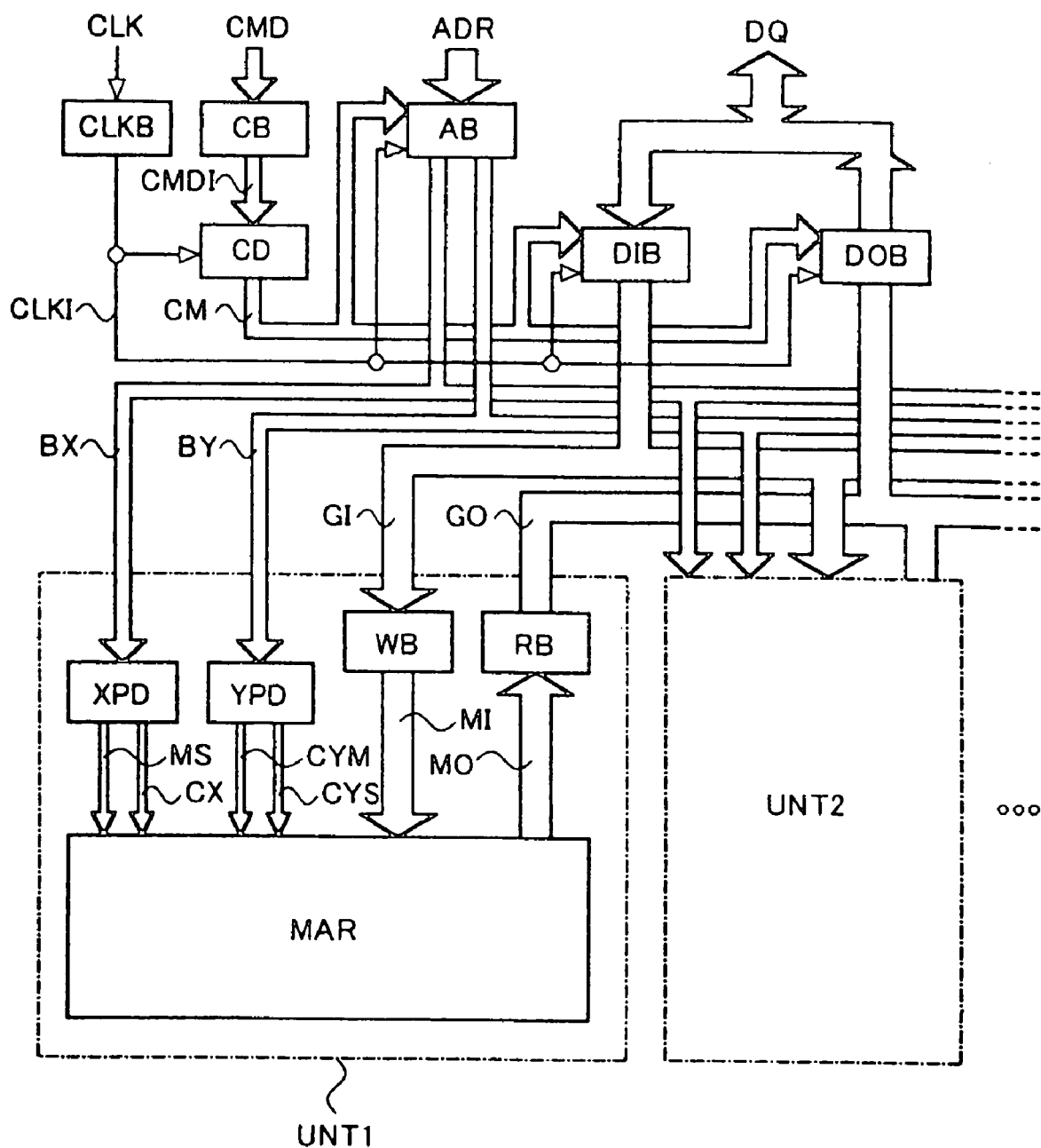
FIG. 13 shows a structural example of a synchronous memory using the memory array of Embodiment 1.

Further, FIG. 1 shows an example of the memory block BLK shown in FIG. 12 wherein a memory cell array MCA and a dummy cell array DCA1 are disposed on one of the sides of the word driver array WDA. The memory block BLK includes multiplexers MUXU1, MUXL1, MUXUD and MUXLD, write circuits WCU1 and WCL1, a dummy write circuit DWU1 and a read circuit RDC1. The feature of the memory block in this embodiment is that dummy cells DC having two memory cells MCL and MCH having the same construction and juxtaposed with each other are arranged to each word line pair, and two cells MCL and MCH holding complementary information are activated to generate a reference signal. Each circuit block will be hereinafter explained.

A structural example having memory cells of 8×8 bits is shown. These memory cells MC are arranged at points of intersections between a plurality (8 sets in this embodiment) of word line pairs and a plurality (8) of data lines Dj (j=0, . . . , 7), respectively. A dummy cell array DCA1 has dummy cells DC of 8×1 bits in such a fashion as to correspond to the construction of the memory cell array MCA. The dummy cells DC have a construction in which two memory cells MCL and MCH having the same construction as that of the memory cell MC are arranged at the points of intersections between a plurality of word line pairs and dummy data lines DD0 and DD1.

A word driver array WDA includes a plurality (8 in this embodiment) of word drivers as will be later described, and drives a plurality of word line pairs in accordance with row decode address DXB and an array control bus ABS. Each of a plurality of word line pairs includes a word line WRk (k=0, . . . , 7) and a write word line WWk (k=0, . . . , 7). A write word line WWk is grounded at a far end. Here, the row decode address DXB includes a plurality of row decode signals XBk (k=0, . . . , 7). The array control bus ABS comprises a plurality of signals having mutually different roles, and necessary signals are connected to each circuit block whenever necessary. The content of the array control bus ABS will be explained with reference to a concrete circuit construction of each circuit block.

Multiplexers MUXU1 and MUXL1 are arranged at both ends of the memory cell array MCA and operate while forming a pair with each other. One of the multiplexers MUXU1 includes a plurality (8 in this embodiment) of switches SRW (the switches inside the multiplexer will be merely called "switches" for simplicity, but may well be called "column switches" to distinguish them from other switches) that are disposed between a common data line DS and a plurality of data lines Dj. The multiplexer MUXU1 connects the selected data line D to the common data line DS in accordance with a column decode address DYM inputted. The other multiplexer MUXL1 includes a plurality (8 in this embodiment) of switches SRB arranged between a ground potential VSS and a plurality of data lines Dj and a plurality (8 in this embodiment) of switches SW disposed between a write common node WCOM and a plurality of data lines Dj. The former switches SRB cut off the connection between the selected data line D and the ground potential VSS in accordance with the column decode address DYM inputted, and the latter switches SW connect the selected data line D to the write common node WCOM.

Multiplexers MUXUD and MUXLD are arranged at both ends of the dummy cell array DCA1 and operate while forming a pair with each other. One of the multiplexers MUXUD includes two switches arranged between the common data line RS and the dummy data lines DD0 and DD1, and connect the dummy data lines DD0 and DD1 to the common data line RS in accordance with the column decode address DYM inputted. The other multiplexer MUXLD includes two switches SRB arranged between the ground potential VSS and the dummy data lines DD0 and DD1 and two switches SW arranged between the ground potential VSS and the dummy data line DD0 and between a power source voltage VDD and the dummy data line DD1. The former switches SRB cut off the connection between the dummy data lines DD0 and DD1 and the ground potential VSS in accordance with the column decode address DYM inputted. The latter switches SW connect the dummy data line DD0 to the ground potential VSS and the dummy data line DD1 to the power source voltage VDD in accordance with the column decode address DYM inputted. The switches SRW, SRB and SW are typically represented by symbols in the drawing. In practice, however, each switch is composed of an NMOS transistor, for example, and its wiring state is controlled in accordance with the existence/absence of a current path between the source and the drain of the transistor.

Write circuits WCU1 and WCL1 are arranged further outside the multiplexers MUX1 and MUXL1, respectively, and operate while forming a pair with each other. The write circuit WCU1 drives a common data line DS in accordance with the column select signal WYS inputted, the write data line WIB and the array control bus ABS. The write circuit WCL1 drives a write common node WCOM in accordance with the column select signal WYS inputted, the write data line WIT and the array control bus ABS. A dummy write circuit DWU1 is arranged further outside the multiplexer MUXUD in accordance with the write circuit WCU1 and drives the common data line RS in accordance with the array control bus ABS.

A read circuit RDC1 supplies power to the memory cells and to the dummy cells in accordance with the array control bus ABS inputted and a bias voltage VB1, detects and amplifies the read signal that occurs in the common data lines DS and RS, and drives read data lines ROT and ROB to a potential corresponding to the read-out data in accordance with the column select signal RYS.

Figure 2:
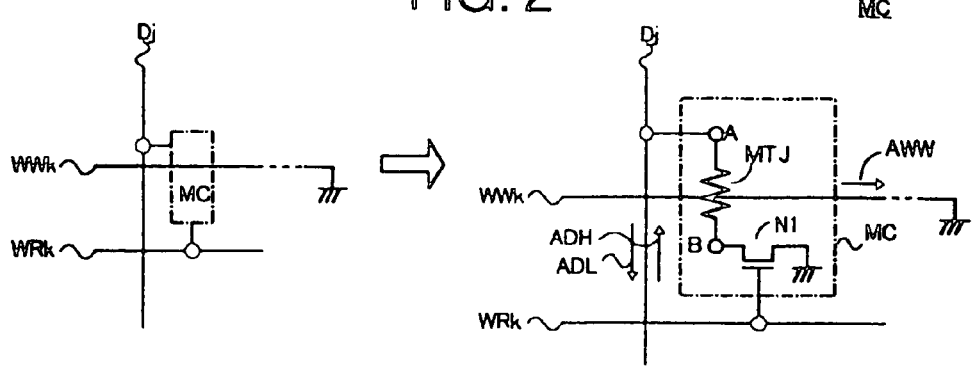
FIG. 2 shows an example of a memory cell composed of one MTJ device and one transistor.

Next, the circuit construction of the memory cell MC will be explained with reference to FIG. 2. The drawing on the left represents the block symbol of the memory cell MC shown in FIG. 1. More concretely, the memory cell MC includes one MTJ device represented by a circuit symbol of resistance and one NMOS transistor as shown in the drawing on the right. Terminals A and B correspond to terminals on the section of the MTJ device shown in FIG. 3. The terminal A is connected to the data line Dj and the terminal B, to the drain of the NOMS transistor N1. The source of the transistor N1 is grounded and the gate, to a read word line WRk. The write word line WWk is formed three-dimensionally below a ferromagnetic layer FXL through an inter-layer insulating film though it is omitted from FIG. 3. On the other hand, the data line Dj is formed on the ferromagnetic layer FRL and is connected with each other.

Figure 3:
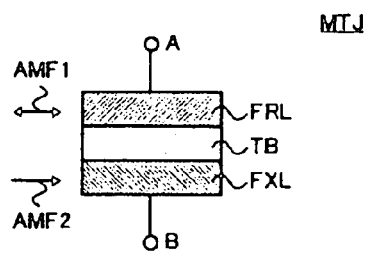
FIG. 3 shows an example of a section of an MTJ device.

The memory cells having the construction described above operate in the following way. First, in the read operation, when the write word line WWk is kept at the ground potential VSS and the read word line WRk is driven to the power source voltage VDD, the transistor N1 becomes conductive, forming the current path between the data line Dj and the ground potential VSS. Next, in the write operation, when the read word line WRk is kept at the ground potential VSS and the transistor N1 remains OFF, the current flows in the write word line WWk in a direction of an arrow AWW, thereby forming a first magnetic field. A current flows in the data line Dj in a direction of an arrow ADL or ADH in accordance with the write data, forming the second or third magnetic field. Since the directions of the currents are different, the second and third magnetic fields have mutually opposite directions on the basis of the Ampere's rule. Consequently, the first and second combined magnetic fields having different directions in accordance with the write data are generated in the memory cell arranged at the point of intersection between the write word line WWk and the data line Dj and the direction of magnetization AMF1 of the ferromagnetic layer FRL shown in FIG. 3 is controlled. In the description that follows, the memory information of the memory cell will be assumed to be "1" when the MTJ device is under the low resistance state and "0" when the MTJ device is under the high resistance state. When the memory information "1" is written, the current flows in the data line Dj in the direction of the arrow ADL and the second magnetic field develops, generating the first combined magnetic field. In consequence, the directions of magnetization of the ferromagnetic layers FRL and FXL are parallel to each other and the MTJ device enters the low resistance state. In contrast, when the memory information "0" is written, the current flows in the data line Dj in the direction of the arrow ADH and the third magnetic field develops, generating the second combined magnetic field. In consequence, the directions of magnetization of the ferromagnetic layers FRL and FXL are opposite to each other and the MTJ device enters the high resistance state. It will be assumed hereby that the memory cell MCL in the dummy cell DC is under the low resistance state while MCH is under the high resistance state.

Figure 5:
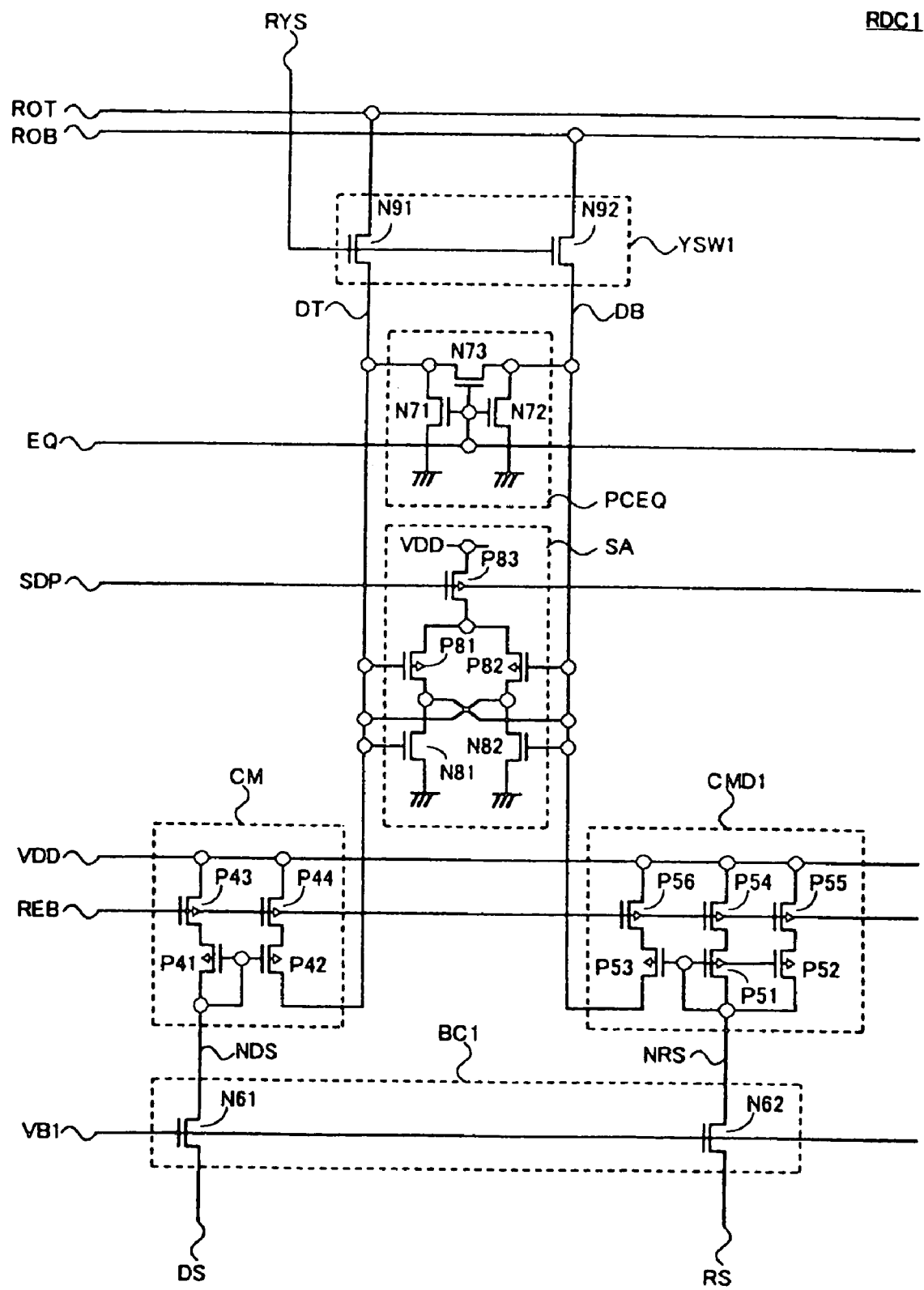
FIG. 5 shows a structural example of a read circuit according to Embodiment 1.

FIG. 5 shows a circuit construction of the read circuit RDC1. The read circuit includes a column select circuit YSW1, a pre-charge circuit PCEQ, a sense amplifier SA, current mirror circuits CM and CMD1 and a bias circuit BC1. A pre-charge enable signal EQ, a sense amplifier activation signal SDP and a read control signal REB among the array control bus ABS shown in FIG. 1 are inputted to the read circuit RDC1. Further, a column select signal RYS is inputted. First, a construction of each circuit will be explained.

The pre-charge circuit PCEQ includes NMOS transistors N71, N72 and N73. When a pre-charge enable signal EQ connected to the gate of each transistor is driven by the power source voltage VDD, all the transistors become conductive and pre-charge the sense data lines DT and DB to the ground potential VSS. At this time, the transistor N73 provides the effect of bringing the potentials of the sense data lines DT and DB to an equal potential.

The sense amplifier SA includes a cross-couple type latch circuit including PMOS transistors P81 and P82 and NMOS transistors N81 and N82, and a PMOS transistor P83 as a switch for cutting off the power source. When the sense amplifier activation signal SDP connected to the gate of the transistor P83 is driven to the ground potential VSS, the transistor P83 becomes conductive and the power source voltage VDD is supplied to the sources of the transistors P81 and P82. When the sense amplifier is activated in this manner, a minute potential difference occurring in the sense data lines DT and DB can be amplified. Since the pre-charge circuit PCEQ pre-charges the sense data lines DT and DB under the stand-by state to the ground potential VSS at this time, the gate-source voltage of each transistor N81, N82 reaches 0 V. Because the transistors N81 and N82 remain OFF, the layout area is reduced without disposing the switching transistor on the side of the ground potential VSS.

The column select circuit YSW1 includes NOMS transistors N91 and N92. A column select signal RYS is inputted to the gate of each transistor. The source of the transistor N91 is connected to the sense data line DT and its drain is connected to the read data line ROT. This construction can selectively output the data, that are read out to the sense data lines DT and DB, to the data lines ROT and ROB.

The current mirror circuit CM includes PMOS transistors P41, P42, P43 and P44. The gates of the transistors P41 and P42 and the drain of the transistor P41 are connected to an internal common data line NDS. The drain of the transistor P42 is connected to the sense data line DT. Further, the transistors P43 and P444 are power control switches. The power source voltage VDD is applied to the sources of these transistors and a read control signal REB is applied to their gates. These transistors P43 and P44 are connected in series with the transistors P41 and P42, respectively. Therefore, when the read control signal REB reaching the power source voltage VDD is driven to the ground potential VSS, the transistors P43 and P44 become conductive and the current mirror circuit CM is activated. Here, when the gates of the transistors P41 and P42 are formed into the same size and the gates of the transistors P43 and P44 are formed into the same size, the current mirror circuits having a mirror ratio of 1:1 is formed. In consequence, the current having the same value as that of the current flowing between the source and the drain of the transistor P41 can be caused to flow through the transistor P42.

Figure 4:
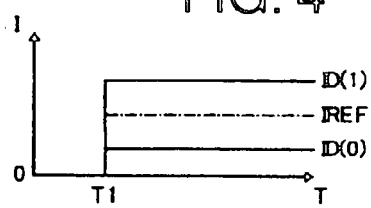
FIG. 4 shows a relation between a current flowing through the MTJ device and a reference signal according to the present invention.

The current mirror circuit CMD1 includes PMOS transistors P51, P52, P53, P54, P55 and P56. The transistors P51, P53, P54 and P56 correspond to the transistors P41, P42, P43 and P44 in the current mirror circuit CM, respectively. The gates of the transistors P51, P52 and P53 and the drains of the transistors P51 and P52 are connected to the internal common data line NRS. The drain of the transistor P53 is connected to the sense data line DB. The transistors P54, P55 and P56 are power source control switches. The power source voltage VDD is applied to the sources of these transistors and the read control signal REB, to their gates. They are connected in series with the transistors P51, P52 and P53, respectively. Therefore, when the read control signal REB that is at the power source voltage VDD is driven to the ground potential VSS, the transistors P54, P55 and P56 become conductive and the current mirror circuit CMD1 is activated. Here, the gates of the transistors P51, P52 and P53 are formed into the same size as that of the transistors P41 and P42 and the gates of the transistors P54, P55 and P56 is formed into the same size as that of the transistors P43 and P44, so that the current value flowing between the sources and the drains of the transistors P51, P52 and P53 becomes equal and the current mirror circuits having a mirror ratio of 2:1 can be formed. In other words, a current having a value half of the current flowing through the internal common data line NRS can be caused to flow through the sense data line DB. This current is a current IREF that has substantially an intermediate value of a current ID(1) or ID(0) flowing through the memory cell holding the memory information "1" or "0" as shown in FIG. 4.

The bias circuit BC1 includes NMOS transistors N61 and N62. The internal common data line NDS and the common data line DS are connected to the drain and the source of the transistor N61, respectively. The internal common data line NRS and the common data line RS are connected to the drain and the source of the transistor N62, respectively. The bias voltage VB1 is applied to the gate of each transistor N61, N62. The bias control circuit shown in FIG. 7.2.5 of the cited reference 1 generates this bias voltage VB1 and controls the voltage so that the potential difference between the common data line DS and the ground potential VSS can reach the reference voltage Vref. The reference voltage Vref is fixed at a low voltage lest the voltage applied to the MTJ device MTJ becomes high, and the potential difference between the common data line DS and the ground potential VSS is held at a predetermined low value. Consequently, the MTJ device MTJ has voltage dependence, and control can be conducted so that a stable MR value can be acquired even when the MR decreases in accordance with the increase of the applied voltage.

Here, the gate length of the transistor N62 is equal to that of the transistor N61 but its gate width is double the gate with of the transistor N61. In this way, the ON resistance of the transistor N62 is ½ of the ON resistance of the transistor N61. The wiring length of the internal common data line NRS is equal to that of the internal common data line NDS but the wiring width of the internal common data line NRS is double the wiring width of the internal common data line NDS. Further, the wiring length of the common data line RS is equal to that of the common data line DS but the wiring width of the common data line RS is double that of the common data line DS. Consequently, the wiring capacitance between the power source voltage VDD and the common data line RS is double the wiring capacitance between the power source voltage VDD and the common data line DS and the wiring resistance is ½. Such a construction of the bias circuit can make the applied voltage to the memory cell MC equal to that of the dummy cell DC. Further, the load capacitance and the resistance per memory cell in the dummy cell DC can be made equal to the load capacitance and the resistance to the memory cell MC, and a current having the same value as the current flowing through the memory cell MC in accordance with the memory information can be allowed to flow through the complementary memory cells MCL and MCH in the dummy cell.

Next, a reference signal generation mechanism in the read circuit RDC1 will be explained. Here, the current flowing through the common data lines DS and RS are expressed by IDS and IRS, respectively, and the current that flows when the MTJ device MTJ is under the low resistance state is expressed by IDS(1). The current that flows when the memory cell holds the memory information and the MTJ device MTJ is under the high resistance state is expressed as IDS(0). The current IDS(1) has a value greater than IDS(0). Further, since the current IRS flowing through the common data line RS is the sum of the currents flowing through the dummy data lines DD0 and DD1 to which two memory cells MCH and MCL holding the complementary memory information are connected, this current IRS can be given by:

$$IRS=IDS(0)+IDS(1) \qquad (1)$$

When these symbols are used, one of the current mirror circuits CM shown in FIG. 5 charges the sense data line DT by the current IDS (1) or IDS (0) having the same value as the current flowing through the common data line DS. The other current mirror circuit CMD1 charges the sense data line DB by the current IRS/2 that is the half of the current flowing through the common data line RS. This current IRS/2 is a mean value of the currents flowing through the memory cells MC in accordance with the memory information and corresponds to the reference signal IREF having the relation shown in FIG. 4. It will be assumed hereby that the load capacitance of the sense data lines DT and DB is equal and is expressed as CD and that voltage dependence of the current flowing through the current mirror circuit between the power source voltage VDD and the sense data line is negligibly small. It will be assumed further for simplicity that the current flowing through the current mirror circuit takes a predetermined value immediately after activation. Then, the voltage VDT of the sense data line DT for reading the memory information '1' can be expressed as follows:

$$VDT(1)=(IDS(1) \times T)/CD \qquad (2)$$

(Here, T represents the time from activation of the current mirror circuit). In contrast, the voltage VDB of the sense data line DB is given as follows from equation (1):

$$VDB = [(IRS/2) \times T]/CD \qquad (3)$$
$$= [(IDS(0) + IDS(1) \times T)(2 \times CD)$$

The read signal $\Delta V1$ for reading the memory information '1' is given as follows from equations (2) and (3):

$$\Delta V1 = VDT(1) - VDB \qquad (4)$$
$$= [(IDS(0) - IDS(1) \times T)/(2 \times CD)$$

The voltage VDT(0) of the sense data line DT when reading the memory information '0' can be expressed as follows:

$$VDT(0)=(IDS(0) \times T)/CD \qquad (5)$$

Therefore, the read signal $\Delta V0$ when reading the memory information '0' is given as follows from equations (3) and (5):

$$\Delta V0 = VDT(0) - VDB \qquad (6)$$
$$= -[(IDS(0) - IDS(1) \times T)/(2 \times CD)$$

As described above, the positive and negative read signals can be generated as expressed by equations (4) and (6) when the reference signal IRS is generated to the intermediate value between the positive binary read signals IDS(1) and IDS(0) by using the current mirror circuit CMD1 having a mirror ratio of 2:1. When reading the memory information "1", therefore, the driving capacity of the transistors N81 and P82 in the sense amplifier SA becomes greater as the potential difference between the sense data lines DT and DB becomes greater, and the sense data lines DT and DB are driven to the power source voltage VDD and to the ground potential VSS, respectively. When reading the memory information '0', the driving capacity of the transistors P81 and N82 in the sense amplifier SA becomes greater as the potential difference between the sense data lines DT and DB becomes greater, and the sense data lines DT and DB are driven to the ground potential VSS and to the power source voltage VDD, respectively. When the sense data lines DT and DB are amplified to the power source voltage VDD or to the ground potential VSS in this way in accordance with the positive or negative read signal, the memory information can be distinguished.

Figure 6:
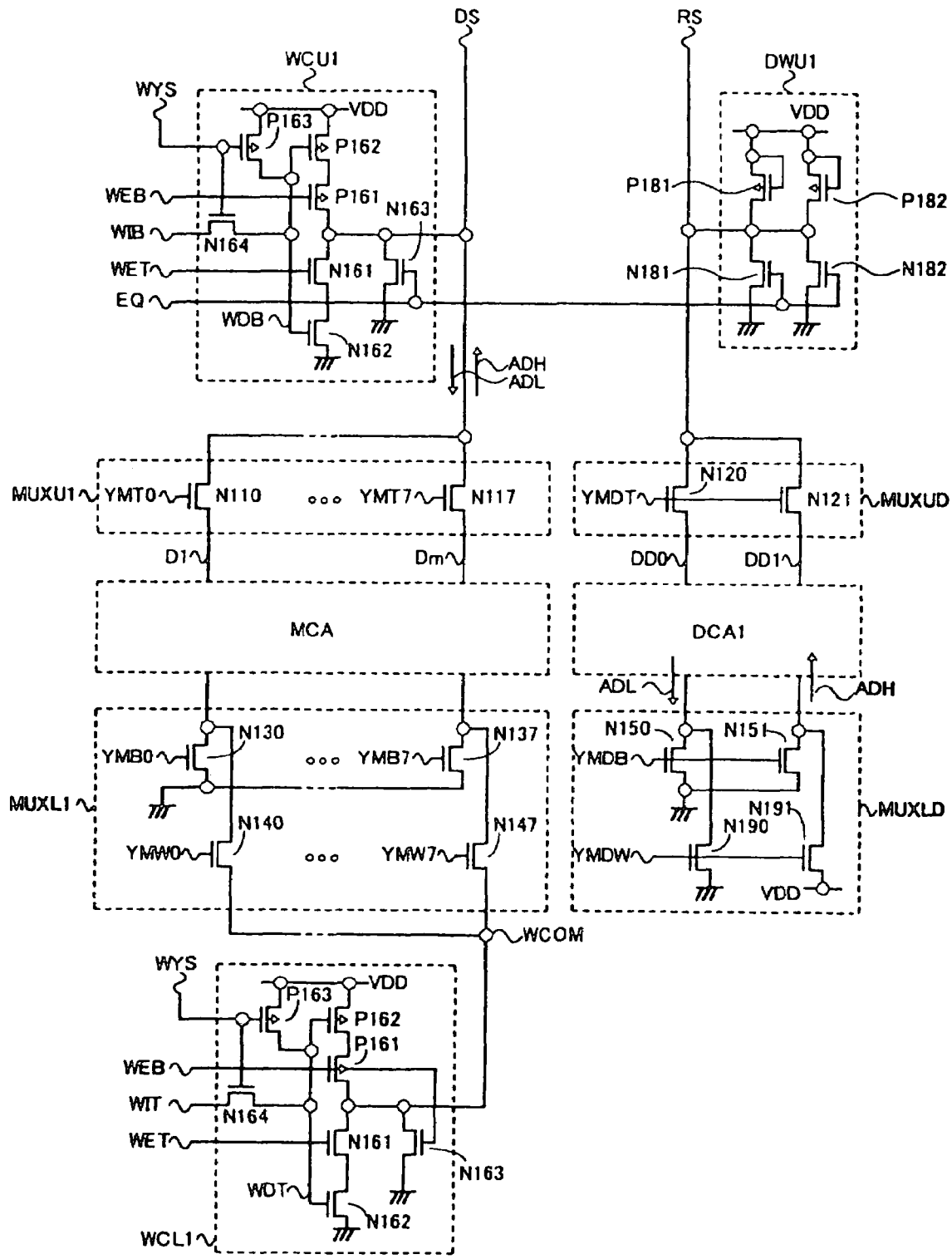
FIG. 6 shows a structural example of a multiplexer and a write circuit according to Embodiment 1.

FIG. 6 shows a structural example of the multiplexers MUXU1, MUXL1, MUXUD and MUXLD, the write circuits WCU1 and WCL1 and the dummy write circuit DWU1 shown in FIG. 1. First, the multiplexers MUXU1, MUXL1, MUXUD and MUXLD will be explained. The multiplexer MUXU1 comprises eight NMOS transistors N11$j$ ($j$=0, 1, . . . , 7) corresponding to the switches SRW shown in FIG. 1. A corresponding column address signal YMTj ($j$=0, 1, . . . , 7) is applied to the gate of the transistor N11$j$. The multiplexer MUXL1 includes eight NOMS transistors N13$j$ ($j$=0, 1, . . . , 7) corresponding to the switches SRB shown in FIG. 1 and eight NMOS transistors N14$j$ ($j$=0, 1, . . . , 7) corresponding to the switches SW shown in FIG. 1. A corresponding column address signal YMBj ($j$=0, 1, . . . , 7) is applied to the gate of the transistor N13$j$ and a corresponding column address signal YMWj ($j$=0, 1, . . . , 7) is applied to the gate of the transistor N14$j$. Here, each of the column address signals YMTj, YMBj and YMWj is the signal in the column decode address DYM shown in FIG. 1 and the wiring condition of the data line Dj is controlled in the following way in accordance with the operation.

First, in the case of the standby state, the column address signals YMTj and YMWj are kept at the ground potential VSS and the column address signal YMBj, at the power source voltage VDD. The transistors N11$j$ and N14$j$ are OFF while the transistor N13$j$ is ON, thereby grounding each data line D. Next, in the case of the read operation where the data line D0 is selected, for example, the column address signal YMT0 is driven to the power source voltage VDD and the column address signals YMB0 and YMW0 are driven to the ground potential VSS. The transistor N110 is ON while the transistors N130 and N140 are OFF, so that the data line D0 is connected to the common data line DS. Therefore, it is possible to output the current flowing through the memory cell MC to the common data line DS. Further, in the case of the write operation where the data line D0 is selected, for example, the column address signals YMT0 and YMW0 are driven to the power source voltage VDD and the column address signal YMB0 is driven to the ground potential VSS. The transistors N110 and N140 are ON while the transistor N130 is OFF, so that the data line D0 is connected to the common data line DS and to the write common node WCOM. Therefore, a current path can be formed in the selected data line.

The multiplexer MUXUD includes two NMOS transistors N120 and N121 corresponding to the switches SRW shown in FIG. 1. The column address signal YMDT is inputted to the gates of these transistors N120 and N121. The multiplexer MUXLD includes two NMOS transistors N150 and N151 corresponding to the switches SRB shown in FIG. 1 and two NMOS transistors N190 and N191 corresponding to the switches SW shown in FIG. 1. The column address signal YMDB is inputted to the gates of the transistors N150 and N151 while the column address signal YMDW is inputted to the gates of the transistors N190 and N191. Here, each of the column address signals YMDT, YMDB and YMDW is the signal in the column decode address DYM shown in FIG. 1 and controls the wiring state of the dummy data lines DD0 and DD1 in the following way in accordance with the operation.

First, in the case of the standby state, the column address signals YMDT and YMDW are kept at the ground potential VSS and the column address signal YMDB is held at the power source voltage VDD. The transistors N120, N121, N190 and N191 are OFF and the transistors N150 and N151 are ON with the result that the dummy data lines DD0 and DD1 are grounded. Next, in the case of the read operation, when one of the data lines Dj is selected, the column address signal YMDT is driven to the power source voltage VDD while the column address signals YMDB and YMDW are driven to the ground potential VSS. The transistors N120 and N121 are ON and the transistors N150, N151, N190 and N191 are OFF, so that the dummy data lines DD0 and DD1 are connected to the common data line RS. In consequence, the current flowing through the dummy cell DC can be outputted to the common data line RS. In the case of the write operation, further, the address signals YMDT and YMDW are driven to the power source voltage VDD and the column address signal YMDB to the ground potential VSS. The transistors N120, N121, N190 and N191 are ON while the transistors N150 and N151 are OFF, so that a current path from the dummy data line DD1 through the common data line RS and the dummy data line DD0 is formed between the power source voltage VDD and the ground potential VSS. Since the directions of the currents flowing through the dummy data lines DD0 and DD1 are the directions indicated by arrows ADL and ADH, respectively, the complementary memory information can be simultaneously written into the dummy cell DC as explained already with reference to FIG. 2. Here, the direction of the magnetic field written into the MTJ device remains generally unaltered even when the impressed voltage is 0 V and can be held as such even when the power source of the chip is cut off. Therefore, the write operation to the dummy cell may be sufficiently conducted once as the initialization operation at the time of the test before shipment, for example.

Next, a structural example of the write circuits WCU1 and WCL1 and the dummy write circuit DWU1 will be explained with reference to FIG. 6. First, the write circuit WCU1 includes PMOS transistors P161, P162 and P163 and NMOS transistors N161, N162, N163 and N164. The write control signals WET and WEB and the pre-charge enable signal EQ among the array control bus ABS are inputted to the write circuit WCU1. The transistor N164 is a switch for selecting the write data line. Its source is connected to the write data line WIB, its drain is connected to the internal write node WDB and its gate, to the column select signal WYS. When connected in series, the transistors P161, P162, N161 and N162 constitute a clocked inverter. The gate of the transistor P161 is connected to the write control signal WEB and the gate of N161 is connected to the write control signal WET. The internal write node WDB is connected to the gates of the transistors P162 and N162 as the data input terminal of the clocked inverter, and the common data line DS is connected to the drains of the transistors P161 and N161 as the output terminal. Further, the transistors P163 and N163 are pre-charge transistors for the internal write node WDB as the data input terminal of the clocked inverter and the common data line DS as the output terminal. The column select signal WYS is inputted to the gate of the transistor P163 and the pre-charge enable signal EQ is inputted to the gate of the transistor N163.

The write circuit WCL1 is composed of the same transistors as those of the write circuit WCUL1 but is different from the latter in the following four points. First, the source of the transistor N164 is connected to the write data line WIT. Second, the gate terminals of the transistors P162 and N162 as the data input terminal of the clocked inverter are called "internal write node WDT". Third, the drains of the transistors P161 and N161 as the output terminals of the clocked inverter are connected to the write common node WCOM. Fourth, the write control signal WEB is connected to the gate of the transistor N163. The write circuits WCU1 and WCL1 having the construction described above drive the data line DS and the write common node WCOM in the following way.

First, in the case of the standby state, the write control signal WET is driven to the ground potential VSS and the write control signal WEB and the pre-charge enable signal EQ are driven to the power source voltage VDD in the write circuit WCU1. The transistors P161 and N161 are OFF and N163 is ON, so that the common data line is grounded. In the write circuit WCU1, on the other hand, the transistors P161 and N161 are similarly OFF with N163 being ON, so that the write common node WCOM is grounded.

Next, in the case of the read operation, the write control signal WET and the pre-charge enable signal EQ are driven to the ground potential VSS and the write control signal WEB is driven to the power source voltage VDD. The transistors P161, N161 and N163 are OFF with the result that the output of the write circuit WCU1 enters the high resistance state. In the write circuit WCL1, on the other hand, the transistors P161 and N161 are OFF and the N163 is ON, thereby grounding the write common node WCOM.

In the case of the write operation, the column select signal WYS is driven to a boosted potential VDH (here, VDH≧VDD+VTHN with VTHN representing a threshold voltage of the NOMS transistor). The write control signal WET is driven to the power source voltage VDD, and the write control signal WEB and the pre-charge enable signal EQ are driven to the ground potential VSS. The transistors N164 in the write circuits and WCL1 are ON, the clocked inverter is under the activated state and the transistors P163 and N163 are OFF. Owing to this operation, a current path is formed between the power source voltage VDD and the ground potential VSS through the write circuits WCU1 and WCL1, the common data line DS, the write common node WCOM and the data line D selected by the multiplexers MUXU1 and MUXL1. Here, when the write data lines WIB and WIT are driven to the ground potential VSS and the power source voltage VDD, respectively, the transistor P162 in the write circuit WCU1 and the transistor N162 in the write control circuit WCL1 are rendered conductive and the current is generated in the selected data line D in the direction indicated by arrow ADL. In this way, the memory information '1' is written into the selected memory cell MC. On the other hand, when the write data lines WIB and WIT are driven to the power source voltage VDD and the ground potential VSS, respectively, the transistor N162 in the write circuit WCU1 and the transistor P162 in the write control circuit WCL1 are rendered conductive and the current is generated in the selected data line D in the direction indicated by arrow ADH. In consequence, the memory information '0' is written into the selected memory cell MC.

The dummy write circuit DWU1 includes load PMOS transistors P181 and P182 and pre-charging NMOS transistors N181 and N182. The power source voltage VDD is inputted to the sources and gates of the transistors P181 and P182, and their drains are connected to the common data lines RS. The pre-charge enable signal EQ is inputted to the gates of the transistors N181 and N182 and the ground potential VSS is inputted to their sources. The drains are connected to the common data line RS. According to this construction, the pre-charge enable signal EQ is driven to the power source voltage VDD during the standby state and the transistors N181 and N182 are turned ON, so that the common data line RS is grounded.

In the case of the read operation, the pre-charge enable signal EQ is driven to the ground potential VSS and the transistors N181 and N182 are turned OFF. Therefore, the output of the dummy write circuit DWU1 is brought into the high resistance state in the same way as the write circuit WCU1. Here, the gate size of the transistors P181 and P182 is formed into the same size as that of the transistor P161. Further, when the gate size of the transistors N161 and N163 is the same, the gate length of the transistors N181 and N182 is set to the same length as that of the transistors N161 and N163, and the gate width is set to the sum of the gate width of the transistors N161 and N163. In this way, the diffusion capacitance that is twice the diffusion capacitance occurring in the common data line DS is generated in the common data line RS.

In the case of the write operation, the output of the dummy write circuit DWU1 is brought into the high resistance state because the pre-charge enable signal EQ is driven to the ground potential VSS and the transistors N181 and N182 are turned OFF in the same way as in the read operation.

The constructions and the operation described above will be summarized. First, in the case of the write operation in the write circuits WCU1 and WCL1, the current is generated on the selected data line D in the direction corresponding to the memory information. In this way, the magnetic field necessary for inverting the direction of magnetization of the ferromagnetic layer FRL shown in FIG. 3 can be generated. In the case of the read operation, the output of the write circuit WCU1 is raised to the high resistance state so that the current flowing through the memory cell MC can be outputted to the read circuit RDC1 through the common data line DS. Since the clocked inverter including the transistors, to the gates of which the write control signals WEB and WET are inputted, are disposed not on the power source side but on the output terminal side, the load capacitance added to the common data line DS at the time of the read operation when the output is under the high resistance state can be restricted to the diffusion capacitance of the transistors P161 and N161. Further, in the case of the standby state, the common data line DS and the write common node WCOM are grounded in the same way as the data line Dj. Consequently, when the selected data line, the common data line DS and the write common node WCOM are connected, no current develops in the selected data line, and destruction of the memory information in the memory cell MC can be prevented.

Next, in the case of the initialization operation in the dummy write circuit DWU1, the output is brought into the high resistance state, so that the current path, in which the currents flowing through the dummy data lines DD0 and DD1 can be turned back by the common data line RS, can be formed as described in the explanation of the multiplexers MUXUD and MUXLD. In the case of the read operation, each transistor is formed in such a fashion that the diffusion capacitance twice the diffusion capacitance occurring in the common data line DS can be generated in the common data line RS. As a result, the diffusion capacitance per memory cell in the dummy cell DC can be made equal to the value of the memory cell MC connected to the common data line DS. Therefore, the reference signal having the relation shown in FIG. 4 can be accurately generated from the point immediately after activation of the memory cell MC and the dummy cell DC. In the case of the standby state, the common data line RS is grounded in the same way as the dummy data lines DD0 and DD1 lest the current occurs in the dummy data lines DD0 and DD1 when these data lines are connected. Therefore, destruction of the memory information in the dummy cell DC can be prevented.

Figure 7:
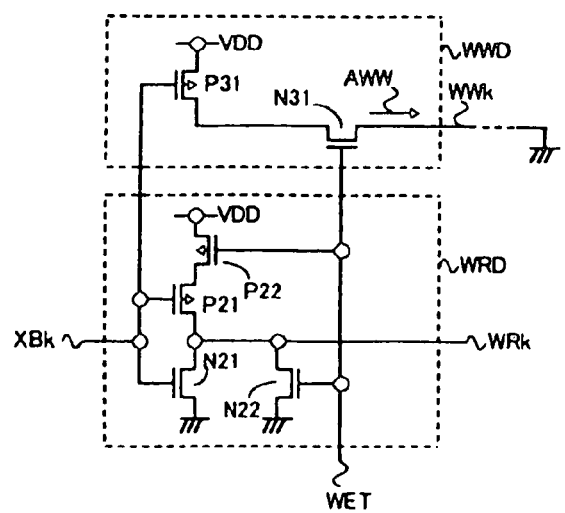
FIG. 7 shows a structural example of a word driver according to Embodiment 1.

FIG. 7 shows word drivers that constitute a word driver array WDA and include a read driver WRD for driving a read word line WRk and a write driver WWD for driving a write word line WWk. The read driver WRD is a NOR circuit including PMOS transistors P21 and P22 and NMOS transistors N21 and N22. Row decode signals XBk are connected to the gates of the transistors P21 and N21 as one of the input terminals, and write control signals WET are connected to the gates of the transistors P22 and N22 as the other input terminal. Here, the write control signal WET is one of the signals among the array control bus ABS shown in FIG. 1. The write driver WWD includes a PMOS transistor P31 and an NMOS transistor N31. These transistors are connected in series. The power source voltage VDD is inputted to the source of the transistor P31 and the source of the transistor N31 is connected to the write word line WWk. The row decode signal XBk is connected to the corresponding gate of the transistor P31 and the write control signal WET is connected to the gate of the transistor N31. The operation of this word driver will be explained below.

First, in the case of the read operation, the write control signal WET is held at the ground potential VSS. Therefore, the transistor N22 keeps the OFF state, the transistor P22 becomes conductive and the power source voltage VDD is supplied to the transistor P21, so that the read driver WRD is activated. The kth word line is selected and the row decode signal XBk that has been at the power source voltage VDD is driven to the ground potential VSS. The transistor P21 becomes conductive and the read word line WRk that has been at the ground potential VSS is driven to the power source voltage VDD. At this time, since the transistor N31 is OFF in the write driver WWD, the write word line WWk is kept at the ground potential VSS.

Next, in the write operation, when the write control signal WET at the ground potential VSS is driven to the power source voltage VDD, the transistor N31 in the write driver WWD becomes conductive. Therefore, the kth word line is selected and the row decode signal XBk at the power source voltage VDD is driven to the ground potential VSS and the transistor P31 becomes conductive, so that a current develops in the write word line WWk in the direction indicated by arrow AWW. At this time, the read driver WRD is under the standby state, the transistor P22 is OFF and the transistor N22 is conductive. Therefore, the read word line WRk is held at the ground potential VSS. As described above, the word driver according to this embodiment can separately drive the read word line and the write word line in accordance with the operation.

Figure 8:
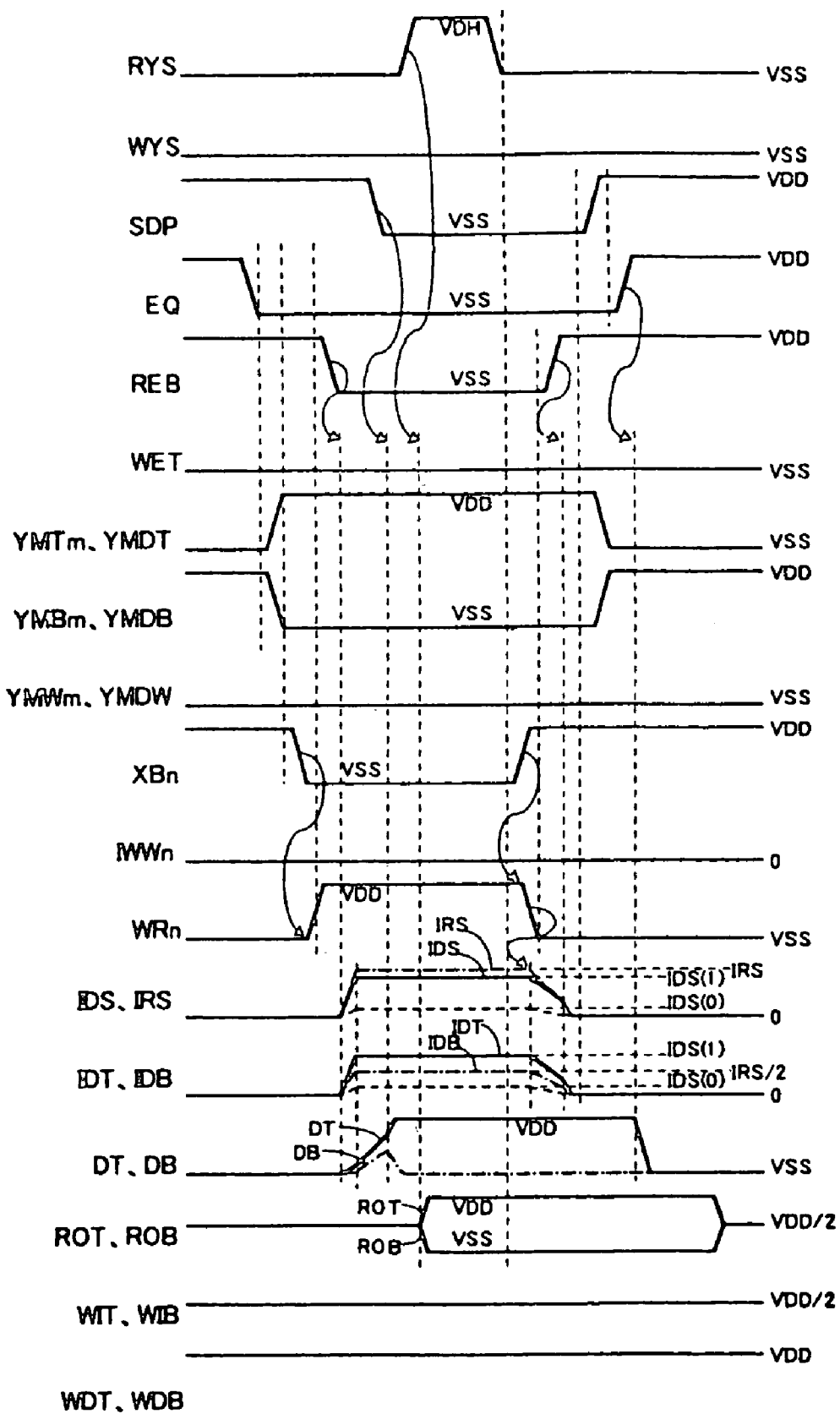
FIG. 8 shows an example of a read operation timing of the memory block in Embodiment 1.

Next, the read operation of the memory block in the present invention will be explained as a whole. FIG. 8 shows the timing waveforms of the read operation. In the description that follows, it will be assumed that the selected memory cell MCnm is arranged at the point of intersection between the nth word line and the mth data line and holds the memory information '1', for example, and the MTJ device MTJ at the selected memory cell MCnm is under the low resistance state. It will be further assumed that the read data lines ROT and ROB and the write data lines WIT and WIB are connected to the pre-charge circuits, respectively, though not shown in FIG. 1, and are driven to VDD/2 during standby. The explanation will be given on the basis of these assumptions with reference to FIGS. 1, 2, 5, 6 and 7.

First, in the case of the read operation, the column select signal WYS and the write control signal WET are held at the ground potential VSS and the write circuits WCU1 and WCL1 are held under the non-activation state. To begin with, the select operation of the memory cell MCnm is conducted. When the read activation signal, omitted in FIG. 8, is inputted, the pre-charge enable signal EQ held at the power source voltage VDD is driven to the ground potential VSS. In consequence, the write circuit WCU1 and the dummy write circuit DWU1 shown in FIG. 6 are turned OFF and the common data lines DS and RS are cut off from the ground potential VSS. Since the pre-charge circuit PCEQ shown in FIG. 5 is also turned OFF, the sense data lines DT and DB are kept at the ground potential VSS as the precharge potential. Next, while the column address signals YMWm and YMDW are kept at the ground potential VSS, the column address signals YMTm and YMDT at the ground potential VSS are driven to the power source voltage VDD and the column address signals YMBm and YMDB at the power source voltage VDD are driven to the ground potential VSS, so that the data line Dm and the dummy data lines DD0 and DD1 shown in FIG. 6 are cut off from the ground potential VSS while the common data line DS is connected to the data line Dn and the common data line RS is connected to the dummy data lines DD0 and DD1. Further, when the row decode signal XBn at the power source voltage VDD is driven to the ground potential VSS, the read word line WRn in the word driver shown in FIG. 7 is driven to the power source voltage VDD and the write word line WWn is held at the ground potential VSS. In consequence, the memory cell MCnm and the dummy cell DCn in the memory block shown in FIG. 1 are selected and the transistor N1 in the memory cell shown in FIG. 2 becomes conductive. Subsequently, the read control signal RDB at the power source voltage VDD is driven to the ground potential VSS and the current mirror circuits CM and CMD1 in the read circuit RDC1 shown in FIG. 5 are activated respectively. Two current paths extending from the current mirror circuits CM and CMD1 through the bias circuit BC1, the multiplexers MUXU1 and MUXUD, the memory cell MCnm and the dummy cell DCn are thus formed between the power source voltage VDD and the ground potential VSS.

Next, detection and amplification of the memory information are conducted. As described in the explanation of the read circuit RDC1, the current IDS(1) indicated by solid line flows through one of the common data lines DS in accordance with the retention of the memory information '1' by the memory cell MCnm. The current mirror circuit CM having a mirror ratio of 1:1 receives this current and the sense data line DT is consequently charged by the current IDS(1). The current flowing through the sense data line DT is expressed as IDT in the drawing and indicated by solid line. Since the dummy cell Dn holds the complementary memory information, the current IRS=IDS(0)+IDS(1) indicated by one-dot-chain line flows through the other common data line RS and the current mirror circuit CMD1 having a mirror ratio of 2:1 receives this current. The sense data line DB is charged consequently by the current IRS/2. For reference, the waveforms when the current IDS(0) flows through the common data line DS and through the sense data line DT in accordance with the memory information '0' are indicated by dotted line n FIG. 8. As explained above, a very small potential difference is created between the sense data lines DT and DB. When the sense amplifier activation signal SDP at the power source voltage VDD is driven to the ground potential VSS at the timing at which the positive read signal ΔV1 represented by equation (4) becomes sufficiently large, the sense amplifier SA shown in FIG. 5 is activated and the sense data lines DT and DB are amplified to the power source voltage VDD and to the ground potential VSS, respectively. Further, the column select signal RYS at the ground potential VSS is driven to the boosted potential VDH to active the column select circuit YSW1 shown in FIG. 5. Consequently, the read data lines ROT and ROB precharged to VDD/2 are driven to the power source voltage VDD and to the ground potential VSS, respectively, and the memory information is outputted.

The operation for returning to the standby state is further conducted. First, the column select signal RYS at the boosted potential VDH is driven to the ground potential VSS to turn OFF the column select circuit. Next, the row decode signal XBk at the ground potential VSS is driven to the power source voltage VDD and the read word line WRk at the power source voltage VDD is driven to the ground potential VSS. The transistor N1 in the memory cell is turned OFF to cut off the current path formed in the memory cell MCnm and in the dummy cell DCn. The read control signal REB at the ground potential VSS is driven to the power source voltage VDD to bring the current mirror circuits CM and CMD1 into the standby state. Further, the column address signals YMTm and TMDT at the power source voltage VDD are driven to the ground potential VSS while the column address signals YMBm and YMDB at the ground potential VSS are driven to the power source voltage VDD. The data line Dm and the dummy data lines DD0 and DD1 are grounded. Subsequently, the sense amplifier activation signal SDP at the ground potential VSS is driven to the power source voltage VDD to bring the sense amplifier SA into the standby state. The pre-charge enable signal EQ is driven to the power source voltage VDD so that the sense data lines DT and DB and the common data lines DS and RS are pre-charged to the ground potential VSS. Finally, the read data lines ROT and ROB at the power source voltage VDD and at the ground potential VSS are driven to VDD/2 and the operation mode returns to the standby state.

Figure 9:
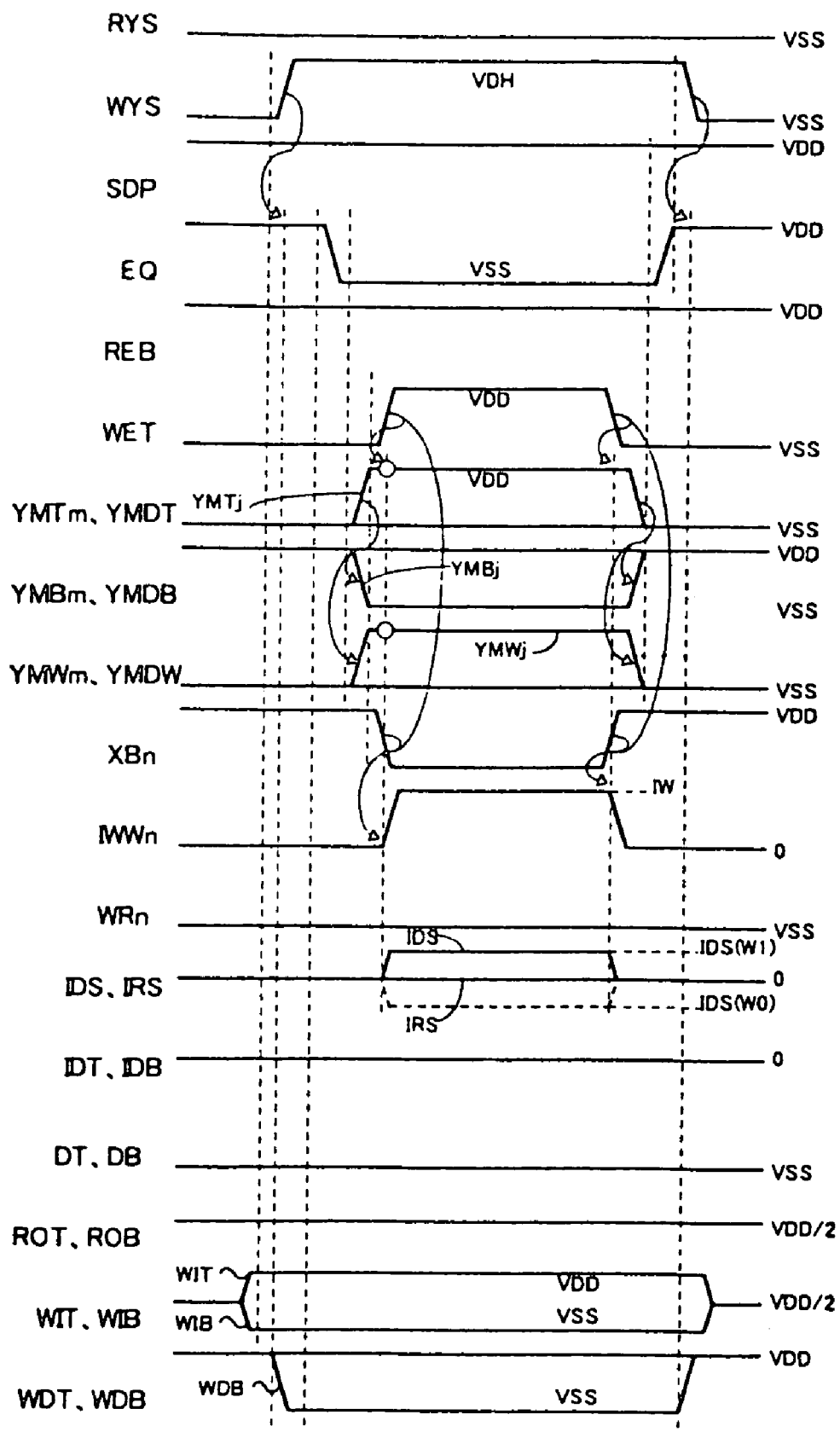
FIG. 9 shows an example of a write operation timing of the memory block in Embodiment 1.

Next, the write operation of the memory block according to the present invention will be explained as a whole. FIG. 9 shows the timing waveforms of the write operation. In the description that follows, it will be assumed that the selected memory cell MCnm is arranged at the point of intersection between the nth word line and the Mth data line and holds the memory information '1', for example. It will be further assumed that the read data lines ROT and ROB and the rite data lines WIT and WIB are connected to the pre-charge circuits, respectively, though not shown in FIG. 1, and are driven to VDD/2 during standby. The explanation will be given on the basis of these assumptions with reference to FIGS. 1, 2, 5, 6 and 7.

First, in the case of the read operation, the column select signal RYS is held at the ground potential VSS and the sense amplifier activation signal SDP and the read control signal RDB are held at the power source voltage VDD to bring the read circuit RDC1 into the standby state. To begin with, the input operation of the write data is conducted. When the write activation signal and the memory information '1' omitted in FIG. 8 are inputted, the write data lines WIB and WIT circuit pre-charged to VDD/2 are driven to the ground potential VSS and to the power source voltage VDD, respectively. Next, while the column select signals WYS at the ground potential VSS is driven to the boosted potential VDH and the transistor N164 in the write circuits WCU1 and WCL1 shown in FIG. 6 are turned ON. Consequently, one of the internal write nodes WDB is driven to the ground potential VSS and the other WDT, to the power source voltage VDD.

Next, the selection and write of the memory cell MCnm are conducted. First, the pre-charge enable signal EQ at the power source voltage VDD is driven to the ground potential VSS and the transistor N163 in the rite circuit WCU1 shown in FIG. 6 is turned OFF, hereby cutting off the common data line DS from the ground potential VSS. The column address signals YMTm and YMWm at the ground potential VSS are driven to the power source voltage VDD and the column address signal YMBm at the power source voltage VDD is driven to the ground potential VSS, cutting off the data line Dm shown in FIG. 6 from the ground potential VSS and connecting it to the common data line DS and to the write common node WCOM. Further, the write control signal WET at the ground potential VSS is driven to the power source voltage and the write control signal WEB at the power source voltage VDD is driven to the ground potential VSS to activate the write circuits WCU1 and WCL1, respectively. In consequence, a current path is formed from the write circuit WCU1 through the common data line DS, the data line Dm, the write common node WCOM and the write circuit WCL1, and the current IDS(W1) indicated by solid line is caused to flow. This current has a positive value corresponding to the direction of arrow ADL shown in FIG. 6. For comparison, FIG. 9 shows the waveforms indicated by dotted line when the current IDS(W0) flows through the common data line DS in accordance with the memory information '0'. This current has a negative value corresponding to the direction of arrow ADH shown in FIG. 6. Subsequently, the row decode signal XBn at the power source voltage VDD is driven to the ground potential VSS to activate the write driver portion WWD in the word driver shown in FIG. 7 and the current IW is allowed to flow through the write word line WWn. Therefore, a combined magnetic field is generated at the point of intersection between the data line Dm and the write word line WWn and the memory information '1' is written into the memory cell MCnm.

Further, the operation for returning to the standby state is conducted. To begin with, the row decode signal XBk at the ground potential VSS is driven to the power source voltage VDD to cut off the current path in the write word line WWk. The write control signal WET at the power source voltage VDD is driven to the ground potential VSS and the write control signal WEB at the ground potential VSS is driven to the power source voltage VDD to bring the write circuits WCU1 and WCL1 into the non-activation state, respectively, and to cut off the current path between the power source voltage VDD and the ground potential VSS. Further, the column address signals YMTm and YMWm at the power source voltage VDD are driven to the ground potential VSS while the column address signal YMBm at the ground potential VSS is driven to the power source voltage VDD, thereby grounding the data line Dm. Subsequently, the pre-charge enable signal EQ at the ground potential VSS is driven to the power source voltage VDD to pre-charge the common data line DS to the ground potential VSS. The transistor P163 in the write circuits WCU1 and WCL1 shown in FIG. 6 is turned ON to pre-charge the internal write nodes WDB and WDT to the power source voltage VDD, respectively. Finally, the write data lines WIT and WIB are driven to VDD/2 and the operation mode returns to the standby state.

The construction of the memory block-described above and the effects brought forth by its operation will be summarized below. First, the dummy cell according to this embodiment has the construction in which two memory cells MCL and MCH having the same construction as that of the memory cell MC are juxtaposed at the points of intersection between the word line pair and two dummy data lines as shown in FIG. 1, and hold the complementary memory information. In the read operation, these memory cells MCL and MCH are simultaneously activated so that the current at the time of the memory information '1' and the current at the time of the memory information '0' can be outputted to the two dummy data lines short-circuited by the common data line RS. Here, as shown in FIG. 5, the current mirror circuit CM having a mirror ratio of 1:1 receives the current occurring in the memory cell MC and charges one of the terminals of the sense amplifier whereas the current mirror circuit CMD1 having a mirror ratio of 2:1 receives the current occurring in the dummy cell DC and charges the other terminal of the sense amplifier by the mean current of the current flowing through the memory cell in accordance with the memory information. Consequently, the positive and negative read signals expressed by equations (4) and (6) can be acquired and the sense amplifier SA can discriminate and amplify the memory information. The cell having the same construction as that of the memory cell can be used to materialize the dummy cell according to this embodiment. Therefore, even when any change occurs in cell characteristics due to fabrication variance, the mean current of the memory cells can be accurately generated with the result that the margin of the read signal can be secured and the memory information can be read out accurately.

Second, since the direction of the magnetic field written into the MTJ device does not generally change even when the impressed voltage is set to 0 V, it can be kept even when the power source of the chip is cut off. Therefore, when the manufacturer conducts the write operation of the dummy cell before shipment of the chip, the activation time of MRAM according to the present invention can be shortened.

Third, the column address signals YMDT, YMDB and YMDW necessary for initializing the dummy cell are generated when the later-appearing external address is inputted.

Therefore, if the initialization operation is conducted during the test of the chip, this operation can be conducted simply at a low cost.

The explanation given so far has dealt with the memory cell array MCA having the 8×8 bit construction and the dummy cell array DCA1 having the 8×1 bit construction, by way of example. However, the array construction is not limited to such constructions. For example, it is possible to employ a memory cell array construction in which memory cells of hundreds of bits are arranged for one set of word line pair and for each data line, respectively. When the size of the memory cell array is increased in this way, it becomes possible for a large number of memory cells MC to share the read circuit RDC1 and the write circuits WCU1 and WCL1, and the occupation ratio of the memory cell array to the entire chip can be improved.

Figure 10:
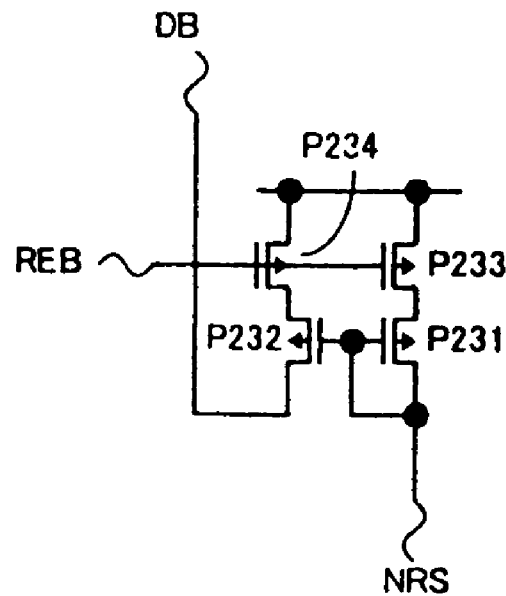
FIG. 10 shows another structural example of a current mirror circuit in Embodiment 1.

The effects explained above can be accomplished, too, when the construction of each circuit block in the memory block shown in FIG. 1 is modified. For example, a modified example of the current mirror circuit CMD1 shown in FIG. 5 will be hereby explained. FIG. 10 shows another structural example of a current mirror circuit having a mirror ratio of 2:1. The current mirror circuit CMD1 explained previously uses six transistors but the example shown in FIG. 10 uses four PMOS transistors P231, P232, P233 and P234. The gates of the transistors P231 and P232 and the drain of P231 are connected to the internal common data line NRS. The drain of the transistor P232 is connected to the sense data line DB. The transistors P233 and P234 form a power control switch that receives the power source voltage VDD at the source and the control signal REB at the gate, respectively. These transistors are connected in series with the transistors P231 and P232, respectively. Here, the transistors P232 and P234 are formed into the same gate size as that of the transistors P42 and P44 in the current mirror circuit CM shown in FIG. 5. The gate length of the transistors P231 and P233 is formed into the same length as that of the transistors P41 and P43 while the gate width is formed to the double that of the transistors P41 and P43. In this way, there is formed a current mirror circuit having a mirror ratio of 2:1. It is thus possible to replace the two transistors P51 and P52 or P53 and P54, that are connected in parallel by the current mirror circuit CMD1 in FIG. 5 and have the same size, by one transistor P231 or P233. In this case, the isolation region of the transistors becomes unnecessary and the layout area can be decreased.

Figure 11:
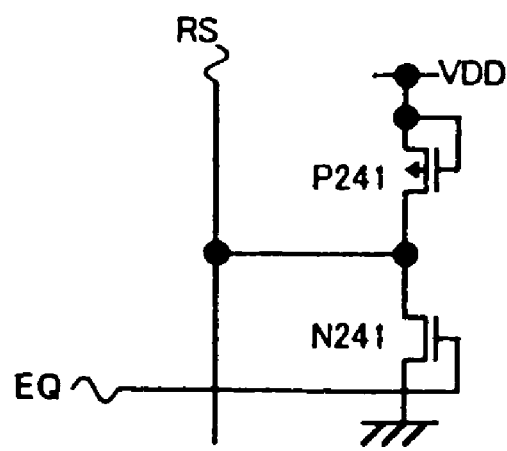
FIG. 11 shows another structural example of a dummy write circuit in embodiment 1.

Further, the explanation will be given on the dummy write circuit as another example of the circuit construction in the circuit block shown in FIG. 1. FIG. 11 shows another structural example of the dummy write circuit. The dummy write circuit DWU1 shown in FIG. 6 includes four transistors but the example shown in FIG. 11 uses one PMOS transistor P241 and one NMOS transistor N241. Here, the gate length of the transistor P241 is set to the same length as that of the transistors P181 and P182 and the gate width is set to the sum of the gate width of the transistors P181 and P182. The gate length of the transistor N241 is set to the same length as that of the transistors N181 and N182 and the gate width is set to the sum of the gate width of the transistors N181 and N182. It is thus possible to replace the two transistors connected in parallel in the dummy write circuit DWU1 in FIG. 6 and having the same size by one transistor, respectively. Consequently, the isolation region of the transistors becomes unnecessary, and the layout area can be decreased.

Next, an example of the overall construction of a semiconductor device, to which the memory block according to this embodiment is applied, will be explained. FIG. 12 shows a structural example of a memory array MAR (here, a t×s construction) in which memory blocks BLK of this embodiment shown in FIG. 1 are arranged in matrix. A column decoder YSDEC is disposed on the upper side of the memory array MAR. A plurality (here, t) of column decoders YMD, row decoders XDEC and array control circuits ACTL are disposed for each row of the matrix on the left side of the memory array MAR. A main data input line MI and a main data output line MO are connected to each memory block BLK. Though omitted in the drawing, the main data input line MI includes a plurality of write data lines WIT and WIB shown in FIG. 1 and the main data output line MO includes a plurality of read data lines ROT and ROB. Each circuit block plays the following role.

The column decoder YSDEC generates a plurality of column select signals RYS and WYS shown in FIG. 1 in accordance with the column pre-charge address CYS inputted, and inputs them to the memory blocks BLK arranged in the corresponding columns. The read data is outputted from the memory block BLK, in which the memory cell to be selected is arranged, to the main data output line MO in accordance with the column select signal RYS. The write data is inputted from the main data input line MI to the memory block BLK, in which the memory cell to be selected is arranged, in accordance with the column select signal WYS. The column decoder YMD generates the column decode address DYM in accordance with the inputted column pre-decode address CYM and mat select signal MS, respectively, and inputs the column decode address DYM to the memory blocks BLK arranged in the corresponding row, respectively. The column decode address DYM has a plurality of column address signals YMTj, YMBj, YMWj, YMDT, YMDB and YMDW and executes control so that the data line and the dummy data line in the memory block BLK, in which the memory cell to be selected is arranged, can be activated as already described. The row decoder XDEC generates the row decode address DXB in accordance with the row pre-decode address CX and the mat select signal MS that are inputted, and inputs the row decode address DXB to the word driver array WDA in the memory block BLK disposed in the corresponding row. The array control circuit ACTL generates a plurality of control signals to the array control bus ABS in accordance with the mat select signal MS inputted, and inputs them to the memory block BLK disposed in the corresponding row. A plurality of control signals are the sense activation signal SDP, the pre-charge enable signal EQ, the read control signal RDB and the write control signals WET and WEB shown in FIGS. 1, 6 and 7, and these signals are activated so as to designate the memory cell to be selected.

FIG. 13 is a block diagram showing principal portions of a structural example of the synchronous memory. It includes a clock buffer CLKB, a command buffer CB, a command decoder CD, an address buffer AB, an input buffer DIB and an output buffer DOB. Further, this memory includes a plurality of units UNT1, UNT2, . . . each including a memory array MAR. Though the unit corresponds to a bank, a plurality of units may be provided to each bank. The unit includes a row pre-decoder XPD, a column pre-decoder YPD, a write buffer WB and a read buffer RB. Each circuit block plays the following role.

The clock buffer CLKB distributes an external clock CLK as an internal clock CLK1 to the command decoder CD, the address buffer AB, the input buffer DIB, the output buffer DOB, and so forth. The command decoder CD generates at desired timings control signals CM for controlling the address buffer AB, the input buffer DIB and the output buffer DOB in accordance with the internal control signal CMD1 generated from the external control signal CMD through the command buffer CB.

The address buffer AB acquires the address ADR from outside at a desired timing corresponding to the external clock CLK and outputs the row address BX to the row address pre-decoder XPD. The row address pre-decoder XPD pre-decodes the row address BX and outputs the row pre-decode address CX and a mat select signal MS to the memory array MAR. The address buffer AB further outputs the column address BY to the column address pre-decoder YPD. The column address pre-decoder YPD pre-decodes the column address BY and outputs a column pre-decode address CYM and a Y pre-decode address CYS to the memory array MAR. It will be assumed hereby that a row system address and a column system address are simultaneously acquired as the external address by way of example. In this case, since the row system operation and the column system operation are conducted simultaneously, the read/write operation can be conducted at a high speed. The row system address and the column system address may be acquired on the time division basis as another example. In such a case, the number of pins necessary for the address input can be decreased and the packaging cost and the board cost can be reduced.

The input buffer DIB acquires the external input data DQ at a desired timing and inputs the write data GI to the write buffer WB. The write buffer WB outputs the write data GI to the main input line MI. On the other hand, the read buffer RB receives the signal of the main output line MO and inputs the read data GO to the output buffer DOB. The output buffer DOB outputs the read data GO to the input/output data DQ at a desired timing.

The synchronous memory can be accomplished in the manner described above by using the memory block BLK according to this embodiment. In this case, the operation at a higher frequency becomes possible by acquiring the command and the address in synchronism with the external clock CLK and inputting and outputting the data. A higher data rate can thus be accomplished. Though omitted from the drawing, a column address counter is interposed between the address buffer AB and the column address pre-decoder YPD, and the column address BY for conducting a burst operation with the column address as the initial value is generated so as to continuously input/output the data.

Embodiment 2

Figure 14:
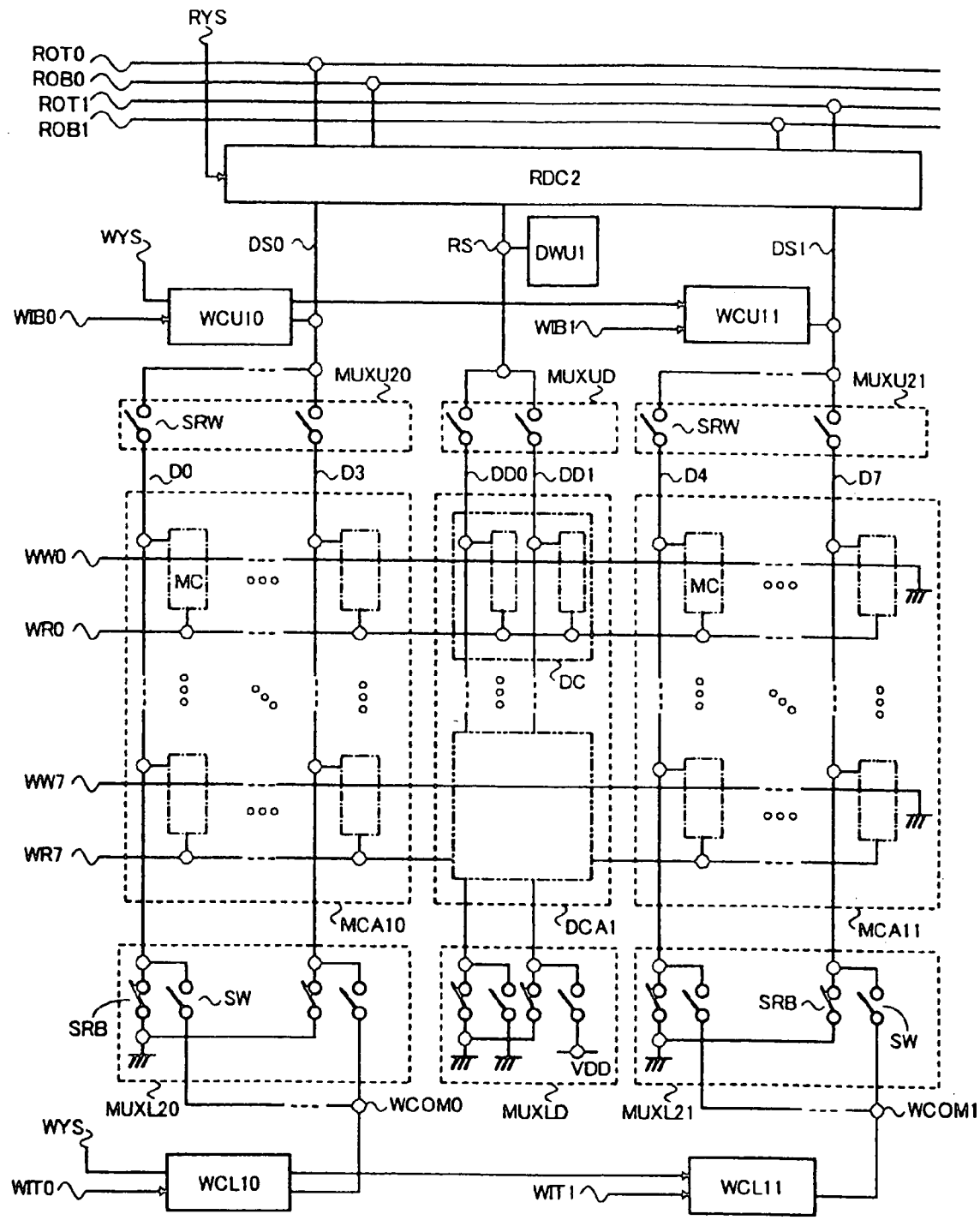
FIG. 14 shows a structural example of a memory block using memory cells each composed of one MTJ device and one transistor according to Embodiment 2.

In this embodiment, another structural example of the memory block and its operation will be explained. FIG. 14 is a block diagram of principal portions of the memory block. The memory block includes a read circuit RDC2, write circuits WCU10, WCU 11, WCL10 and WCL11, a dummy write circuit DWU1, multiplexers MUXU20, MUXL20, MUXU21, MUXL21, MUXUD and MUXLD, memory cell arrays MCA10 and MCA11 and a dummy cell array DCA1. In the drawing, the word driver array WDA, the column decode address DYM, the row decode address DXB and the array control bus ABS shown in FIG. 1 are omitted for simplifying the illustration. The feature of this embodiment resides in that the dummy cell array DCA1 is interposed between the two memory cell arrays MCA10 and MCA11 so as to reduce the near-far difference between the read circuit RDC2 and the data line Dj. The circuit block shown in FIG. 14 and its circuit construction will be described while stressing the difference from FIG. 1, and a method of generating the reference signal and the read operation in this embodiment will be explained.

As shown in FIG. 14, the memory cell arrays MCA10 and MCA11 in this embodiment have a scale that is a half of the scale of the memory cell array MCA shown in FIG. 1. In this structural example, each memory cell array has an 8×4 bit memory cell structure. In one of the memory cell arrays MCA10, the memory cells MC are arranged at the points of intersection between the word line pair WRk and WWk (k=0, . . . , 7) and the data lines Dj (j=0, . . . , 3). In the other memory cell array MCA11, the memory cells MC are arranged at the points of intersection between the word line pair WRk and WWk (k=0, . . . , 7) and the data lines Dj (j=0, . . . , 7). The dummy cell array DCA1 has 8×1 bit dummy cells DC in accordance with the construction of the memory cell array MCA.

The multiplexers MUXU20 and MUXL20 are arranged at both ends of the memory cell array MCA10, respectively, and operate while forming a pair with each other. One of the multiplexers MUXU20 includes a plurality of switches SRW (here, four switches) interposed between the common data line DS0 and a plurality of data lines Dj (j=0, . . . , 3), and connects the selected data line D to the common data line DS0 in accordance with the column decode address DYM omitted from the drawing. The other multiplexer MUXL20 includes a plurality of switches SRB (here, four switches) interposed between the ground potential VSS and a plurality of data lines Dj and a plurality of switches SW (here, four switches) interposed between the write common node WCOM0 and a plurality of data lines Dj. The former switches SRB cut off the connection between the selected data line D and the ground potential VSS in accordance with a column decode address DYM, omitted from the drawing, and the latter switches connect the selected data line D to the common node WCOM0.

The multiplexers MUXU21 and MUXL21 are arranged at both ends of the memory cell array MCA11, respectively, and operate while forming a pair with each other. One of the multiplexers MUXU21 includes a plurality of switches SRW (here, four switches) interposed between the common data line DS1 and a plurality of data lines Dj (j=4, . . . , 7), and connects the selected data line D and the common data line DS1 in accordance with the column decode address DYM omitted from the drawing. The other multiplexers MUXL21 includes a plurality of switches SRB (here, four switches) interposed between the ground potential VSS and a plurality of data lines Dj, and a plurality of switches SW (here, four switches) interposed between the write common node WCOM1 and a plurality of data lines Dj. The former switches SRB cut off the connection between the selected data line D and the ground potential VSS in accordance with the column decode address DYM omitted from the drawing, and the latter switches SW connect the selected data line D to the write common node WCOM1. Though the switches SRW, SRB and SW are schematically represented by symbols in the drawing, they are composed in practice of NOMS transistors, for example, and the wiring state is controlled in accordance with the existence/absence of the source-drain current path.

The write circuits WCU10 and WCL10 have the same circuit construction as that of the write circuits WCU1 and WCL1, are disposed further outside the multiplexers MUXU20 and MUXL20, respectively, and operate while forming a pair with each other. The write circuit WCU10 drives the common data line DS0 in accordance with the inputted column select signal WYS and the write data line WIB0 while the write circuit WOL10 drives the write common node WCOM0 in accordance with the inputted column select signal WYS and the write data line WITO.

Similarly, the write circuits WCU11 and WCL11 have the same circuit construction as the write circuits WCU1 and WCL1 shown in FIG. 6, are disposed further outside the multiplexers MUXU21 and MUXL21, respectively, and operate while forming a pair with each other. The write circuit WCU11 drives the common data line DS1 in accordance with the inputted column select signal WYS and the write data line WIBI while the write circuit WCL11 drives the write common node WCOM1 in accordance with the inputted column select signal WYS and the write data line WITI.

The read circuit RDC2 discriminates and amplifies the read signal outputted to the common data lines DS0, DS1 and RS and drives the read data lines ROT0, ROB0, ROT1 and ROB1 to the potentials corresponding to the data so read out.

With the construction of the circuit blocks described above, one each data line in the memory cell arrays MCA10 and MCA11 is simultaneously selected so that the two-bit information can be read or written. The explanation will be given hereinafter on the circuit construction of the read circuit, a method of regenerating the reference signal in this embodiment and the read operation.

Figure 15:
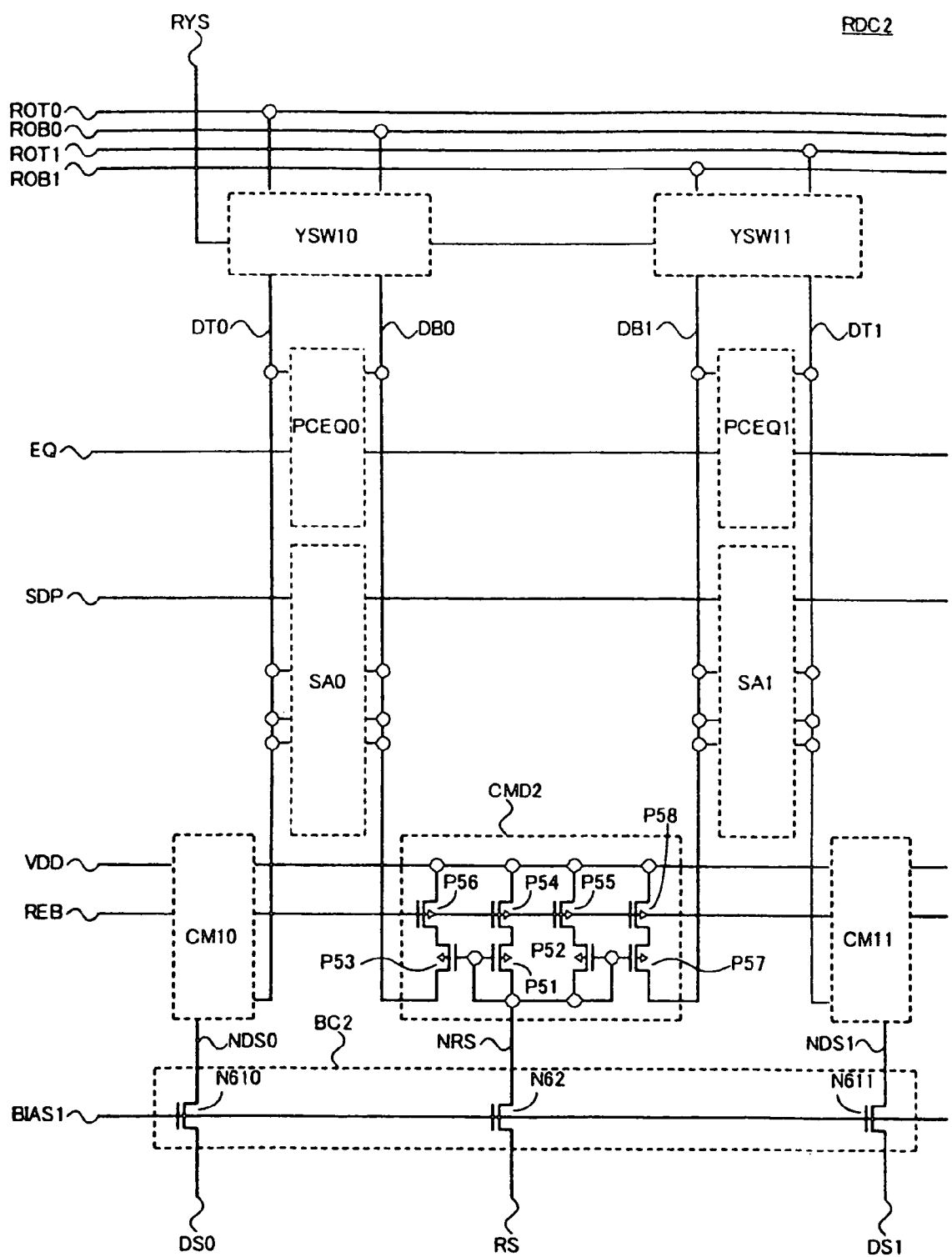
FIG. 15 shows a structural example of a read circuit according to Embodiment 2.

FIG. 15 shows the circuit construction of the read circuit RDC2. The read circuit RDC2 includes two sets of column select circuits YSW10 and YSW11, pre-charge circuits PCEQ0 and PCEQ1, sense amplifiers SA0 and SA1, current mirror circuits CM10 and CM11, a current mirror circuit CMD2 and a bias circuit BC2. The pre-charge enable signal EQ, the sense amplifier activation signal SDP and the read control signal REB among the constituent elements of the array control bus ABS shown in FIG. 1 are-inputted, and the column select signal RYS is further inputted. The column select circuits YSW10 and YSW11, the pre-charge circuits PCEQ0 and PCEQ1, the sense amplifiers SA0 and SA1 and the current mirror circuits CM10 and CM11 have the same construction as the column select circuit YSW1, the pre-charge circuit PCEQ, the sense amplifier SA and the current mirror circuit CM shown in FIG. 5, respectively. The circuit construction of the current mirror circuit CMD2 and the bias circuit BC2 will be explained below.

The current mirror circuit CMD2 is formed by adding PMOS transistors P57 and P58 to the circuit construction of the current mirror circuit CMD1 shown in FIG. 5. The drain of the transistor P53 is connected to the sense data line DB0 and the drain of the transistor P57 is connected to the sense data line DB1. The gates of the transistors P51, P52, P53 and P57 and the drains of the transistors P51 and P52 are altogether connected to the internal common data line NRS. The transistor P58 receives the power source voltage VDD at its source and the read control signal REB at its gate and functions as a power source control switch. The transistor P58 is connected in series with the transistor P57. Here, the gate of the transistor P57 is formed into the same size as that of the transistors P51, P52 and P53 and the gate of the transistor P58 is formed into the same size as that of the transistors P54, P55 and P56 so that the value of the current flowing through the source-drain of each transistor P51, P52, P53, P57 becomes equal. Therefore, when the current that is a half of the total current flowing through the transistors P51 and P52 is caused to flow through the source-drain of P53 and P57, there is formed a two-output current mirror circuit having a mirror ratio of 2:1.

The bias circuit BC2 has a construction in which an NMOS transistor N611 is added to the bias circuit BC1 shown in FIG. 5. A transistor N610 corresponds to the transistor N61 in FIG. 5. The common data line DS0 and the internal common data line NDS0 are connected to the source of the transistor N610 and to its drain, respectively, and the common data line DS1 and the internal common data line NDS1 are connected to the source of the transistor N611 and to its drain, respectively. Here, the bias voltage VB1 is applied to the gates of the transistors N610 and N611. The gate length of the transistor N62 is set to the same length as that of the transistors N610 and N611 and the data width is twice that of the transistors N610 and N611. In consequence, the ON resistance of the transistor N62 is ½ of the ON resistance of the transistors N610 and N611.

In the circuit construction of the read circuit RDC2 described above, the current mirror circuits CM10 and CM11 having a mirror ratio of 1:1 receive the currents outputted from the memory cell arrays MCA10 and MCA11 to the common data lines DS0 and DS1, and the sense data lines DT0 and DT1 are charged by the current having the same value as the current flowing through the two selected memory cells MC. In contrast, the two-output current mirror circuit CMD2 having a mirror ratio of 2:1 receives the current outputted from the dummy cell DC to the common data line RS, so that the sense data lines DB0 and DB1 are charged by the mean value of the currents flowing through the memory cells MC in accordance with the memory information. Therefore, the positive and negative read signals represented by equations (4) and (6) in Embodiment 1 are generated in the sense data lines DT0, DB0 and DT1 and DB1, and the sense amplifiers SA0 and SA1 discriminate and amplify the selected two-bit memory information. Further, the column select circuits YSW10 and YSW11 output the two-bit read data so read to the read data line ROT0, ROB0, ROT1 and ROB1.

The construction of the memory block described above and the effects brought forth by its operation will be summarized. First, the dummy cell array DCA1 is interposed between the two memory cell arrays MCA10 and MCA11 to reduce much more the near-far difference between the read circuit RDC2 and the data line Dj than in Embodiment 1. In this way, position dependence of the selected data line of the read signal quantity can be reduced. Second, the dummy cell having the same construction as that of the memory cell MC and holding the complementary memory information is used in the same way as in Embodiment 1. Therefore, even when any change occurs in performance due to fabrication variance, the mean current of the memory cells can be accurately generated and the memory information can be accurately read out.

The explanation given above has dealt with the memory cell arrays MCA10 and MCA11 having the 8×4 bit construction and the dummy cell array DCA1 having the 8×1 bit construction, by way of example. However, the array construction is not restrictive. For example, when a memory cell array construction in which memory cells of hundreds of bits are arranged for a set of word line pair and for each data line is employed in the same way as in Embodiment 1, the occupation ratio of the memory cell array to the entire chip can be improved. In this case, data line position dependence of the read signal quantity can be advantageously reduced when the construction of this embodiment is employed.

Figure 16:
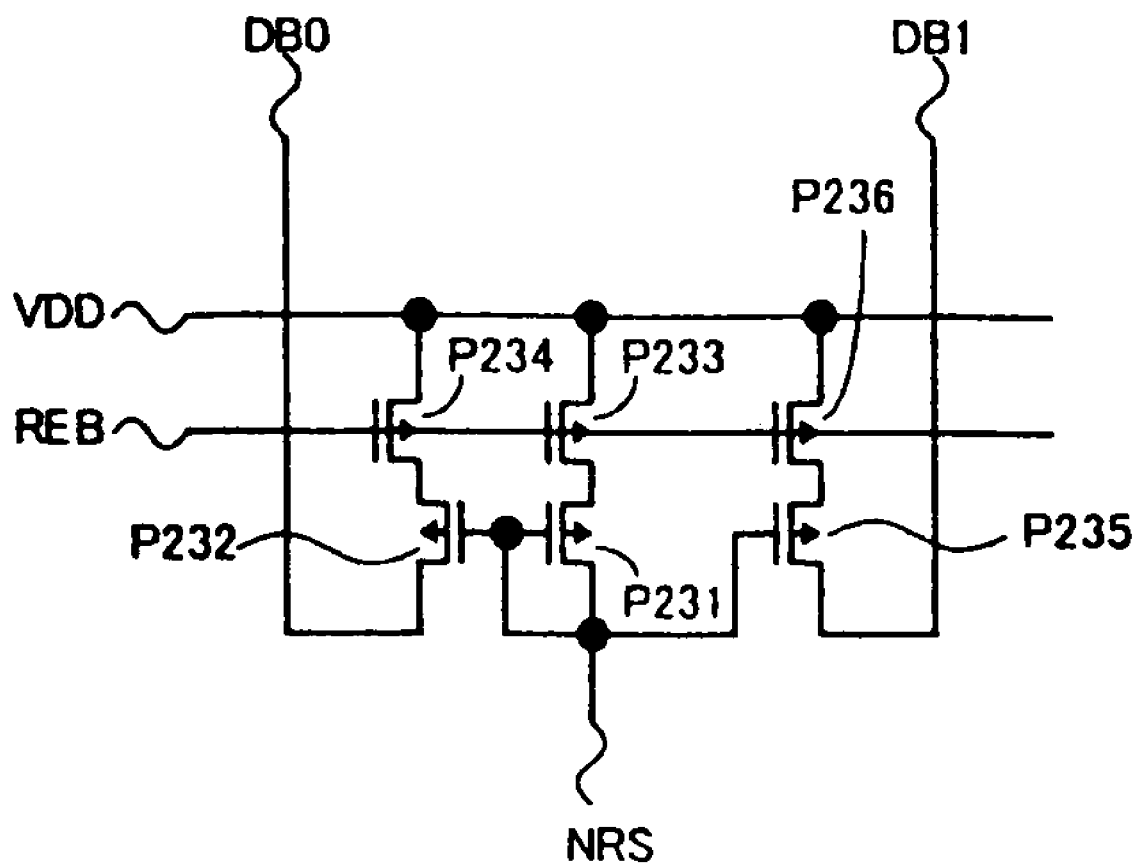
FIG. 16 shows another structural example of a current mirror circuit according to Embodiment 2.

The effect explained above can be accomplished, too, by modifying the construction of each circuit block in the memory block shown in FIG. 14. A modified example of the current mirror circuit CMD2 shown in FIG. 15 will be explained by way of example. FIG. 16 shows another structural example of the two-output current mirror circuit having a mirror ratio of 2:1. The current mirror circuit CMD2 shown in FIG. 15 uses eight transistors but the example shown in FIG. 16 uses six transistors by adding PMOS transistors P235 and P236 to the current mirror circuit shown in FIG. 10. The drain of the transistor P232 is connected to the sense data line DB0 and the drain of the transistor P235 is connected to the sense data line DB1. The gates of the transistors P231, P232 and P235 and the drain of the transistor P232 are connected to the internal common data line NRS, respectively. The transistor P236 receives the power source voltage VDD at its source and the read control signal REB at its gate, and functions as a power control switch. It is connected in series with the transistor P235. The gate length of the transistor P231 is set to the same length as that of the transistors P232 and P235, and the gate width of the transistor P231 is formed to the width twice that of the transistors P232 and P235. The gate length of the transistor P233 is set to the same length as that of the transistors P234 and P236, and the gate width of the transistor P233 is formed to the width twice that of the transistors P234 and P236. Consequently, there is formed a two-output current mirror circuit having a mirror ratio of 2:1 that permits a current of a half value of the current flowing through the transistor P231 to flow through the sources-drains of the transistors P232 and P235. The two transistors P51 and P52, or P53 and P54, that have the same size and are juxtaposed in the current mirror circuit CMD2 in FIG. 15, can be replaced by one transistor P231 or 233. In this way, the isolation region of the transistors becomes unnecessary and the layout area can be decreased.

Embodiment 3

Figure 17:
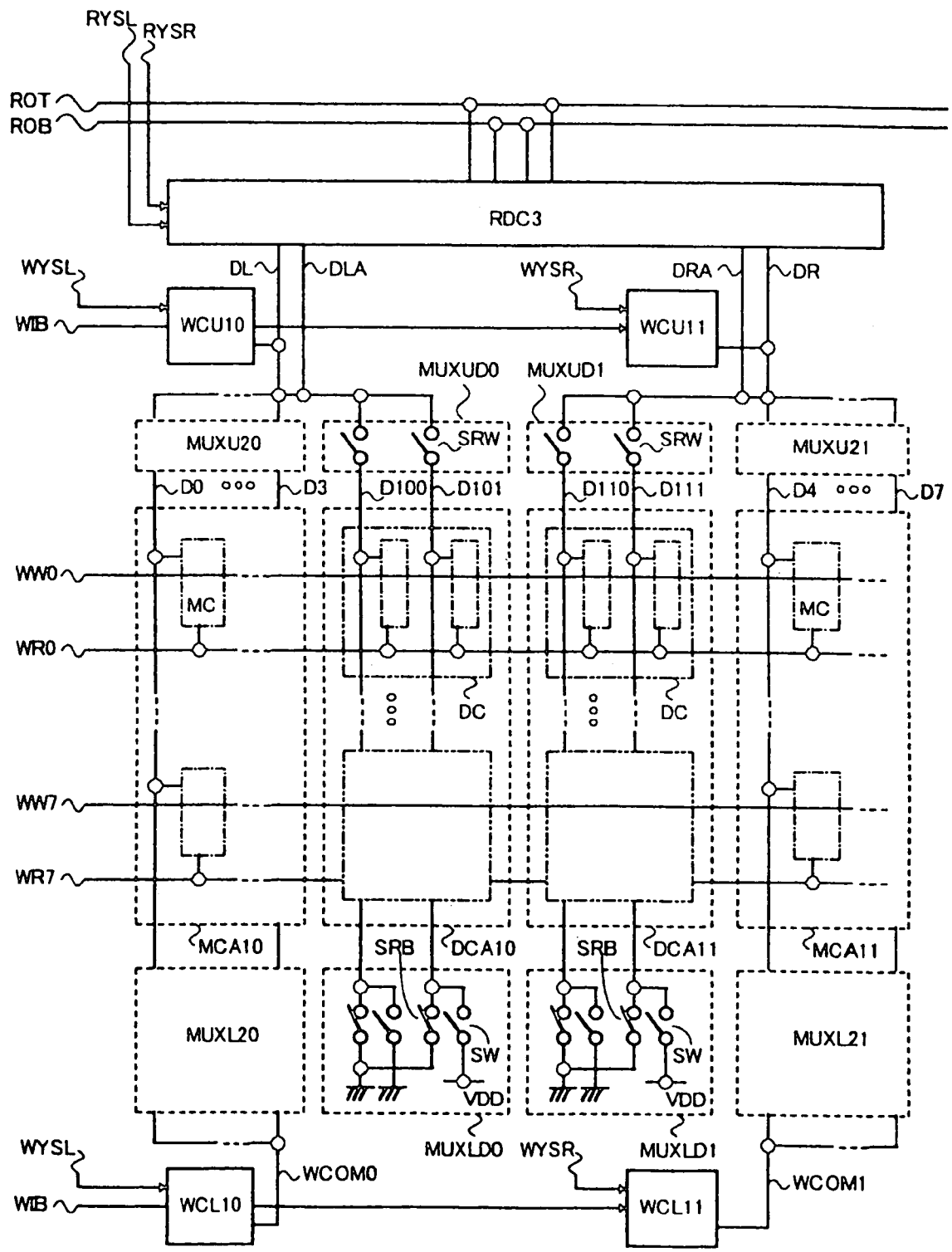
FIG. 17 shows a structural example of a memory block using memory cells each composed of one MTJ device and one transistor according to Embodiment 3.

In this embodiment, still another structural example of the memory block and its operation will be explained. FIG. 17 shows principal portions of the memory block. The memory block includes a read circuit RDC3, write circuits WCU10, WCL10, WCU11 and WCL11, multiplexers MUXU20, MUXL20, MUXU21, MUXL21, MUXUD0, MUXLD0, MUXUD1 and MUXLD1, memory cell arrays MCA10 and MCA11, and dummy cell arrays DCA10 and DCA11. The word driver array WDA, the column decode address DYM, the row decode address DXB and the array control bus ABS shown in FIG. 1 are omitted for simplicity from FIG. 17 in the same way as in FIG. 14. The feature of this embodiment is that the dummy cell arrays DCA10 and DCA11 are interposed between the two memory cell arrays MCA10 and MCA11, the terminals on one of the sides of the multiplexers MUXU20 and MUXUD0 corresponding to the memory cell array MCA10 and to the dummy cell array DCA10 are connected to the common data line DL and the terminals on one of the sides of the multiplexers MUXU21 and MUXUD1 corresponding to the memory cell array MCA11 and to the dummy cell array DCA11 are connected to the common data line DR so that the numbers of switches SRW connected to the common data line DL and DR can be aligned. Next, the circuit block shown in FIG. 17 will be explained with primary emphasis on the difference from FIG. 14.

The dummy cell arrays DCA10 and DCA11 have 8×1 bit dummy cells DC in the construction of the memory cell arrays MCA10 and MCA11 in the same way as DCA1 shown in FIG. 14. In one of the dummy cell arrays DCA10, the dummy cells DC are arranged at the points of intersection between the word line pair WRk and WWk (k=0, . . . , 7) and the dummy data lines D100 and D101. In the other dummy cell array DCA11, the dummy cells DC are arranged at the points of intersection between the word line pair WRk and WWk (k=0, . . . , 7) and the dummy data lines D110 and D111.

The multiplexers MUXUD0 and MUXLD0 are arranged at both ends of the dummy cell array DCA10 and operate while forming a pair with each other. One of the multiplexers MUXUD0 includes two switches SR interposed between the common data line DL and the dummy data lines D100 and D101, and connects the dummy data lines D100 and D101 to the common data line DL in accordance with the column decode address DYM not shown in the drawing. Therefore, the number of switches SRW connected to the common data line DL is six in combination with four switches of the multiplexer MUXU20. The other multiplexer MUXLD0 includes two switches SRB interposed between the ground potential VSS and the dummy data lines D100 and D101, and two switches SW interposed between the power source voltage VDD and the dummy data line D101. The former switches SRB cut off the connection between the dummy data lines D100 and D101 and the ground potential VSS in accordance with the column decode address DYM not shown in the drawing. The latter switches SW connect the dummy data line D100 to the ground potential VSS and the dummy data line D101 to the power source voltage VDD in accordance with the column decode address DYM not shown in the drawing. The multiplexers MUXUD0 and MUXLD0 having such a construction can generate currents having mutually opposite directions in the dummy data lines D100 and D101 and can initialize the dummy cell array DCA10.

The multiplexers MUXUD1 and MUXLD1 are arranged at both ends of the dummy cell array DCA11, respectively, and operate while forming a pair. One of the multiplexers MUXUD1 includes two switches SRW interposed between the common data line DR and the dummy data lines D110 and D111 and connect the dummy data lines D110 and D111 to the common data line DR in accordance with the column decode address DYM not shown. Therefore, the number of switches SRW connected to the common data line DR is six in total in combination with four switches of the multiplexer MUXU21. The other multiplexer MUXLD1 includes two switches SRB interposed between the ground potential VSS and the dummy data lines D110 and D111 and two switches SW interposed between the ground potential VSS and the dummy data line D110 and between the power source voltage VDD and the dummy data line D111. The former switches SRB cut off the connection between the dummy data lines D110 and D111 and the ground potential VSS in accordance with the column decode address DYM not shown. The latter switches SW connect the dummy data line D110 to the ground potential VSS and the dummy data line D111 to the power source voltage VDD, respectively, in accordance with the column decode address DYM not shown. The multiplexers MUXUD1 and MUXLD1 having such a construction can generate currents in the dummy data lines in mutually opposite directions in the same way as the multiplexers MUXUD and MUXLD shown in FIG. 1 and can initialize the dummy cell array DCA11. The switches SRW, SRB and SW are typically represented by symbols in the drawing but actually comprise NOMS transistors, for example, and the wiring state is controlled in accordance with the existence/absence of the current path between their sources and drains.

The write circuit WCU10 drives the common data line DL in accordance with the inputted column select signal WYSL and the write data line WIB. The write circuit WCL10 drives the write common node WCOMO in accordance with the inputted column select signal WYSL and the write data line WIT. The write circuit WCU11 drives the common data line DR in accordance with the inputted column select signal WYSR and the write data line WIB. The write circuit WCL11 drives the write common node WCOM1 in accordance with the inputted column select signal WYSR and the write data line WIT. Here, either one of the column select signals WYSL and WYSR is activated in accordance with the position of the memory cell MC to which the memory information is written.

The read circuit RDC3 discriminates and amplifies the read signal occurring in the common data line DL and the common data line DLA disposed in parallel with the common data line DL and the signal occurring in the common data line DR and the common data line DRA disposed in parallel with the common data line DR, and outputs the read data to the data lines ROT and ROB.

Next, the operation of this memory block will be explained. To read the memory cell MC on the memory cell array MCA10, the multipliers MUXU20 and MUXL20 are activated to connect the selected data line D to the common data line DL. In consequence, the current flowing through the memory cell MC is outputted to the common data line DL. At the same time, the multiplexers MUXUD1 and MUXLD1 are activated, the dummy cell DC on the dummy cell array DCA11 is selected and the dummy data lines D110 and D11 are connected to the common data line DR, so that the current flowing through the dummy cell DC is outputted to the common data line DR. Next, to write the data to the memory cell MC on the memory cell array MCA10, the selected data line D, the common data line DL and the write common node WCOMO are connected, and the write circuits WCU10 and WCL10 are activated by using the write control signal WYSL. In consequence, a current is generated in the selected data line D in accordance with the memory information.

In contrast, to read the memory cell MC on the memory cell array MCA11, the multiplexers MUXU21 and MUXL21 are activated to connect the selected data line D to the common data line DR and to output the current flowing through the memory cell MC to the common data line DR. At the same time, the multiplexers MUXUD0 and MUXLD0 are activated to select the dummy cell DC on the dummy cell array DCA10, to connect the dummy data lines D100 and D101 to the common data line DL and to output the current flowing through the dummy cell DC to the column data line DL. To write the data to the memory cell MC on the memory cell array MCA11, the selected data line D, the common data line DR and the write common node WCOM1 are connected, and the write circuits WCU11 and WCL11 are activated by using the write control signal WYSR to generate a current in the selected data line D in a direction corresponding to the memory information.

According to the construction of the circuit blocks described above, the number of switches connected to the common data lines DL and DR can be made equal (here, 6). Each of the common data lines DL and DR is so arranged as to cross four data lines and two dummy data lines and the wiring length at this portion can be made equal. Therefore, the load capacitances and resistances of the common data lines DL and DR can be balanced, and the read operation can be made more stably than in Embodiment 2. Next, the construction of the read circuit and its operation and a method of generating the reference signal will be explained.

Figure 18:
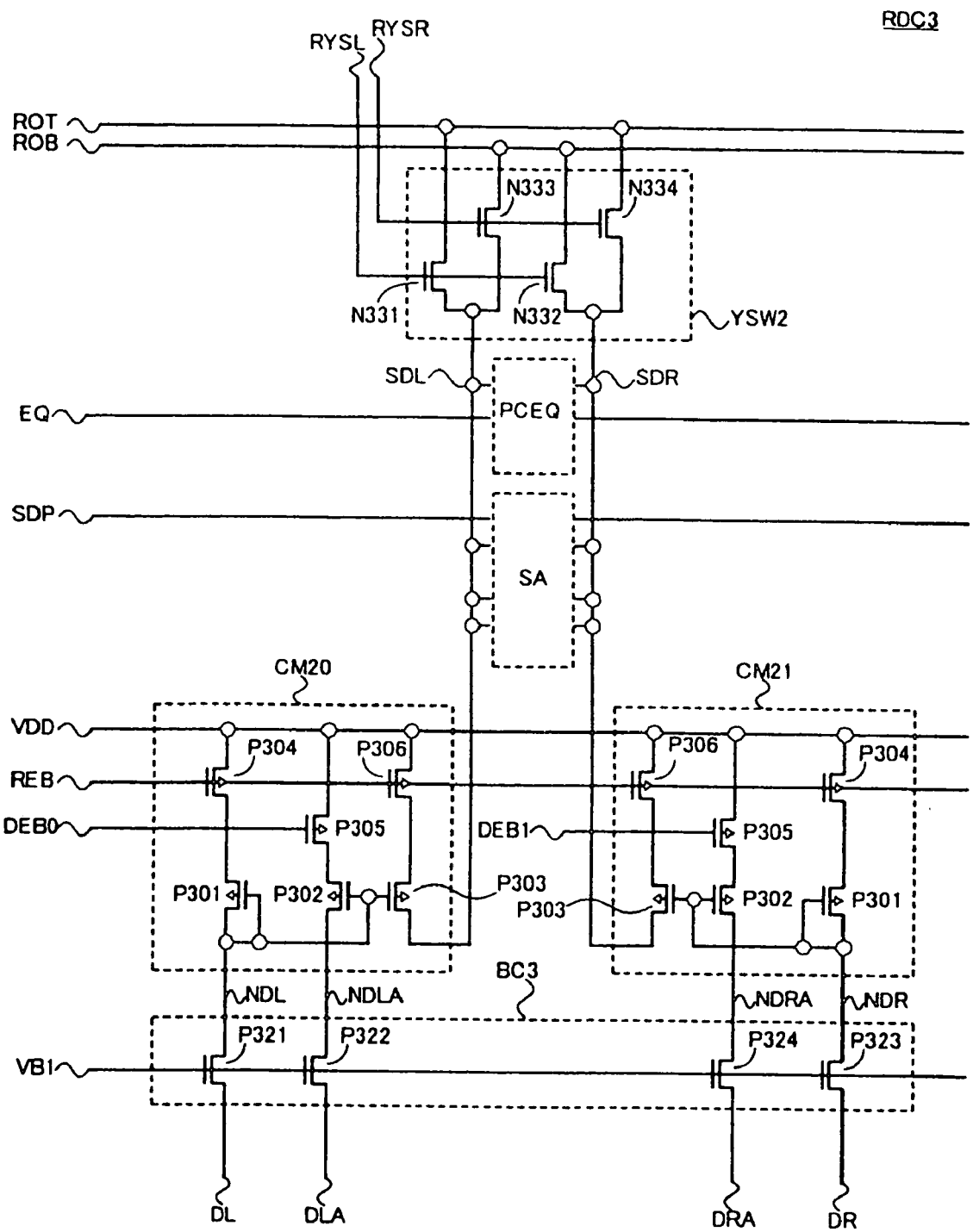
FIG. 18 shows a structural example of a read circuit according to Embodiment 3.

FIG. 18 shows a circuit construction of the read circuit RDC3. The read circuit RDC3 includes a column select circuit YSW2, a pre-charge circuit PCEQ, a sense amplifier SA, current mirror circuits CM20 and CM21 and a bias circuit BC3. The pre-charge enable signal EQ, the sense amplifier activation signal SDP and the read control signal REB among the array control bus ABS shown in FIG. 1 are applied to the read circuit RDC3. Further, the column select signals RYSL and RYSR are inputted. The dummy enable signals DEB0 and DEB1 are the signals that are generated by the control circuit, not shown, in accordance with the inputted external address, and are applied to the current mirror circuits CM20 and CM21, respectively. Next, the constructions and operations of the current mirror circuits CM20 and CM21 and the bias circuit BC3 will be explained, and then the column select signal YSW2 will be explained.

The current mirror circuits CM20 and CM21 have the same construction and include PMOS transistors P301, P302, P303, P304, P305 and P306. The transistors P301, P302 and P303 are formed to the same gate size, and the transistors P304, P305 and P306 are likewise formed to the same size. In one of the current mirror circuits CM20, the gates of the transistors P301, P302 and P303 and the drain of the transistor P301 are connected to the internal common data line NDL. The drain of the transistor P302 is connected to the internal common data line NDLA and the drain of the transistor P303 is connected to the sense data line SDL. The transistors P304, P305 and P206 are transistors for controlling the power source that receive the power source voltage VDD at their sources. These transistors are connected in series with the transistors P301, P302 and P303, respectively. The read control signal REB is inputted to the gates of the transistors P304 and P306 and the dummy enable signal DEB0 is inputted to the gate of the transistor P305. In the other current mirror circuit CM21, the gates of the transistors P301, P302 and P303 and the drain of the transistor P301 are connected to the internal common data line NDR. The drain of the transistor P302 is connected to the internal common data line NDRA and the drain of the transistor P303 is connected to the sense data line SDR. The dummy enable signal DEB1 is inputted to the gate of the transistor P305.

The bias circuit BC3 includes NMOS transistors N321, N322, N323 and N324. The source and drain of the transistor N321 are connected to the common data line DL and to the internal common data line NDL, respectively. The source and drain of the transistor N322 are connected to the common data line DLA and to the internal common data line NDLA, respectively. The source and drain of the transistor N323 are connected to the common data line DR and to the internal common data line NDR, respectively. The source and drain of the transistor N324 are connected to the common data line DRA and to the internal common data line NDR, respectively. Further, the bias voltage VB1 is inputted to the gates of the transistors P321, P322, P323 and P324. The transistors N321, N322, N323 and N324 are formed into the same gate size. The common data lines DL, DLA, DR and DRA and the internal common data lines NDL, NDLA, NDR and NDRA are formed so that they have the same wiring width and the same length with one another. In consequence, the impedance of the current mirror circuits CM20 and CM21 as viewed from the common data lines DL and DLA and from the common data lines DR and DRA becomes equal.

The operation of the current mirror circuits CM20 and CM21 having such a construction will be explained. In the current mirror circuit CM20, for example, the dummy enable signal DEB0 is held at the power source voltage VDD and the read control signal REB that is at the power source voltage VDD is driven to the ground potential VSS, supplying the power source voltage VDD to the transistors P301 and P303. In this way is formed a current mirror circuit having a mirror ratio of 1:1. In contrast, the dummy enable signal DEB0 and the read control signal that are at the power source voltage VDD are driven to the ground potential VSS to supply the power source voltage VDD to the transistors P301, P302 and P303. In this way is formed a current mirror circuit having a mirror ratio of 2:1. In the current mirror circuit CM21, too, the similar operation is possible by controlling the dummy enable signal DEB1. Therefore, the construction and the operation described above can control the mirror ratios of the current mirror circuits CM20 and CM21 to 1:1 or 2:1 in accordance with the dummy enable signal DEB0 and DEB1.

Next, the column select circuit YSW2 will be explained. The column select circuit YSW2 includes NMOS transistors N331, N332, N333 and N334. The column select signal RYSL is inputted to the gates of the transistors N331 and N332 and the column select signal RYSR is inputted to the gates of the transistors N333 and N334. The drain of the transistor N331 is connected to the read data line ROT and its source is connected to the sense data line SDL. The drain of the transistor N332 is connected to the read data line ROB and its source is connected to the sense data line DR. The drain of the transistor N333 is connected to the read data line ROB and its source is connected to the sense data line SDL. The drain of the transistor N334 is connected to the read data line ROT and its source is connected to the sense data line SDR. Therefore, the sense data lines SDL and SDR can be connected to the read data lines ROT and ROB when the column select signal RYSR is held at the ground potential VSS and the column select signal RYSL that is at the ground potential VSS is driven to the boosted potential VDH to render the transistors N331 and N332 conductive. The sense data lines SDL and SDR can be connected to the read data lines ROB and ROT when the column select signal RYSL is held at the ground potential VSS and the column select signal RYSR that is at the ground potential VSS is driven to the boosted voltage VDH to render the transistors N333 and N334.

Here, when the memory cell MC on the memory cell array MCA10 is read out in this embodiment, the sense data line SDL is charged by a current having the same value as the current flowing through the selected memory cell MC. When the memory cell MC on the memory cell array MCA10 is read out, on the contrary, the sense data line SDR is charged by a current having the same value as the current flowing through the selected memory cell MC. Therefore, polarity of the sense data lines SDL and SDR to the read data lines ROT and ROB is different depending on the position of the memory cell MC read out. However, when the sense data lines SDL and SDR are connected to the read data lines ROT and ROB in accordance with the polarity by using the column select circuit YSW2 described above, the polarity of the sense data lines SDL and SDR can be brought into conformity with the polarity of the read data lines ROT and ROB, and the data read out can be outputted correctly.

The overall construction of the read circuit RCD3 having such a construction and a method of generating the reference signal will be explained. The explanation will be given on the case where the memory cell MC in the memory cell array MCA10 shown in FIG. 17 is selected, by way of example. First, the dummy enable signal DEB0 is held at the power source potential VDD in accordance with the selected memory cell array MCA10 to form a current mirror circuit CM20 having a mirror ratio of 1:1. The dummy enable signal DEB1 and the read control signal REB that are at the power source voltage VDD are driven to the ground potential VSS, respectively, and a current mirror circuit CM21 having a mirror ratio of 2:1 is formed. Therefore, one of the sense data lines SDL is charged by a current having the same value as the current flowing through the memory cell MC outputted to the common data line DL. The other sense data line SDR is charged by a current that is a half of the current flowing through the dummy cell DC outputted to the common data lines DR and DRA. The operations described above generate the positive and negative read signals expressed by equations (4) and (6) in Embodiment 1, and the sense amplifier SA can discriminate and amplify the memory information. Further, the column select signal RYSL at the ground potential VSS is driven to the boosted potential VDH to render the transistors N331 and N332 conductive. In this way, the sense data lines SDL is connected to the read data line ROT and the sense data line SDR is connected to the read data line ROB, so that the data read out can be outputted.

The effects of this embodiment will be summarized as follows. Since the number of switches connected to the common data lines DL and DR is aligned, the load capacitances and the resistances of the common data lines DL and DR at the portions formed in parallel with the word line pair can be balanced, and the read operation can be conducted more stably. Here, when the mirror ratio is controlled in accordance with the position of the selected memory cell MC by using the current mirror circuits CM20 and CM21 shown in FIG. 18, the desired read signal and reference signal can be generated in the sense data lines SDL and SDR. When the sense data lines SDL and SDR are connected to the read data lines ROT and ROB in accordance with the polarity of the sense data lines by using the column select circuit YSW2 shown in FIG. 18, the polarity of the sense data lines SDL and SDR can be brought into conformity with that of the read data lines ROT and ROB, and the data read out can be outputted correctly.

The memory cell arrays MCA10 and MCA11 having the 8×4 bit construction and the dummy cell arrays DCA10 and DCA11 having the 8×1 bit construction have been explained so far by way of example. However, the array construction is not particularly limited to these constructions. For example, a memory cell array construction in which memory cells of hundreds of bits are disposed for one set of word line pair and for each data line may be employed in Embodiment 3 in the same way as in Embodiments 1 and 2, and the occupation ratio of the memory cell arrays to the entire chip can be improved.

Embodiment 4

Figure 19:
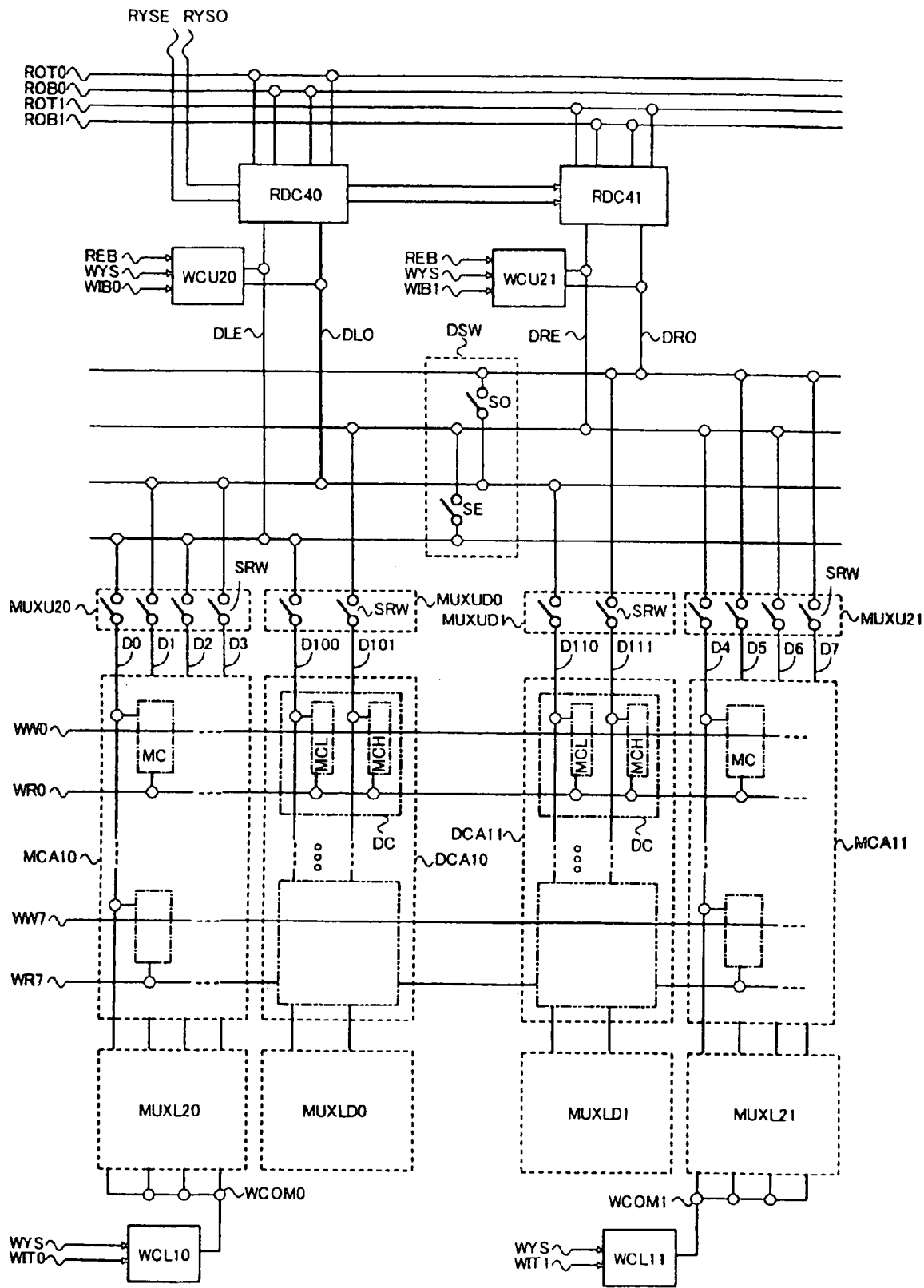
FIG. 19 shows a structural example of a memory block using memory cells each composed of one MTJ device and one transistor according to Embodiment 4.

In this embodiment, still another structural example of the memory block and its operation will be explained. FIG. 19 is a block diagram showing principal portions of the memory block. The memory block includes read circuits RDC40 and RDC41, write circuits WCU20, WCU21, WCL21, WCL10 and WCL 11, multiplexers MUXU20, MUXL20, MUXU21, MUXL21, MUXUD0, MUXLD0, MUXUD1 and MUXLD1, memory cell arrays MCA10 and MCA11, dummy cell arrays DCA10 and DCA11 and a common data line control circuit DSW. In FIG. 19, too, the word driver array WDA, the column decode address DYM, the row decode address DXB and the array control bus ABS shown in FIG. 1 are omitted for simplifying the illustration in the same way as in FIGS. 14 and 17. The features of this embodiment are as follows. First, four common data lines DLE, DLO, DRE and DRO are formed, and the switches SRW in the multiplexers MUXU20, MUXU21, MUXUDO and MUXUD1 are connected regularly to the respective common data lines so as to make up the number of switches SW connected to the respective common data lines. Second, the common data line is connected in accordance with the dummy cell DC to be activated by using the common data line control circuit DSW. Hereinafter, the differences from FIG. 17 will be explained.

First, the common data lines DLE, DLO, DRE and DRO are formed in such a fashion that they are parallel to the word line pair and have mutually the same wiring length and the same wiring width. The switches SRW connected to the even-numbered data lines D (here, the data lines D0 and D2) in the multiplexer MUXU20 and the switches SRW connected to the dummy data line D100 in the multiplexer MUXUD0 are connected to the common data line DLE. Next, the switches SRW connected to the odd-numbered data lines D (here, the data lines D1 and D3) in the multiplexer MUXU20 and the switches SRW connected to the dummy data line D101 in the multiplexer MUXUD0 are then connected to the common data line DL0. The switches SRW connected to the even-numbered data lines D (here, the data lines D4 and D6) in the multiplexer MUXU21 and the switches SRW connected to the dummy data line D110 in the multiplexer MUXUD1 are connected to the common data line DRE. Further, the switches SRW connected to the odd-numbered data lines D (here, the data lines D5 and D7) in the multiplexer MUXU21 and the switches SRW connected to the dummy data line D111 in the multiplexer MUXUD1 are connected to the common data line DR0. According to this construction, the number of switches SRW per common data line is equal (here, 3).

The common data line control circuit DSW includes two switches SE and SO. One of the switches SE is interposed between the common data lines DLE and DRE and the other switch SO is interposed between the common data lines DLO and DRO. To activate the dummy cell array DCA10, the switch SE is turned ON to connect the common data lines DLE and DRE and to connect two memory cells MCL and MCH constituting the dummy cell DC in parallel with each other. To activate the dummy cell array DCA11, the switch SO is turned ON to connect the common data lines DLO and DRO and to connect two memory cells MCL and MCH constituting the dummy cell DC in parallel with each other.

The read circuit RDC40 selects the memory cell MC on the memory cell array MCA10 and detects and amplifies the read signal occurring in the common data lines DLE and DLO. Further, the read circuit RDC40 outputs the data read out to the read data lines ROT0 and ROB0 in accordance with the column select signals RYSE and RYSO. In contrast, the read circuit RDC41 selects the memory cell MC on the memory cell array MCA 11 and detects and amplifies the read signal occurring in the common data lines DRE and DRO. Further, the read circuit RDC41 outputs the data read out to the read data lines ROT1 and ROB1 in accordance with the column select signals RYSE and RYSO.

The write circuit WCU20 drives the common data lines DLE and DLO in accordance with the inputted read control signal REB, the column select signal WYS and the write data line WIB0. The write circuit WCL10 drives the common node WCOMO in accordance with the inputted column select signal WYS and the write data line WIT0. The write circuit WCU21 drives the common data lines DRE and DRO in accordance with the inputted read control signal REB, the column select signal WYS and the write data line WIB1. The write circuit WCL11 drives the write common node WCOM1 in accordance with the inputted column select signal WYS and the write data line WIT1.

Next, the overall operation of this memory block will be explained. The explanation will be given first on the read operation of the memory cell MC on the even-numbered data lines in the memory cell arrays MCA10 and MCA11 as the first example of the read operation. First, the switch SO in the common data line control circuit DSW is turned ON and the common data lines DLO and DRO are connected. Next, the memory cells MC on the even-numbered data lines in the memory cell arrays MCA10 and MCA11 are selected, respectively, and the currents corresponding to the memory information are outputted to the read circuits RDC40 and RDC41 through the common data lines DLE and DRE, respectively. At the same time, the dummy cell DC in the dummy cell array DCA11 is activated and the current flowing through the dummy cell DC is outputted to the read circuits RDC40 and RDC41 through the common data lines DLO and DRO that are short-circuited, respectively.

Next, the read operation of the memory cells MC on the odd-numbered data lines in the memory cell arrays MCA10 and MCA11 will be explained as the second example of the read operation. First, the switch SE in the common data line control circuit DSW is turned ON and the common data lines DLE and DRE are connected. Next, the memory cells MC on the odd-numbered data lines in the memory cell arrays MCA10 and MCA11 are selected, respectively, and the currents corresponding to the memory information are outputted to the read circuit RDC40 and RDC41 through the common data lines DLO and DRO, respectively. At the same time, the dummy cell DC in the dummy cell array DCA10 is activated, and the current flowing through the dummy cell DC is outputted to the read circuits RDC40 and RDC41 through the common data lines DLE and DRE that are short-circuited, respectively.

Next, the write operation to the memory cells MC on the even-numbered data lines in the memory cell arrays MCA10 and MCA11 will be explained as the first example of the write operation. In this case, the even-numbered data line in the memory cell array MCA10 is connected to the common data line DLE and the write common node WCOMO, and the write circuits WCU20 and WCL10 generate a current in the direction corresponding to the memory information. At the same time, the even-numbered data line in the memory cell array MCA11 is connected to the common data line DRE and the write common node WCOM1, and the write circuits WCU21 and WCL11 generate a current in the direction corresponding to the memory information.

The write operation to the memory cell MCs on the odd-numbered data lines in the memory cell arrays MCA10 and MCA11 will be explained as the second example of the write operation. In this case, the odd-numbered data lines in the memory cell array MCA10 are connected to the common data line DLO and the write common node WCOMO, and the write circuits WCU20 and WCL10 generate a current in the direction corresponding to the memory information. At the same time, the odd-numbered data lines in the memory cell array MCA11 are connected to the common data line DRO and the write common node WCOM1, and the write circuits WCU21 and WCL11 generate a current in the direction corresponding to the memory information.

Finally, the initialization operation of the dummy cell arrays DCA10 and DCA11 is conducted in the following way. To initialize one of the dummy cell arrays DCA10, the switch SE in the common data line control circuit DSW is turned ON to short-circuit the common data lines DLE and DRE and to activate the multiplexers MUXUDO and MUX- LDO. In this way, currents in mutually opposite directions are generated in the dummy data lines D100 and D101 in the same way as in the multiplexers MUXUD and MUXLD shown in FIG. 1. To initialize the other dummy cell array DCA11, the switch SO in the common data line control circuit DSW is turned ON to short-circuit the common data lines DLO and DRO and to activate the multiplexers MUXUD1 and MUXLD1. In this way, currents in mutually opposite directions are generated in the dummy data lines D110 and D111 in the same way as in the multiplexers MUXUD1 and MUXLD1 shown in FIG. 1.

Figure 20:
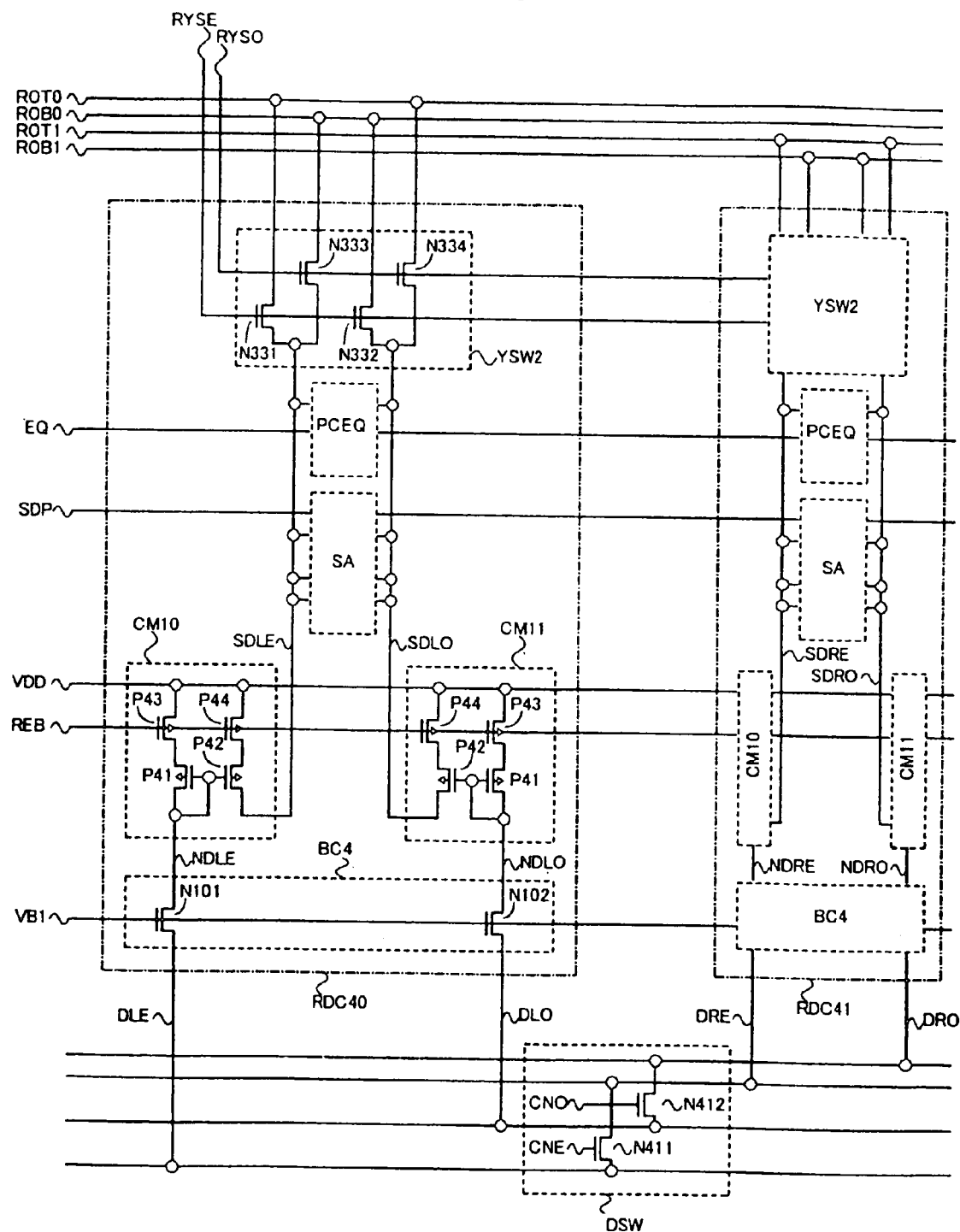
FIG. 20 shows a structural example of a read circuit according to Embodiment 4.

Next, the construction of the read circuits RDC40 and RDC41, their operation, and a method of generating the reference signal will be explained. FIG. 20 shows a structural example of two read circuits RDC40 and RDC41. Each read circuit includes a column select circuit YSW2, a pre-charge circuit PCEQ, a sense amplifier SA, current mirror circuits CM10 and CM11 and a bias circuit BC4. Each of the pre-charge enable signal EQ, the sense amplifier activation signal SDP and the read control signal REB, that are inputted, is the signal in the array control bus ABS. The features of the read circuits RDC40 and RDC41 in this embodiment are as follows. First, The current mirror circuits CM10 and CM11 have the same construction as the current mirror circuit CM having a mirror ratio of 1:1 that is shown in FIG. 1. Second, the bias circuit BC4 includes NMOS transistors N101 and N102 having the same gate size.

First, the read circuit RDC40 will be explained. The input terminal of one of the current mirror circuits CM10 is connected to the internal common data line NDLE and its output terminal is connected to the sense data line SDLE. The input terminal of the other current mirror circuit CM11 is connected to the internal common data line NDLO and its output terminal is connected to the sense data line SDLO. In the bias circuit BC4, the source and the drain of the transistor N101 are connected to the common data line DLE and to the internal common data line NDLE, respectively. The source and the drain of the transistor N102 are connected to the common data line DLO and to the internal common data line NDLO, respectively. Further, the common data lines DLE and DLO and the internal common data lines NDLE and NDLO are formed into the same wiring width and the same wiring length. According to this construction, impedances when the current mirror circuits CM10 and CM11 are viewed from the common data lines DLE and DLO become equal to each other.

The column select circuit YSW2 connects the sense data lines SDLE and SDLO to either one of the data lines ROTO and ROBO in accordance with the inputted column select signals RYSE and RYSO. When the memory cell MC on the even-numbered data line in the memory cell array MCA10 shown in FIG. 19 is read out in this embodiment, the sense data line SDLE becomes positive in polarity. When the memory cell MC on the odd-numbered data line is read out, the sense data line SDLO becomes positive in polarity. Here, the column select circuit YSW2 is used to connect the sense data lines SDLE and SDLO to the read data lines ROTO and ROBO in accordance with their polarity.

Next, the read circuit RDC41 will be explained. The input terminal of one of the current mirror circuits CM10 is connected to the internal common data line NDRE and the output terminal is connected to the sense data line SDRE. The input terminal of the other current mirror circuit CM11 is connected to the internal common data line NDRO and its output terminal is connected to the sense data line SDRO. In the bias circuit BC4, the source and the drain of the transistor N101 are connected to the common data line DRE and to the internal common data line NDRE, respectively. The source and the drain of the transistor N102 are connected to the common data line DRO and to the internal common data line NDRO, respectively. Further, the common data lines DRE and DRO and the internal common data lines NDRE and NDRO are formed into the same wiring width and the same wiring length. According to this construction, the impedances when the current mirror circuits CM10 and CM11 are viewed from the common data lines DRE and DRO can be made equal to each other.

The column select circuit YSW2 connects the sense data lines SDRE and SDRO to either of the read data lines ROT1 and ROB1 in accordance with the column select signals RYSE and RYSO. When the memory cell MC on the even-numbered data line in the memory cell array MCA11 shown in FIG. 19 is read out in this embodiment, the sense data line SDRE becomes positive in polarity. When the memory cell MC on the odd-numbered data line is read out, the sense data line SDRO becomes positive in polarity. Here, the column select circuit YSW2 is used to connect the sense data lines SDRE and SDRO to the read data lines ROT1 and ROB1 in accordance with their polarity.

FIG. 20 shows still another structural example of the common data line control circuit DSW. An NMOS transistor N411 corresponds to the switch SE shown in FIG. 19. The source and the drain of this transistor are connected to the common data lines DLE and DRE, respectively, and the connection control signal CNE is inputted to the gate. An NMOS transistor N412 corresponds to the switch SO shown in FIG. 19. The source and the drain of this transistor are connected to the common data lines DLO and DRO, respectively, and the connection control signal CNO is inputted to the gate. Here, the connection control signals CNE and CNO are those signals which are generated by the control circuit, not shown, in accordance with the inputted external address.

The overall operations of the read circuits RDC40 and RDC41 and the common data line control circuit DSW and a method of generating the reference signal in the construction described above will be explained. Here, the explanation will be given hereby about the case where the memory cells MC on the even-numbered data lines in the memory cell arrays MCA10 and MCA11 shown in FIG. 19 are selected, by way of example. In this case, the dummy cell DC on the dummy cell array DCA11 is selected. In the data line control circuit, the connection control signal CNO that is at the ground potential VSS is driven to the power source voltage VDD to turn ON the transistor N412. In consequence, the common data lines DLO and DRO are connected and the common data lines DLO and DRO are short-circuited with the dummy data lines D110 and D111. Next, the read control signal REB that is at the power source voltage VDD is driven to the ground potential VSS and the current mirror circuit CM10 having a mirror ratio of 1:1 in the read circuit RDC40 is activated. A current corresponding to the memory information in the selected memory cell MC on the memory cell array MCA10 charges the sense data line SDLE. Similarly, the current mirror circuit CM10 having a mirror ratio of 1:1 in the read circuit RDC41 is activated, and a current corresponding to the memory information in the selected memory cell MC on the memory cell array MCA11 charges the sense data line SDRE. At this time, the current mirror circuits CM11 having a mirror ratio of 1:1 are activated in the read circuits RDC40 and RDC41, respectively. Here, the impedances when the corresponding mirror circuits CM11 are viewed from the common data lines DLO and DRO are equal, and the common data lines DLO and DRO and the dummy data lines D110 and D11 are short-circuited and attain the same potential. Therefore, the current that is a half of the current flowing through the dummy cell DC flows through the respective current mirror circuits CM11. The sense data lines SDLO and SDRO are charged by a mean current of the currents flowing through the dummy cells DC, and the positive and negative read signals expressed by equations (4) and (6) in Embodiment 1 are generated in the sense data lines SDLE and SDLO and SDRE and SDRO. The sense amplifier SA discriminates and amplifies the respective memory information. Further, the column select signal EYSE at the ground potential VSS is driven to the boosted potential VDH to render the transistors N331 and N332 in the column select circuit YSW2 of the read circuits RDC40 and RDC41 conductive. In this way, the sense data line SDLE is connected to the read data line ROT0, the sense data line SDLO is connected to the read data line ROB0, the sense data line SDRE is connected to the read data line ROT1, and the sense data line SDRO is connected to the read data line ROB1. The data so read out is outputted.

Figure 21:
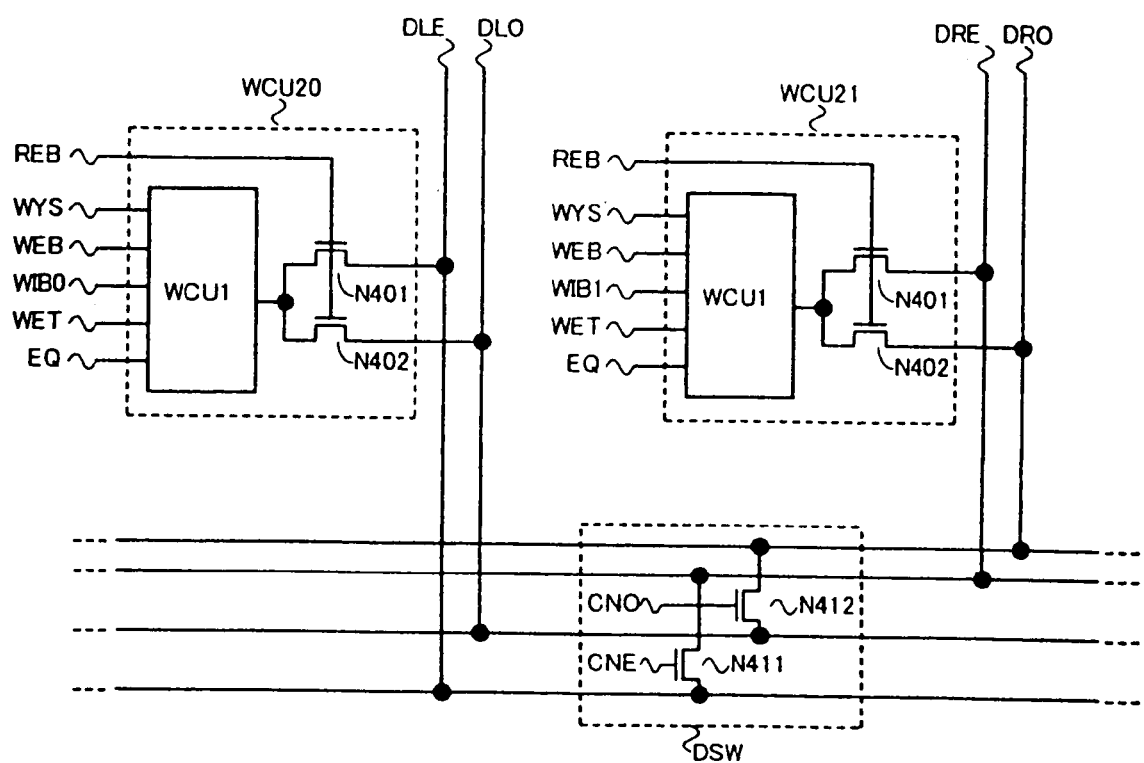
FIG. 21 shows a structural example of a write circuit according to Embodiment 4.

Next, the write circuits WCU20 and WCU21 will be explained. FIG. 21 shows the write circuits WCU20 and WCU21 and the common data line control circuit DSW. The common data line control circuit DSW has the same construction as the one shown in FIG. 20. Each of the write circuits WCU 20 and WCU21 includes the write circuit WCU1 shown in FIG. 1 and NMOS transistors N401 and N402. In one of the write circuits WCU20, the sources of the transistors N401 and N402 are connected to the output terminal of the write circuit WCU1 and the drains are connected to the common data lines DLE and DLO, respectively. The read control signal REB is applied to each gate. In the other write circuit WCU21, the drains of the transistors N401 and N402 are connected to the common data lines DRE and DRO, respectively.

When the read operation is made in such a construction, the read control signal REB that is at the power source voltage VDD is driven to the ground potential VSS to turn OFF the transistors N401 and N402 and to cut off the common data lines DLE, DLO and DRO from the output terminals of the corresponding write circuit WCU1. In the standby state and in the write operation, the read control signal REB is held at the power source voltage VDD and the transistors N401 and N402 are rendered conductive to drive the common data lines DLE, DRE and DRO.

Owing to the construction and operations described above, the corresponding write circuit WCU21 is cut off from the common data lines DLE, DLO, DRE and DRO, and the connection of the common data lines DLE, DLO, DRE and DRO can be controlled by using the common data line control circuit DSW.

This embodiment will be summarized. First, four common data lines DLE, DLO, DRE and DRO that are formed into the same wiring length and the same wiring width are arranged in parallel with the word line pair. The data lines in the memory cell arrays MCA10 and MCA11 and the data lines in the dummy cell arrays DCA10 and DCA11 are divided into the even-numbered group and the odd-numbered group, and the switches SR in the corresponding multiplexers MUXU20, MUXU21, MUXUD0 and MUXUD1 are regularly connected to the respective common data lines. According to this construction, the numbers of the switches connected to the respective common data lines can be made the equal number (here, 3). Further, the number of switches SRW connected to the common data lines DLE, DLO, DRE and DRO can be reduced in comparison with Embodiment 3. Second, in the case of the read operation, one data line or dummy data line is connected to each common data line. Therefore, the impedances when the corresponding common data line is viewed from the activated memory cell MC and the two memory cells MCL and MCH constituting the dummy cell DC can be made equal to each other. Third, the current mirror circuits CM10 and CM11 in the read circuits RDC40 and RDC41 have a mirror ratio of 1:1, and the two current paths in the bias circuit BC4 are dealt with as the object. Consequently, the impedances when the corresponding current mirror circuits are viewed from the common data lines DLE, DLO, DRE and DRO can be equal to each other. In consequence, the load of each current path in the read operation is much more balanced than in Embodiment 3, and a stable read operation can be accomplished.

The explanation has so far been given on the memory cell arrays MCA10 and MCA11 having the 8×4 bit construction and the dummy cell arrays DCA10 and DCA11 having the 8×1 bit construction. However, the array construction is not particularly restrictive. For example, a memory cell array construction in which hundreds of memory cells are arranged for one set of word line pair and for each data line may be employed in the same way as in Embodiments 1, 2 and 3 and by so doing, the occupation area of the memory cell array to the entire chip can be improved.

Embodiment 5

The embodiments described so far represent the construction and the operation for arranging the dummy cells DC for each of a plurality of word line pairs and for generating the reference signal. When any defect occurs in the dummy cell in such a construction, the memory cells MC on the word line pair to which the defective dummy cell DC is connected cannot be read out, and the yield is likely to drop. To solve this problem, this embodiment introduces a redundancy circuit into the memory block of Embodiment 3 shown in FIG. 17.

Figure 22:
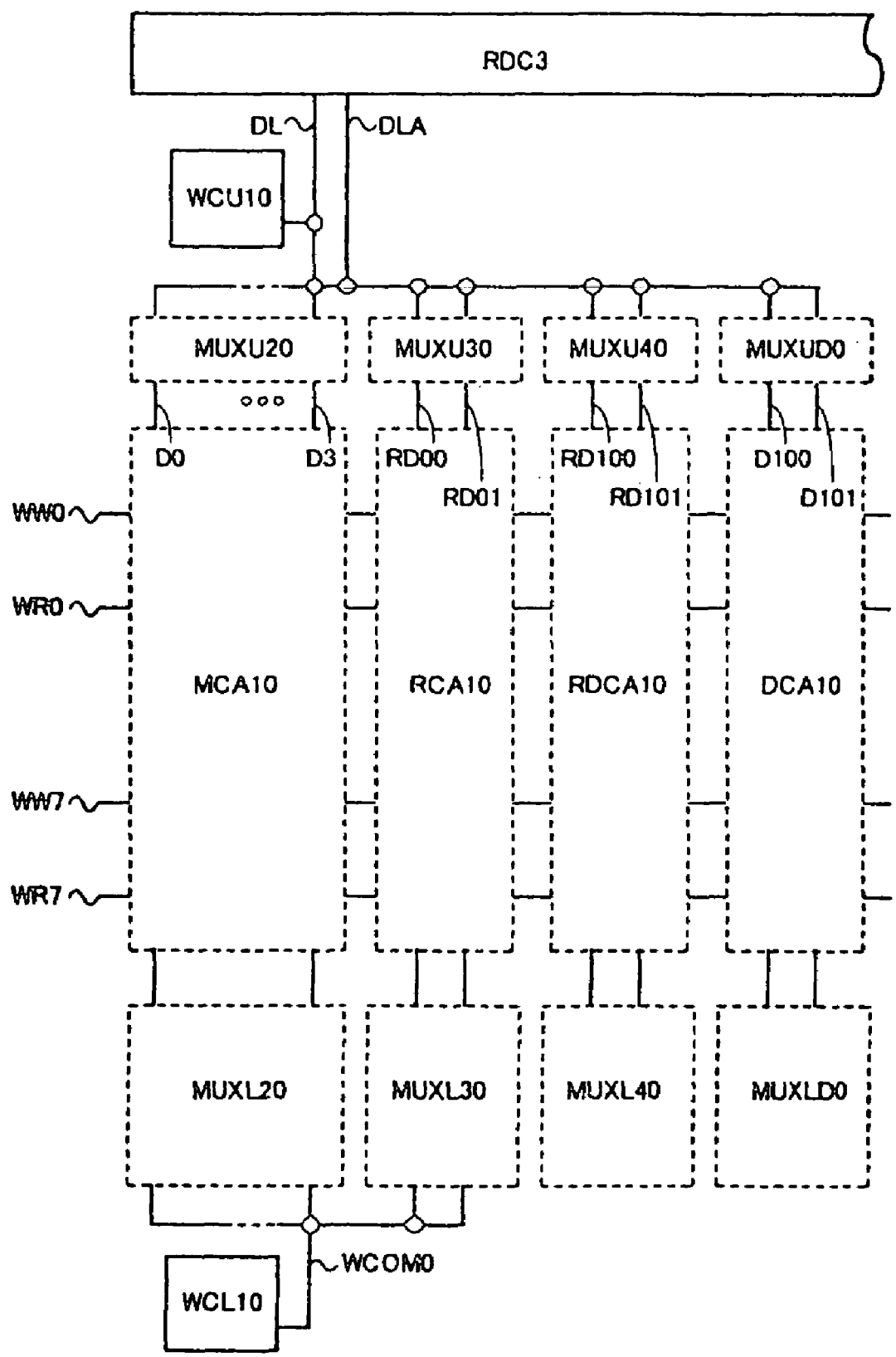
FIG. 22 shows a structural example (No. 1) of a memory block using memory cells each composed of one MTJ device and one transistor according to Embodiment 5.
Figure 23:
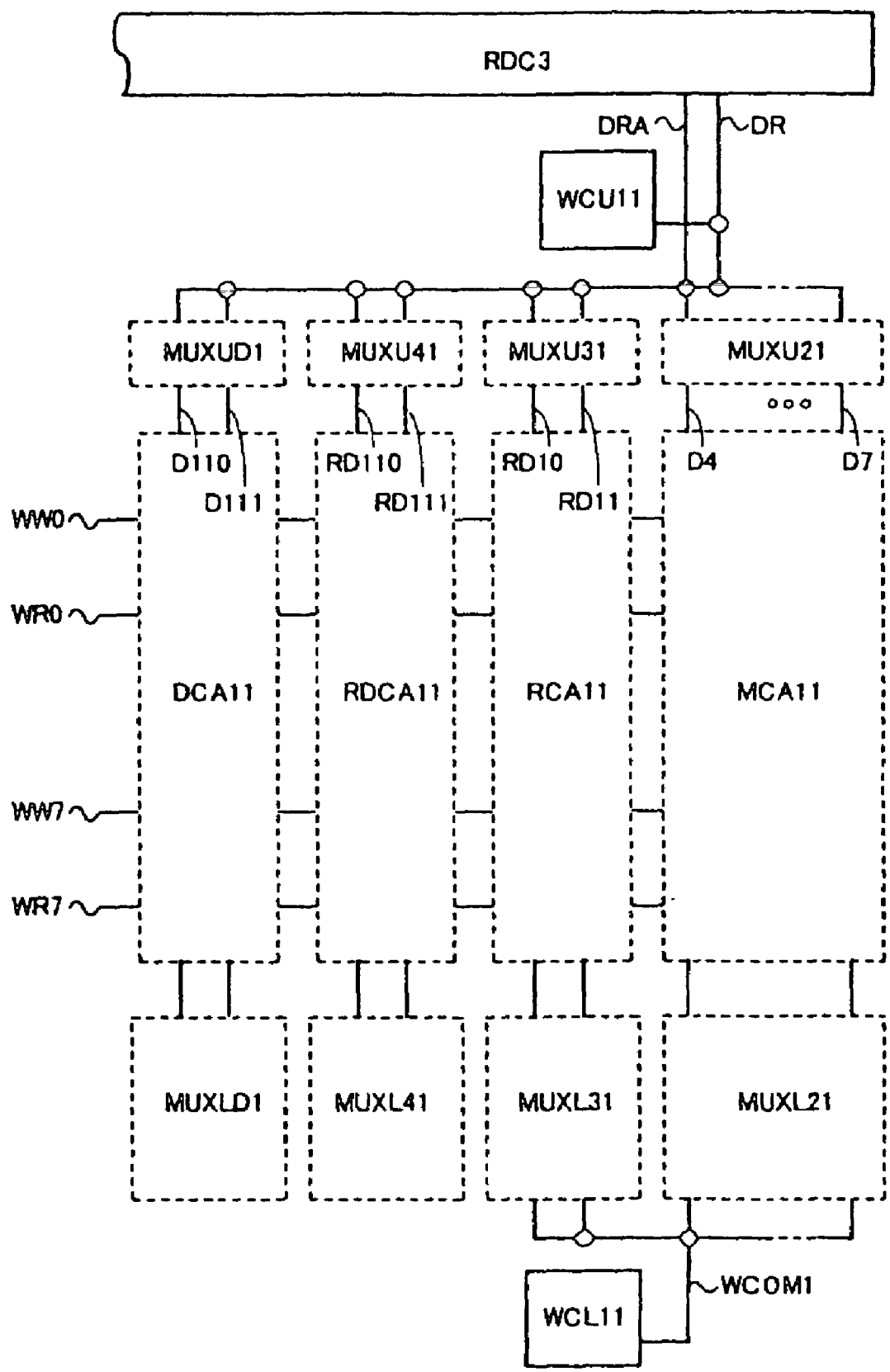
FIG. 23 shows a structural example (No. 2) of a memory block using memory cells each composed of one MTJ device and one transistor according to Embodiment 5.

FIGS. 22 and 23 are block diagrams that show principal portions of the memory block in this embodiment. Referring to FIG. 22, redundancy multiplexers RCA10 and RDCA10 are interposed between the memory cell array MCA10 and the dummy cell array DCA10. Multiplexers MUXU30 and MUXL30 are arranged at both ends of the redundancy cell array RCA10 while multiplexers MUXU40 and MUXL40 are arranged at both ends of the redundancy array RDCA10. In FIG. 23, redundancy cell arrays RCA11 and RDCA11 are interposed between the memory cell array MCA11 and the dummy cell array DCA11. Multiplexers MUXU31 and MUXL31 are arranged at both ends of the redundancy cell array RCA11 while multiplexers MUXU41 and MUXL41 are arranged at both ends of the redundancy array RDCA11. The features of this embodiment having such a construction are as follows. First, the redundancy memory cells on the redundancy cell arrays RCA10 and RCA11 replace the defective memory cells occurring on the memory cell arrays MCA10 and MCA11. Second, the redundancy memory cells on the redundancy cell arrays RDCA10 and RDCA11 replace the defective memory cells occurring on the dummy cell arrays DCA10 and DCA11. Hereinafter, the redundancy circuit for the memory cell array MCA10 and for the dummy cell array DCA10 will be explained for simplification.

Figure 24:
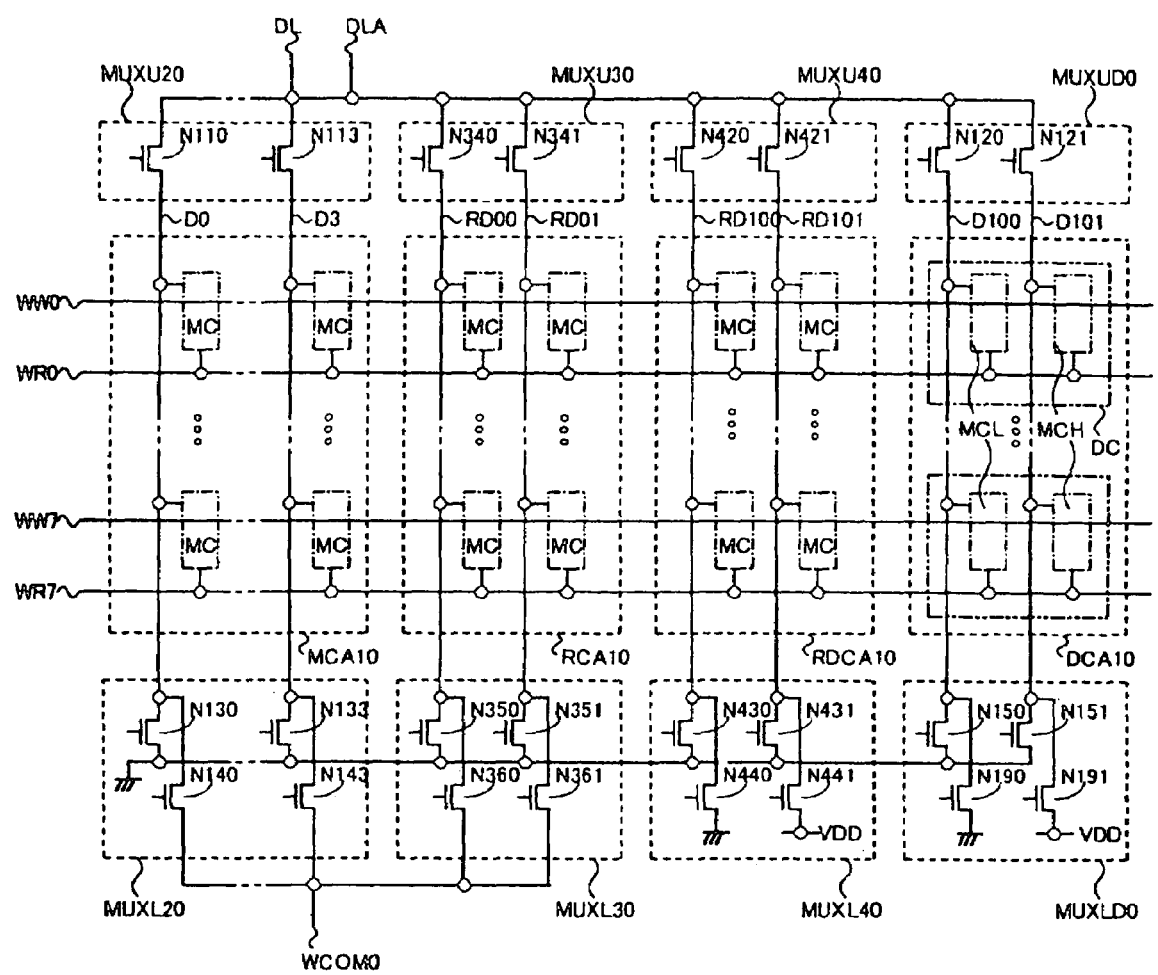
FIG. 24 shows a structural example of a redundancy cell array and a multiplexer according to Embodiment 5.

FIG. 24 shows a circuit structural example of the memory cell array MCA10, the dummy cell array DCA10, the redundancy arrays RCA10 and RDCA10 and the multiplexers MUXU20, MUXL20, MUXU30, MUXL30, MUXU40, MUXL40, MUXUD0 and MUXLD0. FIG. 39 shows a column address signal YMX inputted to each multiplexer MUX. Hereinafter, each circuit construction will be explained with reference to FIGS. 24 and 39. The memory cell array MCA10 has the 8×4 bit construction in the same way as in FIG. 17. The memory cells MC are arranged at the points of intersection between 8 sets of word line pairs and the data lines DJ (j=0, . . . , 3). The dummy cell array DCA10 has an 8×1 bit construction, and the dummy cells DC are arranged at the points of intersection between 8 sets of word line pairs and the dummy data lines D100 and D101.

In contrast, the redundancy array RCA is constituted by 8×2 bit memory cells MC. These memory cells MC are arranged at the point of intersections between 8 sets of word line pairs and the redundancy data lines RD00 and RD01. The redundancy cell array RDCA10 is constituted by 8×2 bit memory cells MC and these memory cells MC are arranged at the points of intersection between 8 sets of word line pairs and the redundancy dummy data lines RD100 and RD101.

The multiplexer MUXU20 includes four NMOS transistors N11j (j=0, . . . , 3). The data line Dj (j=0, . . . , 3) is connected to the source of the transistor N11j, the common data line DL is connected to its drain and the column address signal YMTj (j=0, . . . , 3) shown in FIG. 39 is connected to its gate. The multiplexer MUXL20 includes four NMOS transistors N13j (j=0, . . . , 3). The ground potential VSS is connected to the source of the transistor N13j, the data line Dj (j=0, . . . , 3) is connected to its drain and the column address signal YMBj (j=0, . . . , 3) shown in FIG. 39 is connected to its gate. The common node WCOMO is connected to the source of the transistor N14j, the data line Dj (j=0, . . . , 3) is connected to its drain and the column address signal YMWj (j=0, . . . , 3) shown in FIG. 39 is connected to its gate.

The multiplexer MUXUD0 includes two NMOS 10 transistors N120 and N121. The sources of these transistors N120 and N121 are connected to the dummy data lines D100 and D101, respectively. The drains are connected to the common data line DL and the gates are connected to the column address signals YMDT00 and YMDT01, respectively. The multiplexer MUXLD0 includes four NMOS transistors N150, N151, N190 and N191. The ground potential VSS is connected to the sources of the NMOS transistors N150 and N151. The dummy data lines D100 and D101 are connected to their drains and the column address signals YMDB00 and YMDB01 shown in FIG. 39 are connected to their gates, respectively. The ground potential VSS is connected to the source of the transistor N190, the dummy data line D100 is connected to its drain and the column address signal YMDW00 shown in FIG. 39 is connected to its gate. Further, the power source voltage VDD is connected to the source of the transistor N191, the dummy data line D101 is connected to its drain and the column address signal YMDW01 shown in FIG. 39 is connected to its gate.

The multiplexer MUXU30 includes two NMOS transistors N340 and N341. The sources of these transistors N340 and N341 are connected to the redundancy data lines RD00 and RD01, respectively. The drains are connected to the column data line DL, and the gates are connected to the redundancy column address signals RYMT00 and RYMT01 shown in FIG. 39, respectively. The multiplexer MUXL30 includes four NMOS transistors N350, N351, N360 and N361. The sources of these transistors N350 and N351 are connected to the ground potential VSS and the drains are connected to the redundancy data lines RD00 and RD01. The gates are connected to the redundancy column address signals RYMB00 and RYMB01 shown in FIG. 39, respectively. The sources of the transistors N360 and N361 are connected to the common node WCOMO. The drains are connected to the redundancy data lines RD00 and RD01, respectively. The gates are connected to the redundancy column address signals RYMW00 and RYMW01 shown in FIG. 39, respectively. The redundancy column address signals RYMT00 and RYMT01, RYMB00 and RYMB01, and RYMW00 and RYMW01 correspond to the column address signals YMTj, TMBj and YMWj, respectively, and are driven in accordance with the redundancy information stored in the normal address memory circuit that will be later illustrated.

The multiplexer MUXU40 includes two NMOS transistors N420 and N421. The sources of these transistors N420 and N421 are connected to the redundancy dummy data lines RD100 and RD101. The drains are connected to the common data line DL. The gates are connected to the redundancy column address signals RYMDT00 and RYMDT01, respectively. The multiplexer MUXL40 includes four NMOS transistors N430, N431, N440 and N441. The sources of the transistors N430 and N431 are connected to the ground potential VSS. The drains are connected to the redundancy dummy data lines RD100 and RD101. The gates are connected to the redundancy column address signals RYMDB00 and RYMDB01, respectively. The source of the transistor N440 is connected to the ground potential VSS. The drain is connected to the redundancy dummy data line RD100 and the gate is connected to the redundancy column address signal RYMDW00 shown in FIG. 39. Further, the source of the transistor N441 is connected to the power source voltage VDD, the drain is connected to the redundancy dummy data line RD101 and the gate is connected to the redundancy column address signal RYMDW01 shown in FIG. 39. Here, the redundancy column address signals RYMDT00, RYMDT01, RYMDB00, RYMDB01, RYMDW00 and RYMDW01 correspond to the column address signals YMDT00, YMDT01, YMDB00, YMDB01, YMDW00 and YMDW01, respectively, and are driven in accordance with the redundancy information stored in the dummy address memory circuit that will be later illustrated. As shown in FIG. 39, the column address signals inputted to the multiplexers MUXUD0 and MUXLD0 are so separated as to correspond to the dummy data lines D100 and D101. Further, the redundancy column address signals inputted to the multiplexers MUXU40 and MUXL40 are so separated as to correspond to the redundancy dummy data lines D100 and D101. In this way, the dummy data line is replaced one by one.

Figure 25:
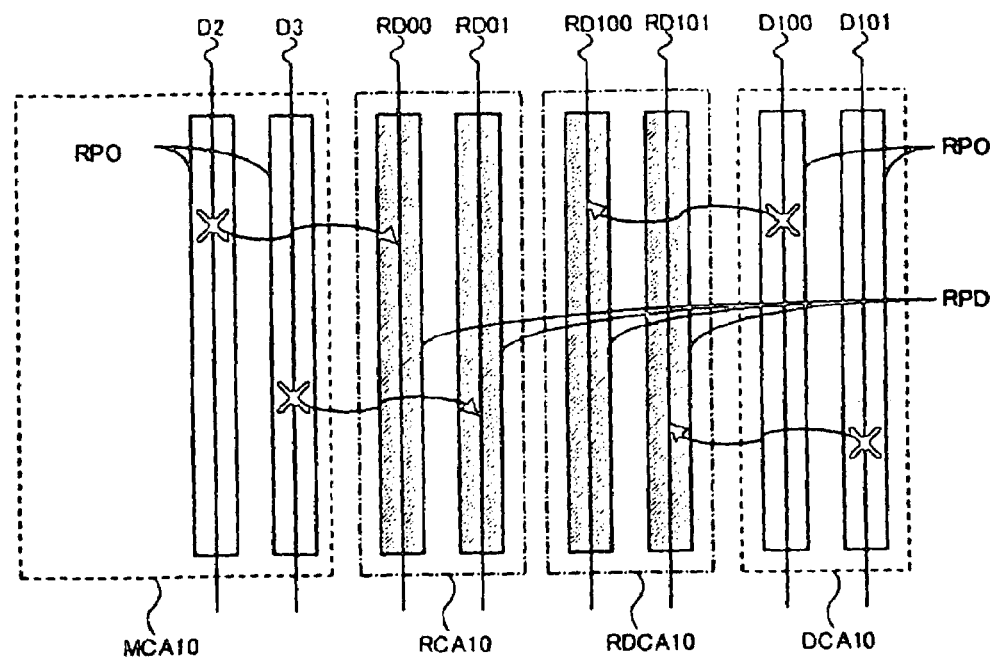
FIG. 25 is a conceptual view (No. 1) showing a substitution example of a column redundancy system according to Embodiment 5.

FIG. 25 is a conceptual view showing the example where the redundancy data lines RD00 and RD01 in the redundancy cell array RCA10 replace the data lines D2 and D3 and the redundancy dummy data lines RD100 and RD101 in the redundancy cell array RDCA10 replace the dummy data lines D100 and D101 when defects occur in the memory cells represented by crosses X on the data lines D2 and D3 in the memory cell array MCA10 and on the dummy data lines D100 and D101 in the dummy cell array DCA10. When the data is written to the memory cells MC on one of the redundancy data lines RD00 and RD01, the data is written by selecting one by one the redundancy data lines while the multiplexers MUXU30 and MUXL30 shown in FIG. 24 are controlled. When the memory cells MC on the other of the redundancy dummy data lines RD100 and RD101 are initialized, the multiplexers MUXU40 and MUXL40 shown in FIG. 24 are controlled respectively so as to form a current path extending from the redundancy dummy data line RD101 through the common data line DL and the redundancy dummy data lines RD100 between the power source voltage VDD and the ground potential VSS. The complementary memory information is written in the same way as in the dummy cell DC to form the dummy cell.

Figure 26:
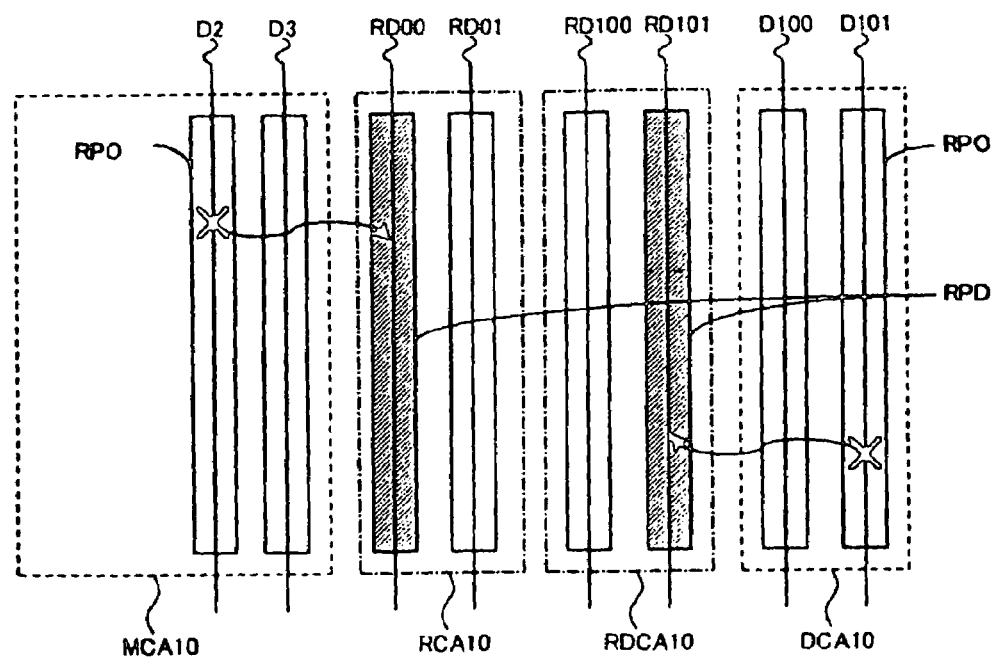
FIG. 26 is a conceptual view (No. 2) showing another substitution example of the column redundancy system according to Embodiment 5.

As another example, FIG. 26 is a conceptual view showing the example where the redundancy data lines RD00 in the redundancy cell array RCA10 replaces the data line D2 and the redundancy dummy data line RD101 in the redundancy cell array RDCA10 replace the dummy data line D101 when defects occur in memory cell represented by a cross X on the data line D2 in the memory cell array MCA10 and in the memory cell represented by a cross X on the dummy data line D101 in the dummy cell array DCA10. When the memory cells MC on the redundancy dummy data line RD101 are initialized, the multiplexers MUXUD0 and MUXLD0 and MUXU40 and MUXL40 shown in FIG. 24 are controlled so as to form a current path extending from the redundancy dummy data line RD101 through the common data line DL and the redundancy dummy data lines RD100 between the power source voltage VDD and the ground potential VSS. The complementary memory information is written into the memory cells on the dummy data line D100 and on the redundancy dummy data line RD101. Therefore, the dummy cells are formed while the memory cell MCL on the dummy data line D100 and the memory cell MC on the redundancy dummy data line RD101 form a pair.

Finally, this embodiment will be summarized. First, this embodiment provides the column redundancy system that replaces the dummy data line D100 to which a defective memory cell MCL is connected by the redundancy dummy data line RD100 or the dummy data line D101 to which a defective memory cell MCH is connected by the redundancy data line RD101 when any defect occurs in the memory cell MCL or MCH in the dummy cell DC. Consequently, the reference signal can be generated for the memory cells MC existing on the same word line pair as the defective dummy cell DC. Second, this embodiment provides the column redundancy system that replaces the data line D to which a defective memory cell MC is connected by the redundancy data line RD00 or RD01 when any defect occurs in the memory cell MC. These two column redundancy systems can accomplish a memory block having a higher yield than Embodiment 3.

The explanation given so far has dealt with the introduction of the redundancy cell arrays RCA10, RCA11, RDCA10 and RDCA11 having the 8×2 bit construction into the memory cell arrays MCA10 and MCA11 having the 8×4 bit construction and into the dummy cell arrays DCA10 and DCA11 having the 8×1 bit construction. However, the array construction is not restrictive. For example, it is possible to employ the memory cell array construction in which memory cells of hundreds of bits are arranged for one set of word line pair and for each data line. In this way, a large number of memory cells MC are allowed to share the read circuit RDC2 and the write circuits WCU10, WCL10, WCU11 and WCL11. Therefore, the occupation ratio of the memory cells to the entire chip can be improved while the addition of the chip area resulting from the redundancy cell array is effectively restricted.

When the column redundancy system according to this embodiment is applied to the memory cell block having the expanded array construction, the number of the redundancy data lines preferably corresponds to the number of occurrences of the detects in the memory cell array. In DRAM that has gained a wide application at present, for example, the proportion of the redundancy data lines to the data lines is about 1 to about 2%, and a similar proportion is preferably secured in MRAM, too. To achieve this object, the size of the memory cell array must be increased. When the method of generating the reference signal according to the present invention is used, however, the read operation at a high S/N ratio can be suitably accomplished.

The column redundancy system explained so far can be applied to the memory block shown in FIG. 19, too. For example, the redundancy cell array RCA10 and RDCA10 are arranged between the memory cell array MCA10 and the dummy cell array DCA10, and the corresponding switches SRW in the multiplexers are formed in such a fashion that the redundancy data line RD00 and the redundancy dummy data line RD100 can be connected to the common data line DLE, the redundancy data line RD01 can be connected to the common data line DL and the redundancy dummy data line RD101, to the common data line DRE. This construction accomplishes the column redundancy system that replaces the defects on the memory cell array MCA10 and on the dummy cell array DCA10 by the redundancy cell arrays RCA10 and RDCA10, and can accomplish a large capacity MRAM having a high yield and a high integration density.

Embodiment 6

Embodiment 5 represents the column redundancy system that forms the redundancy cell arrays RCA10 and RDCA10 corresponding to the memory cell array MCA10 and to the dummy cell array DCA10, respectively. Though this system has high redundancy capacity, the chip area increases because the proportions of the redundancy arrays RCA10 and RDCA10 to the memory cell array MCA10 and to the dummy cell array DCA10 are great. To solve this problem, this embodiment represents a redundancy circuit that replaces both of the defective memory cell MC occurring on the memory cell array and the defective memory cells MCL and MCH occurring on the dummy cells DC in the dummy cell array by the same redundancy cell array.

Figure 27:
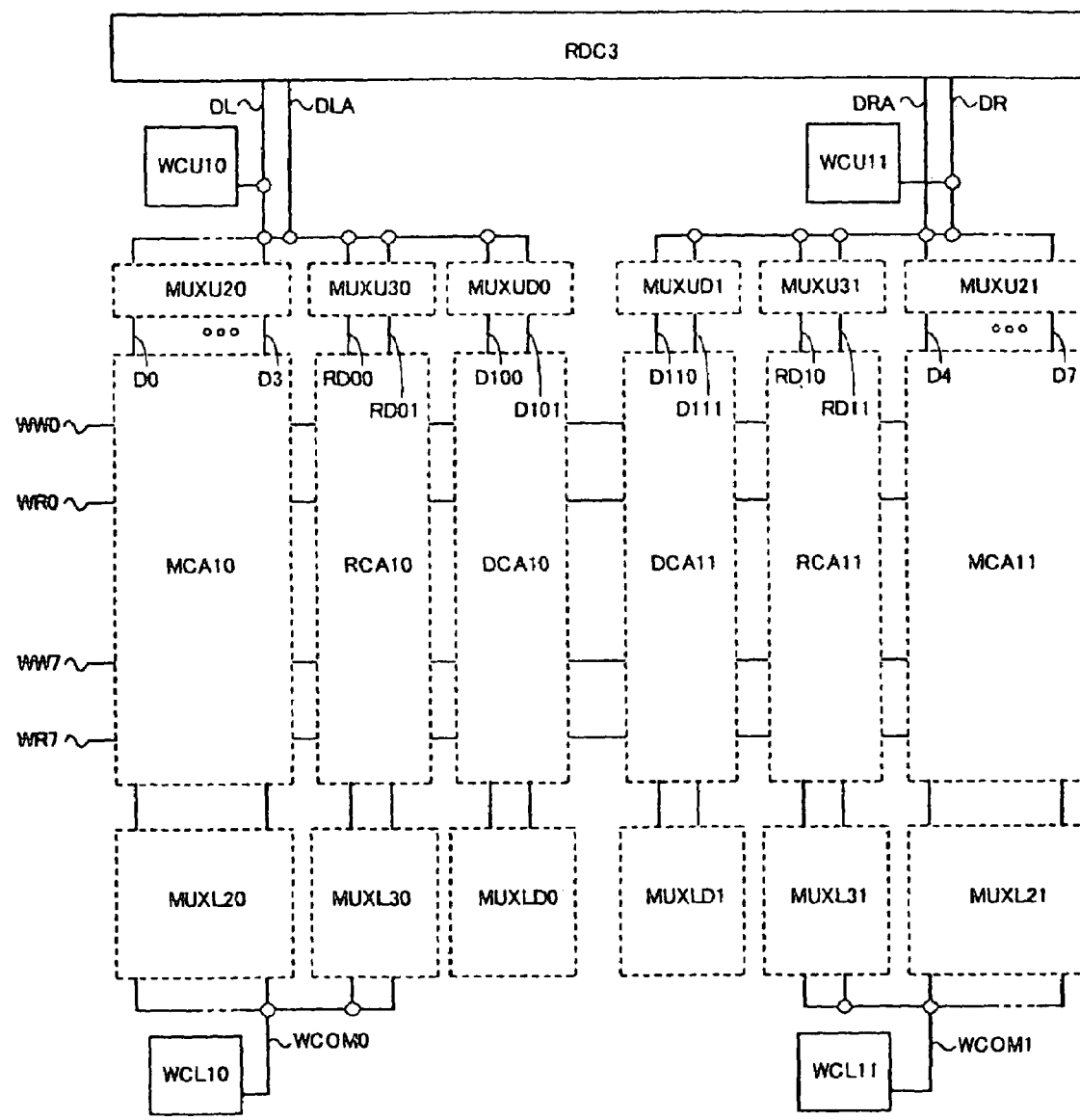
FIG. 27 shows a structural example of principal portions of a memory block using memory cells each composed of one MTJ device and one transistor according to Embodiment 6.

FIG. 27 is a block diagram showing principal portions of a memory block according to this embodiment. A redundancy cell array RCA10 is arranged between one of the memory cell arrays MCA10 and the dummy cell array DCA10. Multiplexers MUXU30 and MUXL30 are arranged at both ends of the redundancy cell array RCA10. A redundancy cell array RCA11 is arranged between the other memory cell array MCA11 and a dummy cell array DCA11. Multiplexers MUXU31 and MUXL31 are arranged at both ends of the redundancy cell array RCA11. In comparison with FIGS. 22 and 23 showing Embodiment 5, therefore, the redundancy cell arrays RDCA10 and RDCA11 and the multiplexers MUXU40, MUXL40, MUXU41 and MUXL41 are removed. Hereinafter, a redundancy circuit for the memory cell array MCA10 and the dummy cell array DCA10 will be explained for simplification.

Figure 28:
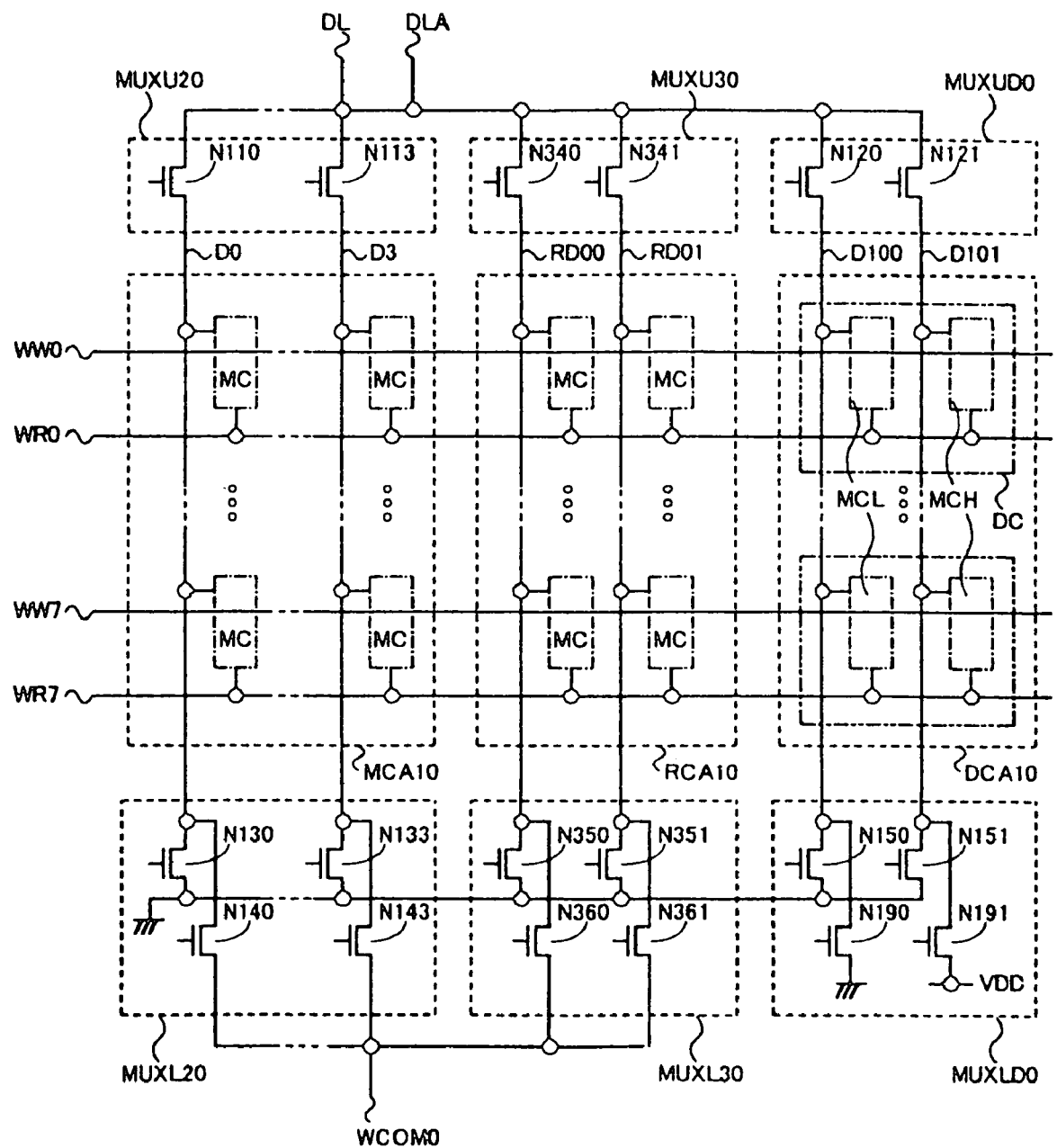
FIG. 28 shows a structural example of a redundancy cell array and a multiplexer according to Embodiment 6.

FIG. 28 shows a circuit structural example of the memory cell array MCA10, the dummy cell array DCA10, the redundancy cell array RCA10 and the multiplexers MUXU20, MUXL20, MUXU30, MUXL30, MUXUD0 and MUXLD0 shown in FIG. 27. Each circuit block has the same circuit construction as the one shown in FIG. 24, and the names of the column address signals inputted to the respective multiplexers are also the same as those shown in FIG. 39. Next, the concept of the defect redundancy operation in this construction will be explained.

Figure 29:
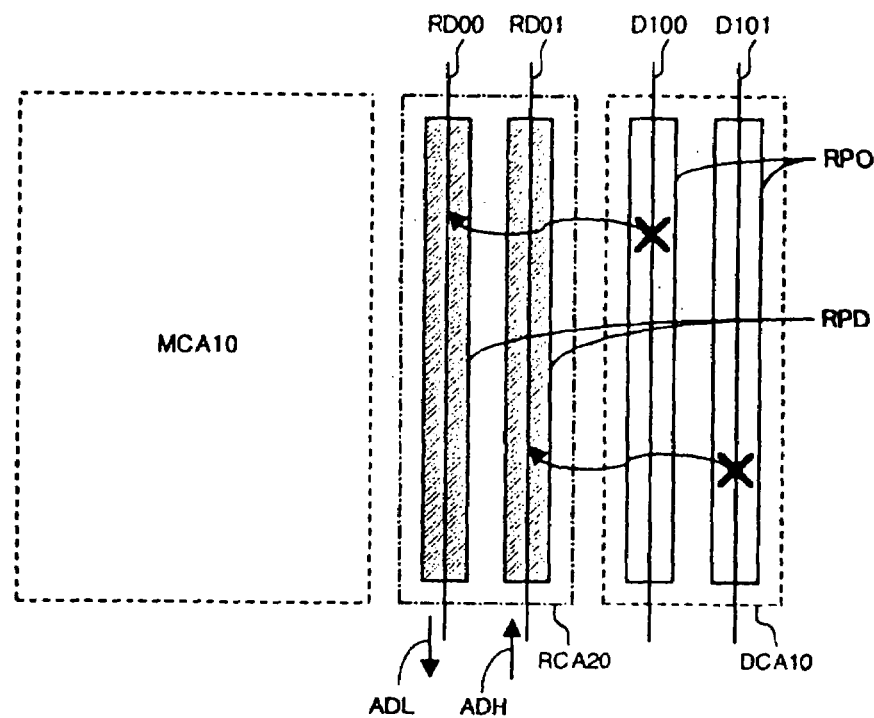
FIG. 29 is a conceptual view (No. 1) showing a substitution example of a column redundancy system according to Embodiment 6.

FIG. 29 is a conceptual view showing the case where the redundancy data lines RD00 and RD01 replace the dummy data lines D100 and D101 when defects occur in the memory cells represented by X on the dummy data lines D100 and D101 by way of example. In this case, the redundancy memory cell array RCA10 is initialized in the following way. First, the multiplexers MUXU30 and MUXL30 are controlled to select the redundancy data line RD00 as shown in FIG. 27. Next, the data corresponding to the memory information '1' is inputted from outside the chip. The write circuits WCU10 and WCL10 shown in FIG. 27 are then driven and a current is generated in the redundancy data line RD00 in the direction of arrow ADL to thereby write the memory information '1' into the memory cell MC. Further, the redundancy data line RD01 is selected. The data corresponding to the memory information '0' is inputted from outside the chip, and a current is generated in the redundancy data line RD01 in the direction of arrow ADH. In this way, the memory cells MC on the redundancy data lines RD00 and RD01 are used as a pair to form the dummy cell.

Figure 30:
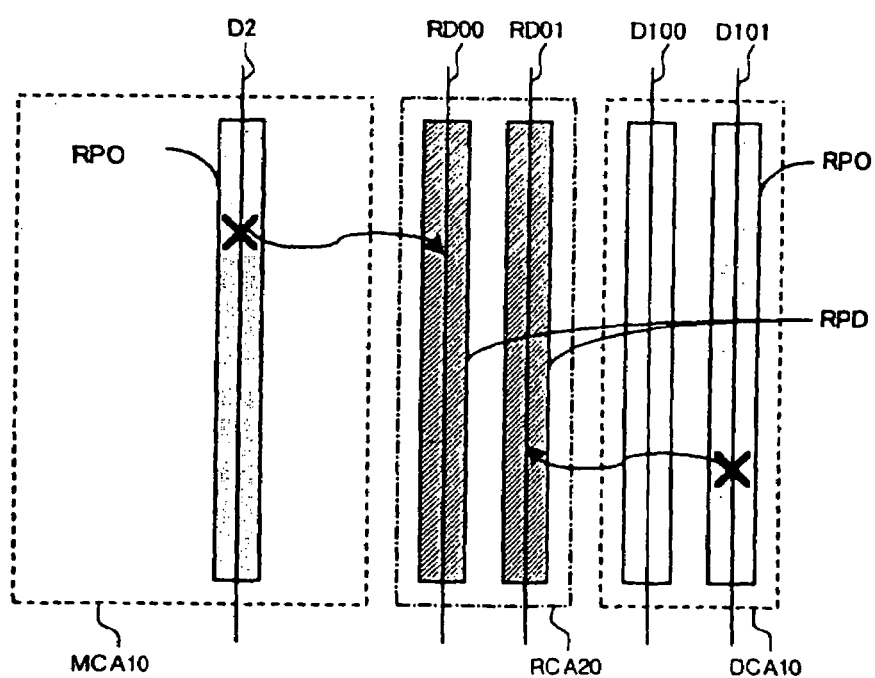
FIG. 30 is a conceptual view (No. 2) showing a substitution example of a column redundancy system according to Embodiment 6.

As another example, FIG. 30 is a conceptual view showing the case where the redundancy data lines RD00 and RD01 replace the data line D2 and the dummy data line D101 when defects occur in the memory cells represented by X on the data line D2 and on the dummy data line D101. In this case, the dummy cell array DCA10 is initialized and then the memory information '0' is written into the memory cells MC on the redundancy data line RD01 as explained with reference to FIG. 29. In consequence, the dummy cell is formed while the memory cell MCL on the dummy data line D100 and the memory cell MC on the redundancy data line RD01 are used as a pair. Next, a generation mechanism of the column address signal for controlling the column redundancy system according to this embodiment will be explained.

Figure 31:
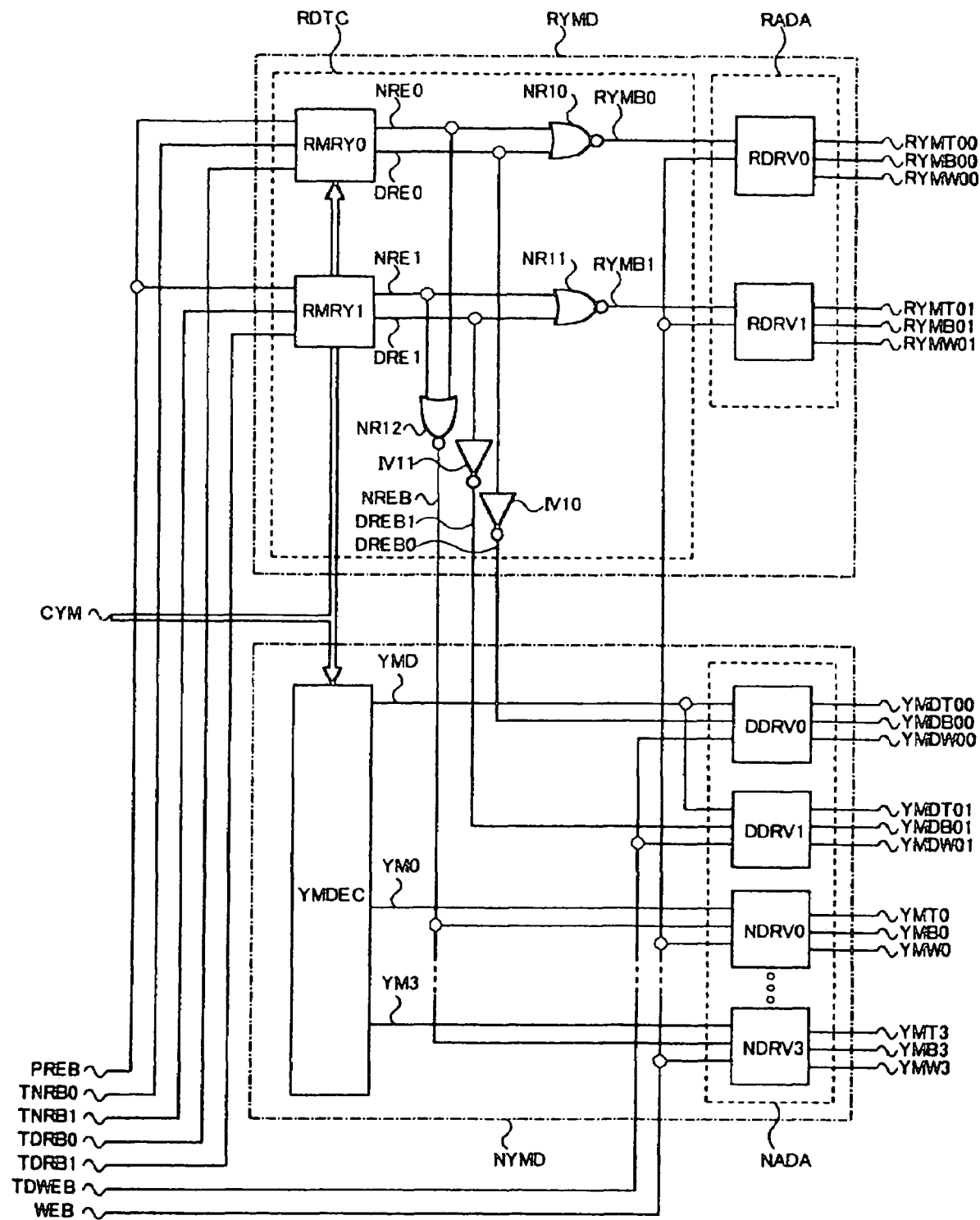
FIG. 31 is a block diagram showing a structural example of a column address decoder according to Embodiment 6.

FIG. 31 is a block diagram of principal portions of a column address decoder according to this embodiment. For simplification, however, the drawing shows a normal column address decoder NYMD corresponding to the portion that controls the memory cell array MCA10 and the dummy cell array DCA each shown in FIG. 27, and a redundancy column address decoder RYMD corresponding to the portion that replaces the memory cell array MCA10 and the dummy cell array DCA10 by the redundancy cell array RCA10. The features of the column address decoder having such a first construction reside firstly in that the redundancy information for the data line and the redundancy information for the dummy data line are stored respectively. Second, the redundancy column address signal is activated in accordance with the redundancy information of both data line and dummy data line. Third, the column address signal corresponding to the data line or the dummy data line as the line to be replaced is inactivated in accordance with the redundancy information. The column address decoder will be explained below with particular reference to these features.

The normal column address decoder NYMD includes a column address decoder YMDEC and a normal column address signal driver array NADA. The column address decoder YMDEC generates a plurality (here, 5) of column pre-decode enable signals in accordance a column pre-decode address CYM inputted, and outputs them to the normal column address signal driver array NADA. The normal column address signal driver array NADA includes a dummy column address signal driver DDRVm (m=0, 1) and a normal column address signal driver NDRVk (k=0, . . . , 3). The dummy column address signal driver DDRVm outputs column address signals YMDT0$m$, YMDB0$m$ and YMDW0$m$ (m=0, 1) that control the connection state of the dummy data lines, in accordance with the corresponding column address enable signal YMD and dummy data line write signal TDWEB. Here, the dummy data line write signal TDWEB is the signal generated by a later-appearing test mode control circuit. When driven to the ground potential VSS at the time of initialization of the dummy cell array DCA10, the dummy data line write signal TDWEB makes it possible to drive a desired column address signal YMDW0$m$ to the power source voltage VDD. The normal column address signal driver NDRVk outputs column address signals YMTk, YMBk and YMWk (k=0, . . . , 3) for controlling the connection state of the data lines, in accordance with the corresponding column address enable signal Ymk (k=0, . . . , 3) and write control signal WEB. When driven to the ground potential VSS during the write operation, the write control signal WEB makes it possible to drive a desired column address signal YMWk to the power source voltage VDD.

The redundancy column address decoder RYMD includes a redundancy column address detection circuit RDTC and a redundancy column address signal driver array RADA. The redundancy column address detection circuit RDTC further includes a plurality (two, corresponding to the number of redundancy data lines in this embodiment) of redundancy column address memory circuits RMRYm (m=0, 1), NOR circuits NR10, NR11 and NR12 and inverter circuit IV10 and IV11. The redundancy column address signal driver array RADA includes redundancy column address signal drivers RDRVm (m=0, 1).

The redundancy column address memory circuit RMRYm receives the pre-charge signal PREB, a normal redundancy test signal TNRBm (m=0, 1) corresponding to the former, a dummy redundancy test signal TNRBm (m=0, 1) and a column pre-decode address CYM, and generates a normal redundancy enable signal NREm (m=0, 1) and a dummy redundancy enable signal DREm (m=0, 1).

The NOR circuits NR10 and NR11 generate redundancy column address enable signals RYMB (m=0, 1) in accordance with corresponding normal redundancy enable signal NREm and dummy redundancy enable signal DREm, and output them to the corresponding redundancy column address signal drivers RDRVm, respectively. Here, the normal redundancy enable signal NREm or dummy redundancy enable signal that is at the power source voltage VDD is inputted to the corresponding NOR circuit NR1$m$ (m=0, 1) and the redundancy column address enable signal RYMBm is driven to the ground potential VSS. In consequence, the redundancy column address signal drivers RDRVm are activated and the corresponding redundancy data lines are selected.

The NOR circuit NR12 further generates a normal redundancy enable signal NREB in accordance with the normal redundancy enable signal NREm that is inputted, and outputs it to each normal column address signal driver NDRVk. When the redundancy data line hereby replaces the data line, the normal redundancy enable signal NREB is driven to the ground potential VSS as the normal redundancy enable signal NRE0 or NRE1 at the power source voltage VDD is inputted, thereby inactivating the normal column address signal driver NDRVk.

The inverter circuit IV1$m$ (m=0, 1) inverts the corresponding dummy redundancy enable signals DREm, generates the dummy redundancy enable signals DREBm (m=0, 1) and outputs them to the corresponding dummy column address signal drivers DDRVm, respectively. When the redundancy data line hereby replaces the dummy data line, the dummy redundancy enable signal DREBm is driven to the ground potential VSS as the dummy redundancy enable signal DREm at the power source voltage VDD is inputted, and inactivates the corresponding dummy column address signal driver DDRVm. Next, a circuit structural example of each circuit block shown in FIG. 31 will be explained.

Figure 32:
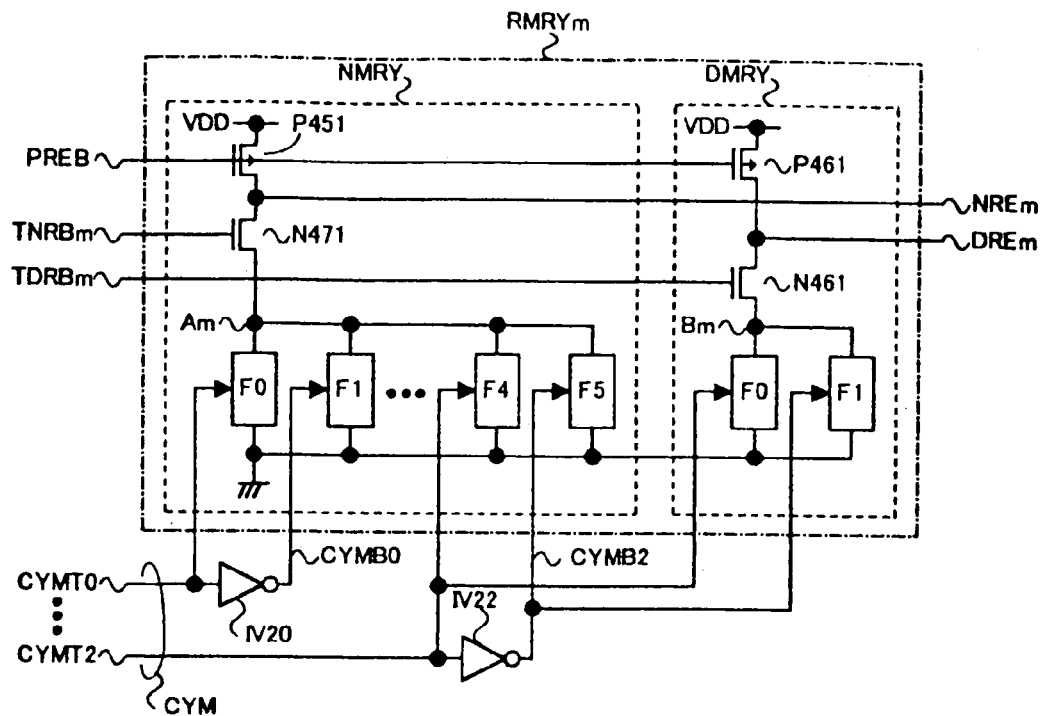
FIG. 32 is shows a structural example of a redundancy column address memory circuit according to Embodiment 6.

FIG. 32 shows a structural example of the redundancy column address memory circuit RMRYm. The redundancy column address memory circuit RMRYm includes a normal address memory circuit NMRY and a dummy address memory circuit DMRY. One of the normal address memory circuits NMRY includes a PMOS transistor P451, an NMOS transistor N471 and a plurality (here, 6) of redundancy information memory circuits F. The transistor P451 is the transistor for pre-charging the normal redundancy enable signal NREm to the power source voltage VDD. The pre-charge signal PREB is inputted to the gate of the transistor P451, and the transistor P451 and the transistor N471 are connected in series. The normal redundancy test signal TNRBm is inputted to the gate of the transistor N471 and a plurality of redundancy information memory circuits F are juxtaposed between a node Am as the source terminal of the transistor N471 and the ground potential VSS. Further, signals CYMTn (n=0, 1, 2) constituting the column pre-decode address CYM and signals obtained by inverting these signals by the inverter circuit IV2n (n=0, 1, 2) are inputted to the six redundancy information memory circuits F, respectively. Here, the pre-charge signal PREB is one of the array control bus ABS. The normal redundancy test signal TNRBm is the signal that is generated by a later-appearing test mode control circuit.

In the construction described above, after the pre-charge enable signal PREB at the ground potential VSS is driven to the power source voltage VDD, the column pre-decode address CYM is inputted. Here, when the normal redundancy enable signal NREm is held at the power source voltage VDD of the pre-charge level, the redundancy data line replaces the data line corresponding to the column pre-decode address CYM.

The other dummy address memory circuit DMRY includes a PMOS transistor P461, an NMOS transistor N461 and a plurality (here, 2) of redundancy information memory circuits F. The transistor P461 is the transistor for pre-charging the dummy redundancy enable signal DREm to the power source voltage VDD. The pre-charge signal PREB is inputted to the gate of the transistor P461, and the transistor P461 and the transistor N461 are connected in series. The dummy redundancy test signal TDRBm is inputted to the gate of the transistor N461 and two redundancy information memory circuits F are juxtaposed between a node Bm as the source terminal of the transistor N461 and the ground potential VSS. Further, complementary signals of the highest order bit (here, CYMT2 and CYMB2) constituting the column pre-decode address CYM, for example, are inputted to the two redundancy information memory circuits F, respectively. Here, the dummy redundancy test signal TDRBm is the signal that is generated by a later-appearing test mode control circuit.

In the construction described above, after the pre-charge enable signal PREB at the ground potential VSS is driven to the power source voltage VDD, the column pre-decode address CYM is inputted. Here, when the dummy redundancy enable signal DREm is held at the power source voltage VDD of the pre-charge level, the redundancy data line replaces the dummy data line corresponding to the column pre-decode address CYM.

Figure 33:
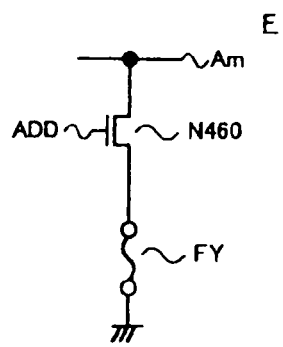
FIG. 33 shows a structural example of a redundancy information memory circuit according to Embodiment 6.

FIG. 33 shows the construction of the redundancy information memory circuit F in the normal address memory circuit NMRY as an example. The redundancy information memory circuit F is a known circuit formed by connecting in series the NMOS transistor N460 and a fuse FY. The address signal ADD (here, the signals CYMTn and CYMBn (n=0, 1, 2) constituting the column pre-decode address CYM) is inputted to the gate of the transistor N460, and the fuse FY is composed of a wiring layer such as a polycrystalline silicon.

Figure 34:
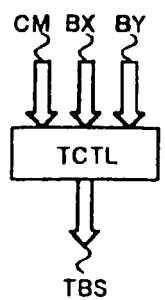
FIG. 34 is a block diagram showing a structural example of a test mode control circuit according to Embodiment 6.

FIG. 34 illustrates the test mode control circuit TCTL. The control signal CM, the row address BX and the column address BY, that are shown in FIG. 13, are inputted to this circuit. This circuit generates a test mode bus TBS in accordance with these signals. The afore-mentioned normal redundancy test signal TNRBm, dummy redundancy test signal TDRBm and dummy data line write signal TDWEB are among a plurality of control signals constituting the test mode bus TBS, and are driven to the ground potential VSS in accordance with defect detection and initialization operation.

Next, the control and operation of the redundancy column address memory circuit RMRYm will be explained. It will be assumed, for example, that the redundancy data line RD00 replaces the data line on the memory cell array MCA10 shown in FIG. 30, and the explanation will be given on the operation of the redundancy column address memory circuit RMRY0 with reference to FIG. 32. First, to detect the defect, the normal redundancy test signal TNRB0 that is at the power source voltage VDD is driven to the ground potential VSS and the transistor N471 in the normal address memory circuit NMRY is turned OFF. The corresponding normal redundancy enable signal NRE0 is held at the power source voltage VDD of the pre-charge level so as to temporarily replace the data line, to which the memory cell MC operating wrongly is connected, by the redundancy data line RD00. Next, after the correct operation of the memory cell MC on the redundancy data line RD00 is confirmed, the fuse FY for the corresponding column pre-decode address CYM is cut off by using a laser cutting apparatus to write the redundancy information into the normal address memory circuit NMRY. In contrast, in the ordinary read operation, the normal redundancy test signal TNRB0 is held at the power source voltage VDD to render the transistor N471 in the normal address memory circuit NMRY conductive. Here, the data line, to which the memory cell MC operating wrongly is connected, is selected. When the corresponding column pre-decode address CYM is inputted, the fuse FY described above cuts off the current path in the normal address memory circuit NMRY. Therefore, as the normal redundancy enable signal NRE0 is held at the power source voltage VDD of the pre-charge level, the redundancy data line RD00 replaces the selected data line.

The explanation given above also holds true of the replacement of the dummy data line. Namely, the defect of the memory cells MCL and MCH connected to the dummy data line is detected by using the dummy redundancy test signal TDRBm and then the redundancy information is written into the dummy address memory circuit DMRY shown in FIG. 32.

Figure 35:
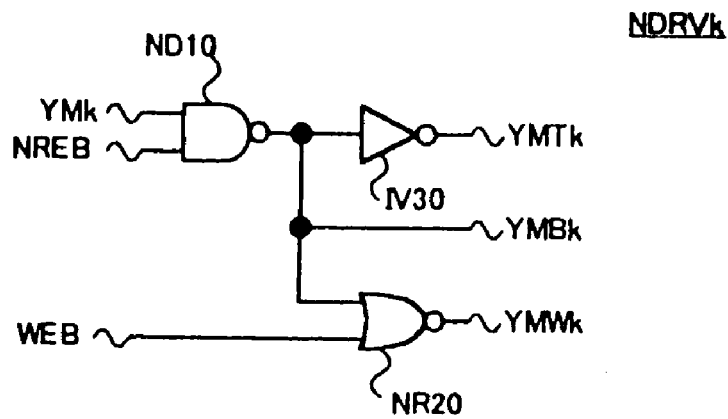
FIG. 35 shows a circuit structural example of a normal column address signal driver according to Embodiment 6.

Hereinafter, the circuit construction of each column address signal driver will be explained. FIG. 35 illustrates a structural example of the normal column address signal driver NDRVk. The normal column address signal driver NDRVk includes a NAND circuit ND10, a NOR circuit NR20 and an inverter circuit IV30. In ND10, a column address enable signal YMk is inputted to one of the terminals and a normal redundancy enable signal NREB is inputted to the other. The output terminal of ND10 is connected to the column address signal YMBk. In NR20, a column address signal YMBk is inputted to one of the terminals and a write control signal WEB is inputted to the other terminal. The output terminal of NR20 is connected to the column address signal YMWk. Further, the column address signal YMBk is inverted by IV30 to provide a column address signal YMTk.

Figure 36:
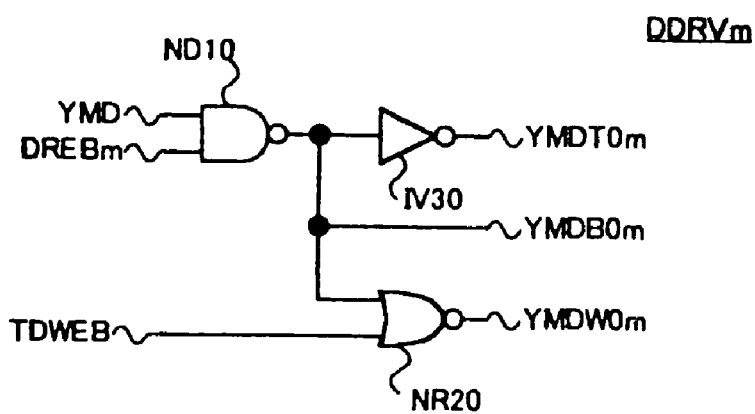
FIG. 36 shows a circuit structural example of a dummy column address signal driver according to Embodiment 6.

FIG. 36 illustrates a structural example of the dummy column address signal driver DDRVm. It includes a NAND circuit ND10, a NOR circuit NR20 and an inverter circuit IV30 in the same way as the normal column address signal driver NDRVk shown in FIG. 35. In ND10, a column address enable signal YMD is inputted to one of the terminals and a dummy redundancy enable signal DREBm is inputted to the other. The output terminal of ND10 is connected to the column address signal YMDB0$m$. In NR20, the column address signal YMDB0$m$ is inputted to one of the terminals and a dummy data write signal TDWEB is inputted to the other terminal. The output terminal of NR20 is connected to the column address signal YMDWOm. Further, the column address signal YMDWOm is inverted by IV30 to provide a column address signal YMDTOm.

Figure 37:
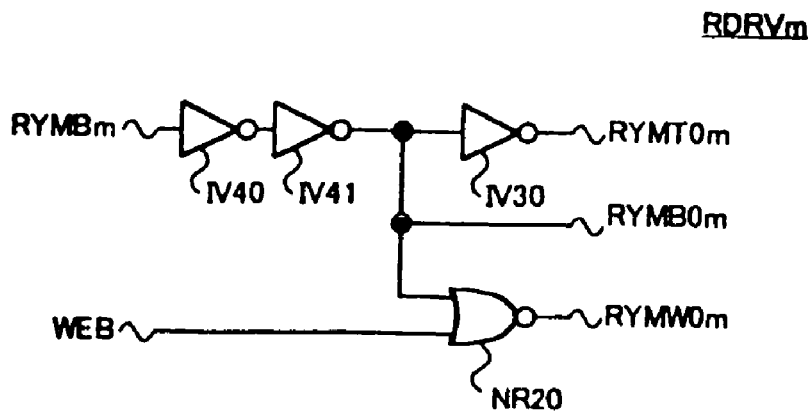
FIG. 37 shows a circuit structural example of a redundancy column address signal driver according to Embodiment 6.

FIG. 37 illustrates a structural example of the redundancy column address signal driver RDRVm. It includes a NOR circuit NR20 and inverter circuits IV30, IV40 and IV41. In comparison with FIGS. 35 and 36, FIG. 37 is different in that the NAND circuit ND10 is replaced by IV40 and IV41. The redundancy column address signal RYMB0$m$ is the signal obtained by the buffering operation, by IV40 and IV41 connected in series, of the redundancy column address enable signal RYMBm, and the redundancy column address signal RYMT0$m$ is obtained by further inverting the redundancy column address signal RYMB0m by IV30. In NR20, the redundancy column address signal RYMB0$m$ is inputted to one of the terminals and the write control signal WEB is inputted to the other. The output terminal is connected to the redundancy column address signal RYMW0$m$.

The operation of each column address signal driver described above will be explained. First, when the redundancy data line is used, the redundancy column address enable signal RYMBm is held at the ground potential VSS to activate the redundancy column address signal driver RDRVm. On the other hand, the normal redundancy enable signal NREB or the dummy redundancy enable signal DREBm is held at the ground potential VSS in accordance with the destination of replacement of the redundancy data line to inactivate the NAND circuit D10 shown in FIG. 35 or 36. In consequence, the normal column address signal driver NDRVk or the dummy column address signal driver DDRVm is inactivated.

Next, when the redundancy data line is not used, the redundancy column address enable signal RYMBm held at the ground potential VSS is driven to the power source voltage VDD to inactivate the redundancy column address signal driver RDRVm. On the other hand, the normal redundancy enable signal NREB and the dummy enable signal REBm, that are at the ground potential VSS, are driven to the power source voltage VDD when the data line and the dummy data line are selected, thereby activating the NAND circuit ND10 shown in FIGS. 35 and 36, and activating also the normal column address signal driver NDRVk and the dummy column address signal driver DDRVm.

Here, the NOR circuit NR20 shown in FIGS. 35 and 37 are activated as the write control signal WEB held at the power source voltage VDD is driven to the ground potential VSS, and drives the column address signal YMWk or the redundancy column address signal RYMW0$m$ in accordance with the selected data line. In the initialization operation, the NOR circuit NR20 shown in FIG. 36 is activated as the dummy data line write signal TDWEB held at the power source voltage VDD is driven to the ground potential VSS, and drives the column address signal YMDWOm in accordance with the column address enable signal YMD.

FIG. 37 illustrates the example where IV40 and IV41 connected in series buffer the redundancy column address enable signal RYMm. When the driving capacity of the NOR circuits NR10 and NR11 in the redundancy column address detection circuit RDTC shown in FIG. 31 is sufficiently great, however, IV40 and IV41 may be removed to use as such the redundancy column address enable signal as the redundancy column address signal RYMB0$m$. In this case, the layout area of the redundancy column address signal driver RDRVm can be reduced.

The effects of the column redundancy system by means of the memory block shown in FIG. 27 and the column address decoder shown in FIG. 31 will be summarized. First, the memory cell MC in the memory cell array MCA10 and the memory cells MCL and MCH in the dummy cell DC on the dummy cell array DCA10 have the same construction. Therefore, each of the memory cell array MCA10 and the dummy cell array DCA10 can share the redundancy cell array RCA10 constituted by the memory cells MC as the replacement part of the defective memory cell. In the redundancy column address memory circuit RMRYm shown in FIG. 32, the normal address memory circuit NMRY and the dummy address memory circuit DMRY store the redundancy information for the data line and for the dummy data line, respectively. In the redundancy column address detection circuit RDTC shown in FIG. 31, further, the normal redundancy enable signal NREm and the dummy redundancy enable signal DREm as the output signals of the normal address memory circuit NMRY and the dummy address memory circuit DMRY are inputted to the corresponding NOR circuits NR10 and NR11 to generate the redundancy column enable signals RYMBm. In this way, the same redundancy data line can replace both of the data line and the dummy data line. As described above, this embodiment can accomplish the column redundancy system in which the occupation ratio of the redundancy cell array is reduced much more than in the memory blocks of Embodiment 5 shown in FIGS. 22 and 23, and can accomplish a large capacity MRAM having a higher integration density and higher reliability.

Second, as shown in FIG. 32, the data line or the dummy data line is temporarily replaced by the redundancy data line by using the normal redundancy test signal TNRBm and the dummy test signal TDRBm and by so doing, this effect can be confirmed in advance. In other words, the defect in the memory cell MC and the dummy cell DC can be detected. Here, the normal redundancy test signal TNRBm and the dummy redundancy test signal TDRBm can be generated by inputting from outside the command and the address signal to the test mode control circuit shown in FIG. 34, and control is therefore easy. If the defect detection and the redundancy information memory operation are conducted at the time of testing the chip, these operations can be conducted economically and within a short time.

The explanation given so far has dealt with the introduction of the redundancy cell arrays RCA10, RCA11 and RDCA11 having the 8×2 bit construction into the memory cell arrays MCA10 and MCA11 having the 8×4 bit construction and into the dummy cell arrays DCA10 and DCA11 having the 8×1 bit construction. However, the array construction is not restrictive. For example, it is possible to employ the memory cell array construction in which memory cells of hundreds of bits are arranged for one set of word line pair and for each data line in the same way as in Embodiment 5. In this way, the occupation ratio of the memory cells to the entire chip can be improved.

When the column redundancy system according to this embodiment is applied, several percents of redundancy data lines with respect to the number of the data lines are formed in the same way as in Embodiment 5, and the yield can be improved while the occupation ratio of the memory cell array to the entire chip is maintained. When the number of occurrence of defects is small, one redundancy data line can replace the data line or the dummy data line. Therefore, the defects can be relieved by a smaller number of redundancy cell arrays than in Embodiment 5.

The column redundancy system explained so far can be applied to the memory block shown in FIG. 19. For example, the redundancy cell array RCA10 is interposed between the memory cell array MCA10 and the dummy cell array DCA10, and the corresponding switches SRW in the multiplexers are formed in such a fashion that the redundancy data line RD00 is connected to the common data line DLE and the redundancy data line RD01 is connected to the common data line DL0. The redundancy cell array is arranged symmetrically between the memory cell array MCA10 and the dummy cell array DCA10. The corresponding switches SRW in the multiplexer are formed in such a fashion that one of the redundancy data lines is connected to the common data line DRE and the other, to the common data line DR0. This construction can accomplish the column redundancy system for replacing the defects on the memory cell array MCA10 and on the dummy cell array DCA10 by the redundancy cell array RCA10 or the other redundancy cell array, and a large capacity MRAM having a high yield and a high integration density can be achieved.

Various embodiments of the invention dealing with MRAM having the memory cells each including one MTH device and one transistor have thus been described. However, the memory cell construction is not limited. For example, the present invention can be applied to the memory cells using a diode as a device having a rectification operation as described in U.S. Pat. No. 5,793,697. In this case, one word line can be saved and the number of fabrication steps of the memory cells can be reduced. Since the number of terminals of the memory cells is reduced from 3 to 2, the memory cell area can be decreased as much, and a large capacity MRAM having a higher integration density can be accomplished.

In the read operation, however, the diode controls the select and non-select operations and imposes a limitation on the impressed voltage. In addition, because the influences of non-linear characteristics of the diode exist, the method of generating the reference signal becomes more important than in the case of the memory cells each including one MTJ device and one transistor and in this point, the system of the present invention is believed more effective.

Figure 38:
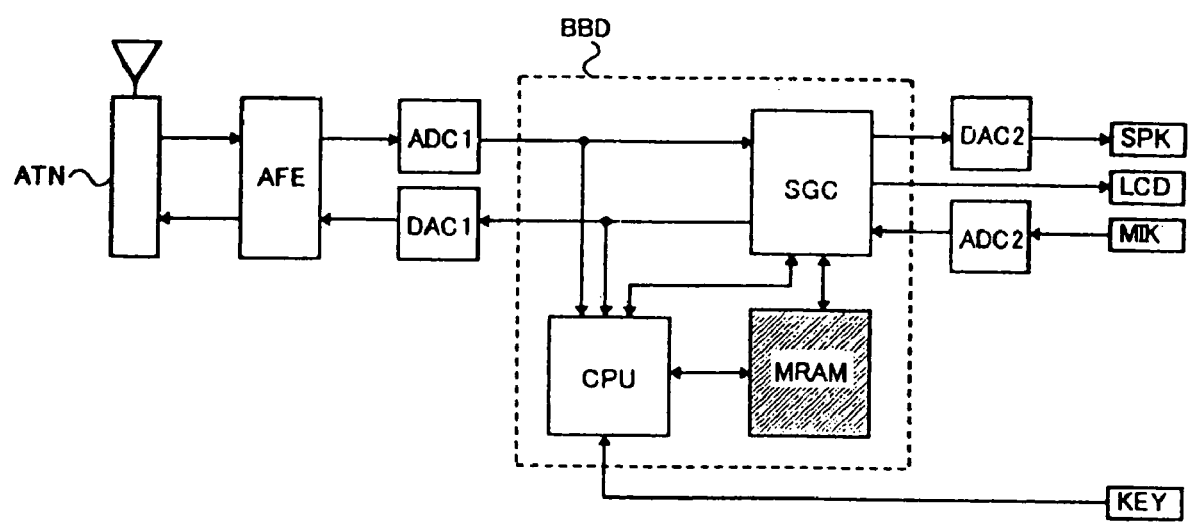
FIG. 38 shows a principal block of a cellular telephone unit having an MRAM according to the present invention mounted thereto.

Finally, the application example of MRAM according to the present invention will be described. FIG. 38 is a block diagram typically showing principal portions of a cordless telephone system with built-in MRAM according to the present invention. The telephone system includes an antenna ATN, an analog front-end block AFE, analog-digital modulation circuits DAC1 and DAC2, a base band block BBD, a speaker SPK, a liquid crystal display LCD, a microphone MIK and an input key KEY. Though not shown in the drawing, the analog front-end block AFE is a known circuit block for transmitting and receiving radio waves and includes an antenna switch, a band-pass filter, various amplifiers, a power amplifier, a phase-locked loop (PLL), a voltage control oscillator (VCO), a quadrature demodulator, a quadrature modulator, and so forth. The base band block BBD includes a signal processing circuit SGC, a central processing unit CPU and MRAM according to the present invention.

Next, the operation of the cellular telephone unit shown in FIG. 38 will be explained. When an image containing sound and character information is received, the radio wave inputted from the antenna is inputted to the analog-digital modulation circuit ADC1 through the analog front-end block AFE, and is subjected to waveform equalization and analog-digital conversion. The output signal of ADC1 is inputted to the signal processing circuit SGC in the base band block BBD and is subjected to the speech and image processing. The speech signal is transferred from the digital-analog conversion circuit DAC2 to the speaker and the image signal is transferred to the liquid crystal display. When the speech signal is transmitted, the signal from the microphone is inputted to the signal processing circuit SGC through the analog-digital conversion circuit ADC2 and the speech processing is conducted. The SGC output is transferred from the digital-analog conversion circuit DAC1 to the antenna through the analog front-end block AFD. When the character information is transmitted, the signal inputted from the input key is transferred from the base band block BBD and the digital-analog conversion circuit DAC1 to the antenna through the analog front-end block AFD.

In the base band block BBD, MRAM according to the present invention, the central processing unit CPU and the signal processing circuit SGC are bidirectionally connected, respectively. The central processing unit CPU executes the control inside the base band block BBD and the control of peripheral blocks (not shown in the drawing) in accordance with the signal inputted from the input key KEY. For example, the central processing unit CPU writes the information such as a dial number and an abbreviated number to MRAM according to the present invention in accordance with the signal inputted from the input KEY, and reads them out, on the contrary. As another example, the central processing unit CPU controls the signal processing circuit SGC in accordance with the ADC1 output signal and the SGC output signal that are inputted, reads the program necessary for signal processing from MRAM according to the present invention, or writes it to MRAM, on the contrary. MRAM according to the present invention is used also as a buffer that temporarily stores the image signal inputted from SGC and outputs it to the liquid crystal display.

As described above, when the MRAM according to the present invention is applied to a programmable ROM that has so far used EPROM and a flash memory, a main memory that has used SRAM, a cache memory and an image memory, it becomes possible to reduce the number of components of the cellular telephone system and to accomplish the reduction of the size and weight of the cellular telephone unit. The MRAM according to the present invention uses the dummy cells for holding the complementary memory information and can conduct the stable read operation. Therefore, the cellular telephone system having excellent resistance to environment can be accomplished. Further, the MRAM according to the present invention is the high integration density and high reliability memory having the redundancy circuit, and its capacity can be easily increased. Therefore, a cellular telephone unit having a high information processing capacity can be accomplished.

Another application example of the MRAM according to the present invention is a system LSI in which a plurality of element circuits in the circuit block shown in FIG. 38 and the MRAM according to the present invention are formed on one chip. When a system LSI having a base band block BBD formed on one chip is mounted to the cellular telephone unit, the size and weight of this portion can be reduced. Since the system LSI can improve the data processing speed, a cellular telephone unit having a high processing capacity can be accomplished.

Still another application example is a memory card to which the MRAM according to the present invention is mounted. The MRAM is a non-volatile memory and has no limitation to the number of times of the read/write operations as already described. The cited reference 1 reports that the write time of the MRAM is 10 ns and this value is faster than the write time of the flash memory. Therefore, the MRAM according to the present invention can accomplish a large capacity memory card having a high operation speed and a high integration density and excellent in reliability and environmental resistance.

What is claimed is:

1. A semiconductor device comprising:
   a data line;
   a plurality of memory cells coupled to the data line and storing a first information or a second information according to write data;
   a dummy data line;
   a plurality of first dummy cells and second dummy cells coupled to the dummy data line, the plurality of first dummy cells storing the first information and the plurality of second dummy cells storing the second information;
   a first load circuit coupled between the data line and a first voltage;
   a second load circuit coupled between the dummy data line and the first voltage; and
   a third load circuit coupled between the dummy data line and the first voltage,
   wherein a signal read out from a selected one of the plurality of memory cells is inputted to the first load circuit, and
   wherein a signal read out from a selected one of the plurality of first dummy cells and a selected one of the plurality of second dummy cells is inputted to the second load circuit and the third load circuit.

2. A semiconductor device according to claim 1, wherein the first to third load circuits have a same input resistance.

3. A semiconductor device according to claim 1, wherein each of the first to third load circuits have a same size MOS transistor.

4. A semiconductor device according to claim 1, wherein the second and third load circuits generate half of the current flowing through the selected one of the plurality of first dummy cells and the selected one of the plurality of second dummy cells.

5. A semiconductor device according to claim 4, further comprising:
   a sense amplifier amplifying the signal read out from the selected one of the plurality of memory cells by referring to the half of the current generated by the second and third load circuit.

6. A semiconductor device according to claim 5, further comprising:
   a current mirror circuit including the second load circuit and the third load circuit and outputting the half of the current to the sense amplifier.

7. A semiconductor device according to claim 1, further comprising:
   a plurality of word lines each coupled to a corresponding one of the plurality of memory cells, one of the plurality of first dummy cells, and one of the plurality of second dummy cells.

8. A semiconductor device according to claim 1, wherein the plurality of memory cells, the plurality of first dummy cells, and the plurality of second dummy cells are magnetic random access memory cells.

* * * * *